United States Patent
Katayama et al.

(10) Patent No.: US 9,024,353 B2
(45) Date of Patent: May 5, 2015

(54) ENCAPSULATING SHEET-COVERED SEMICONDUCTOR ELEMENT AND SEMICONDUCTOR DEVICE

(71) Applicant: Nitto Denko Corporation, Ibaraki-shi, Osaka (JP)

(72) Inventors: Hiroyuki Katayama, Osaka (JP); Takashi Kondo, Osaka (JP); Yuki Ebe, Osaka (JP); Munehisa Mitani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/042,856

(22) Filed: Oct. 1, 2013

(65) Prior Publication Data

US 2014/0091348 A1 Apr. 3, 2014

(30) Foreign Application Priority Data

Oct. 3, 2012 (JP) ................. 2012-221656

(51) Int. Cl.
| | |
|---|---|
| *H01L 33/00* | (2010.01) |
| *H01L 33/50* | (2010.01) |
| *H01L 33/54* | (2010.01) |
| *H01L 21/56* | (2006.01) |
| *H01L 23/00* | (2006.01) |
| *H01L 21/683* | (2006.01) |

(52) U.S. Cl.
CPC ......... *H01L 33/502* (2013.01); *H01L 33/0095* (2013.01); *H01L 33/54* (2013.01); *H01L 2933/005* (2013.01); *H01L 21/56* (2013.01); *H01L 33/005* (2013.01); *H01L 24/06* (2013.01); *H01L 24/14* (2013.01); *H01L 24/16* (2013.01); *H01L 21/6835* (2013.01); *H01L 24/81* (2013.01); *H01L 2221/68331* (2013.01); *H01L 2221/68381* (2013.01); *H01L 2221/68386* (2013.01); *H01L 2224/06102* (2013.01); *H01L 2224/1403* (2013.01); *H01L 2224/16227* (2013.01); *H01L 2924/10157* (2013.01); *H01L 2924/12041* (2013.01); *H01L 21/561* (2013.01); *H01L 21/568* (2013.01)

(58) Field of Classification Search
USPC .......... 257/88, 98, 100; 438/22, 26, 126, 127
See application file for complete search history.

(56) References Cited

U.S. PATENT DOCUMENTS

| | | | |
|---|---|---|---|
| 7,304,425 B2 * | 12/2007 | Ouderkirk et al. ............ 313/501 |
| 8,338,842 B2 * | 12/2012 | Lerman et al. .................. 257/88 |
| 2002/0011655 A1 | 1/2002 | Nishiyama et al. |
| 2003/0092252 A1 | 5/2003 | Nishiyama et al. |
| 2006/0105482 A1 * | 5/2006 | Alferink et al. ................. 438/22 |
| 2006/0115912 A1 * | 6/2006 | Masumoto ...................... 438/22 |
| 2011/0180830 A1 * | 7/2011 | Hwang et al. ................... 257/98 |
| 2013/0056788 A1 * | 3/2013 | Haraguchi et al. .............. 257/99 |

FOREIGN PATENT DOCUMENTS

JP 2001-308116 A 11/2001

* cited by examiner

*Primary Examiner* — Phuc Dang
(74) *Attorney, Agent, or Firm* — Sughrue Mion, PLLC

(57) ABSTRACT

An encapsulating sheet-covered semiconductor element includes a semiconductor element having one surface in contact with a board and the other surface disposed at the other side of the one surface and an encapsulating sheet covering at least the other surface of the semiconductor element. The encapsulating sheet includes an exposed surface that is, when projected from one side toward the other side, not included in the one surface of the semiconductor element and exposed from the one surface and the exposed surface has the other side portion that is positioned toward the other side with respect to the one surface of the semiconductor element.

10 Claims, 19 Drawing Sheets

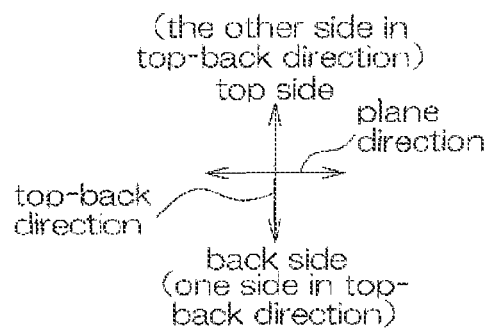
FIG.5(e)
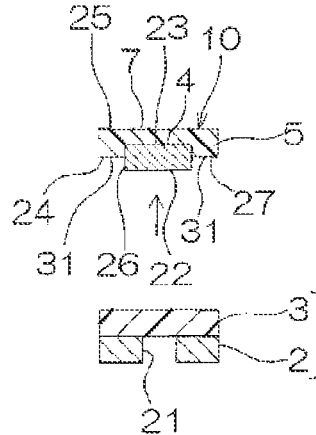
FIG.5(a)
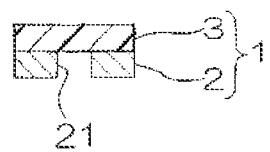
FIG.5(b)
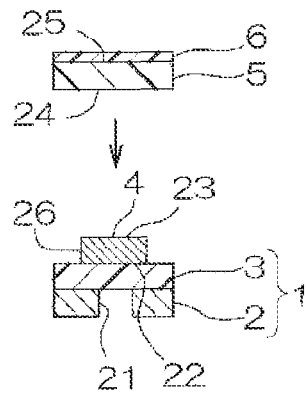
FIG.5(e')
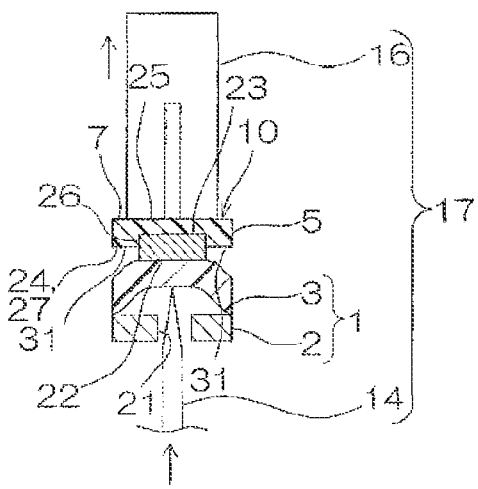
FIG.5(c)
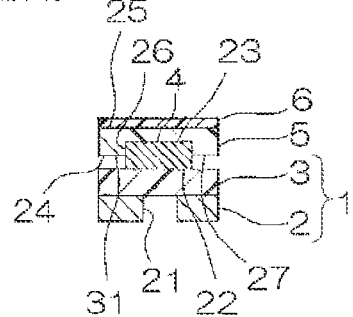
FIG.5(d)
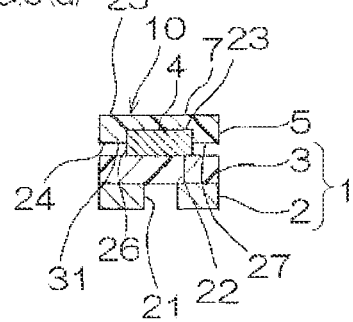
FIG.(5f)
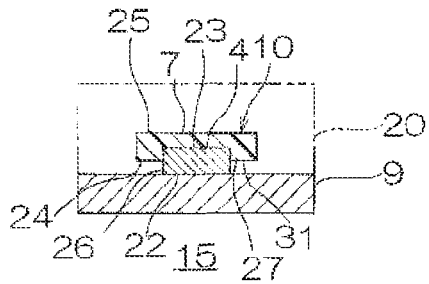

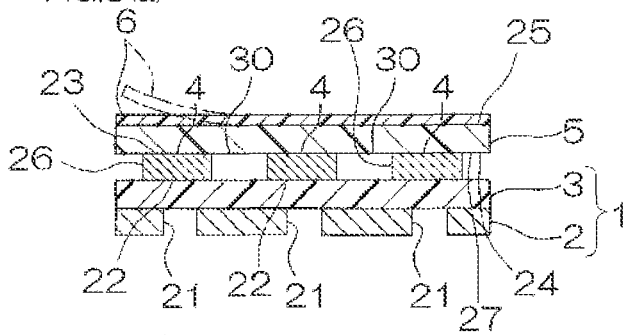
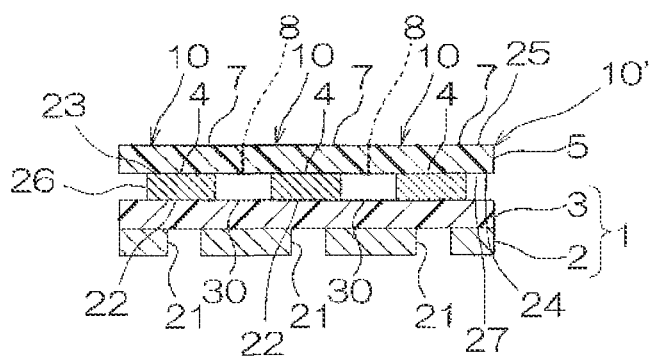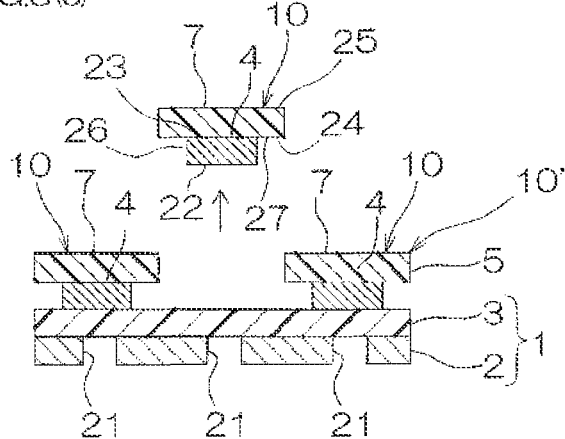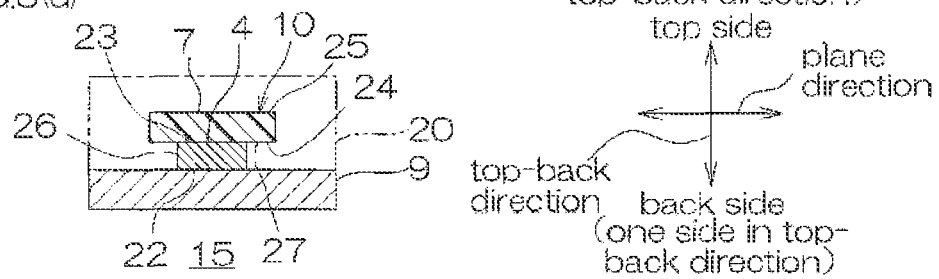

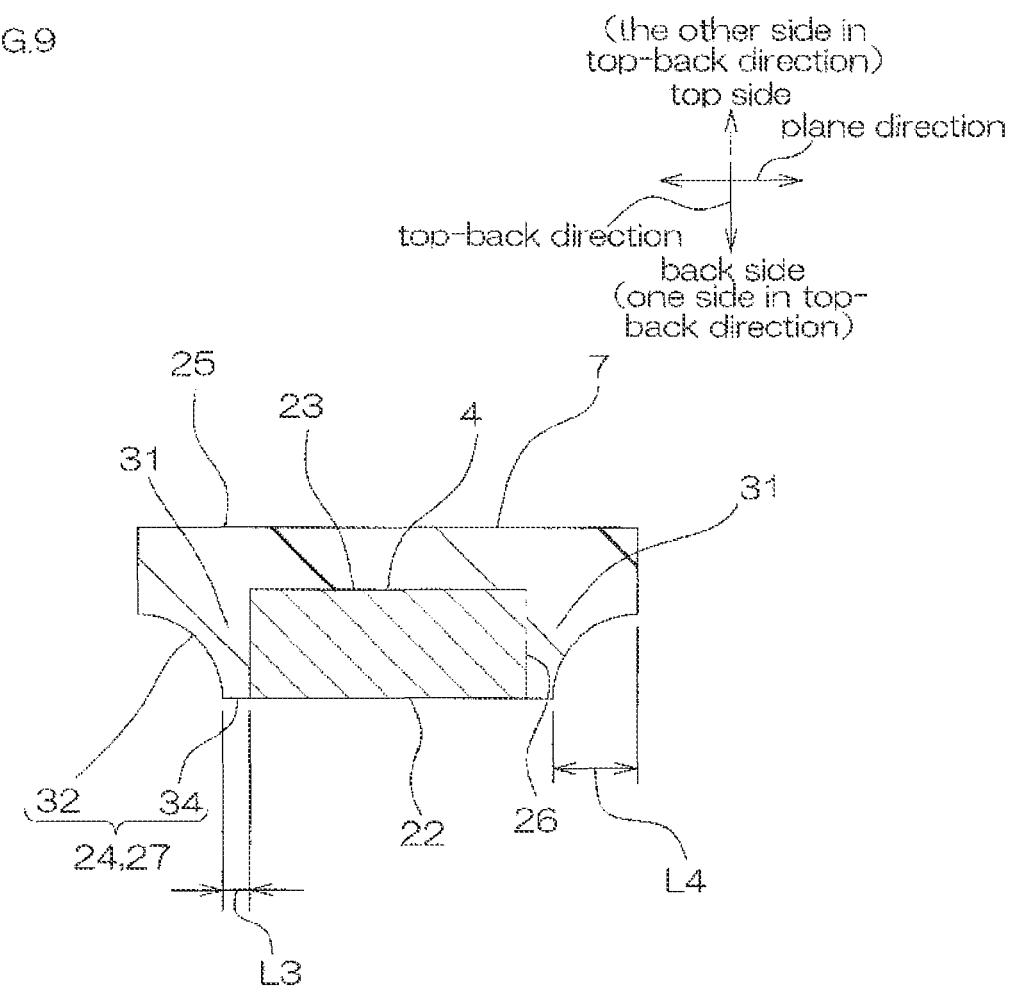

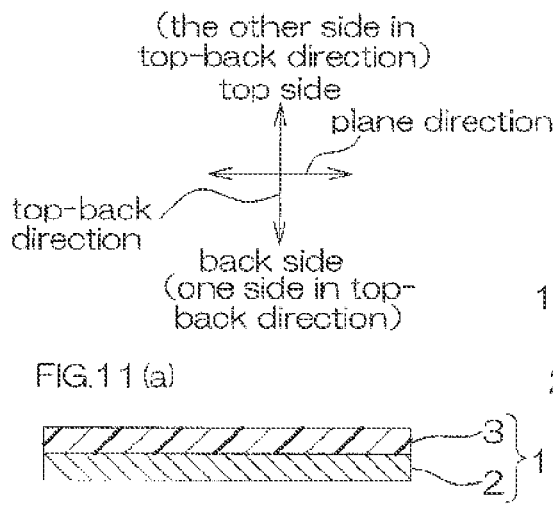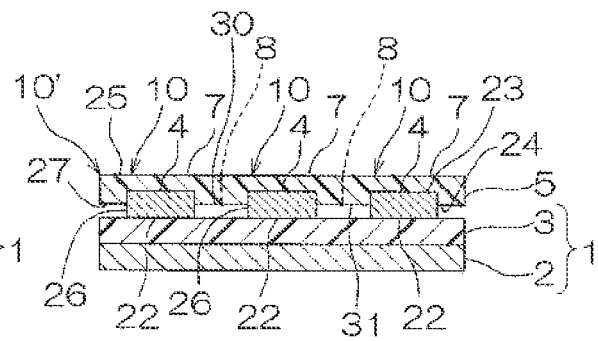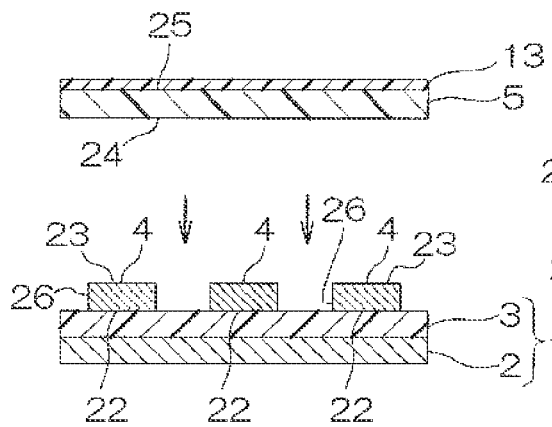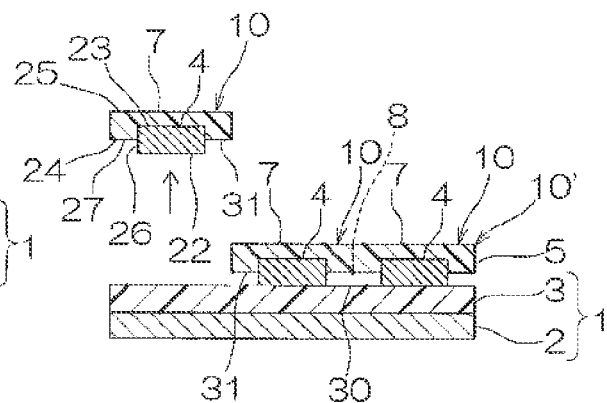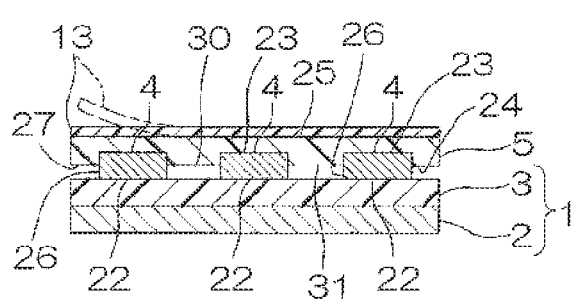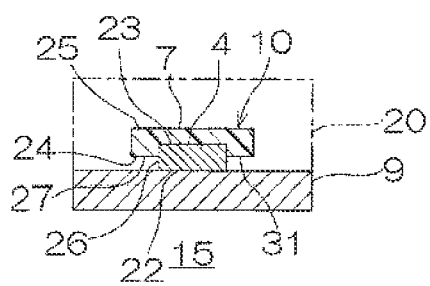

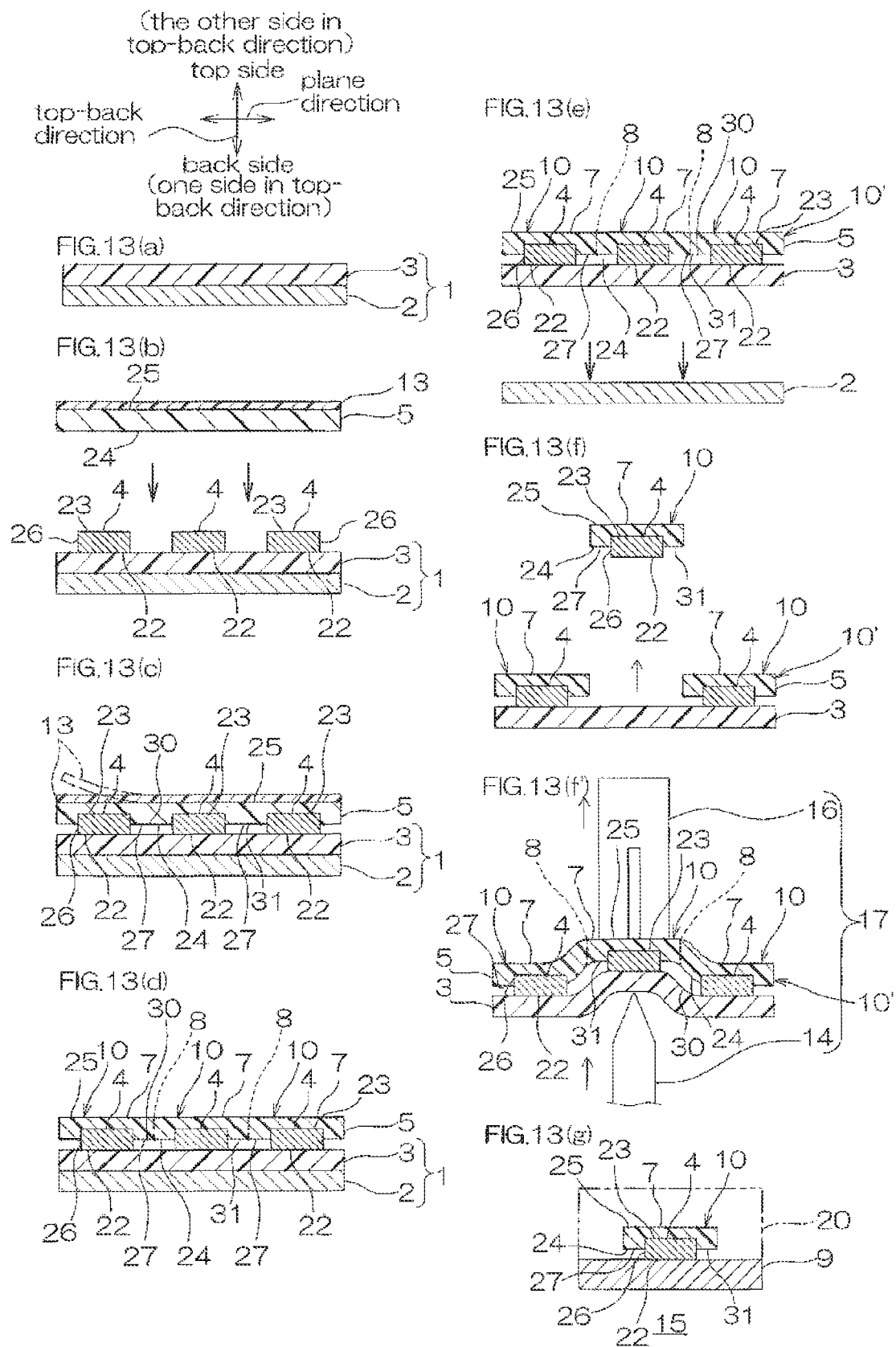

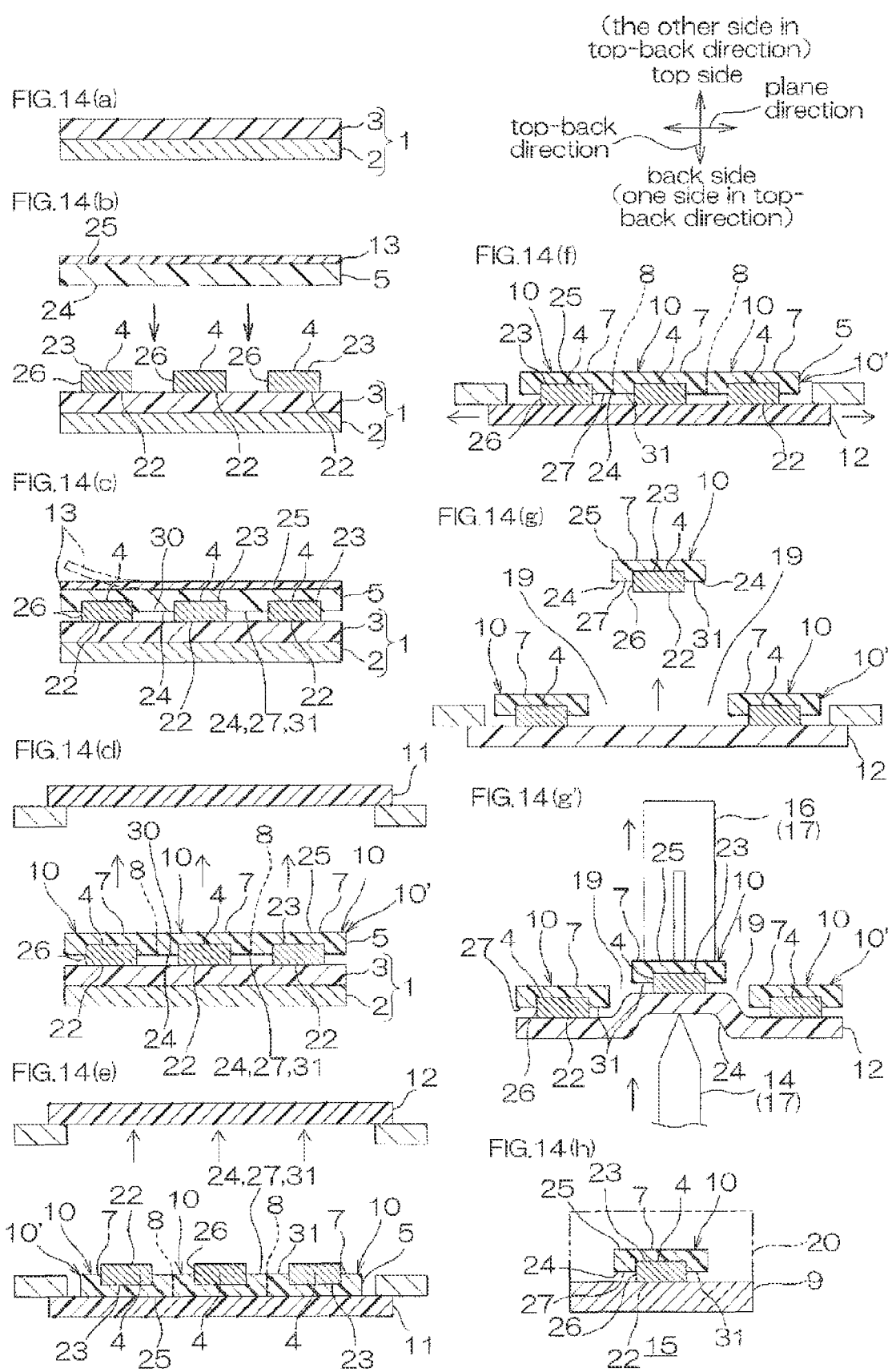

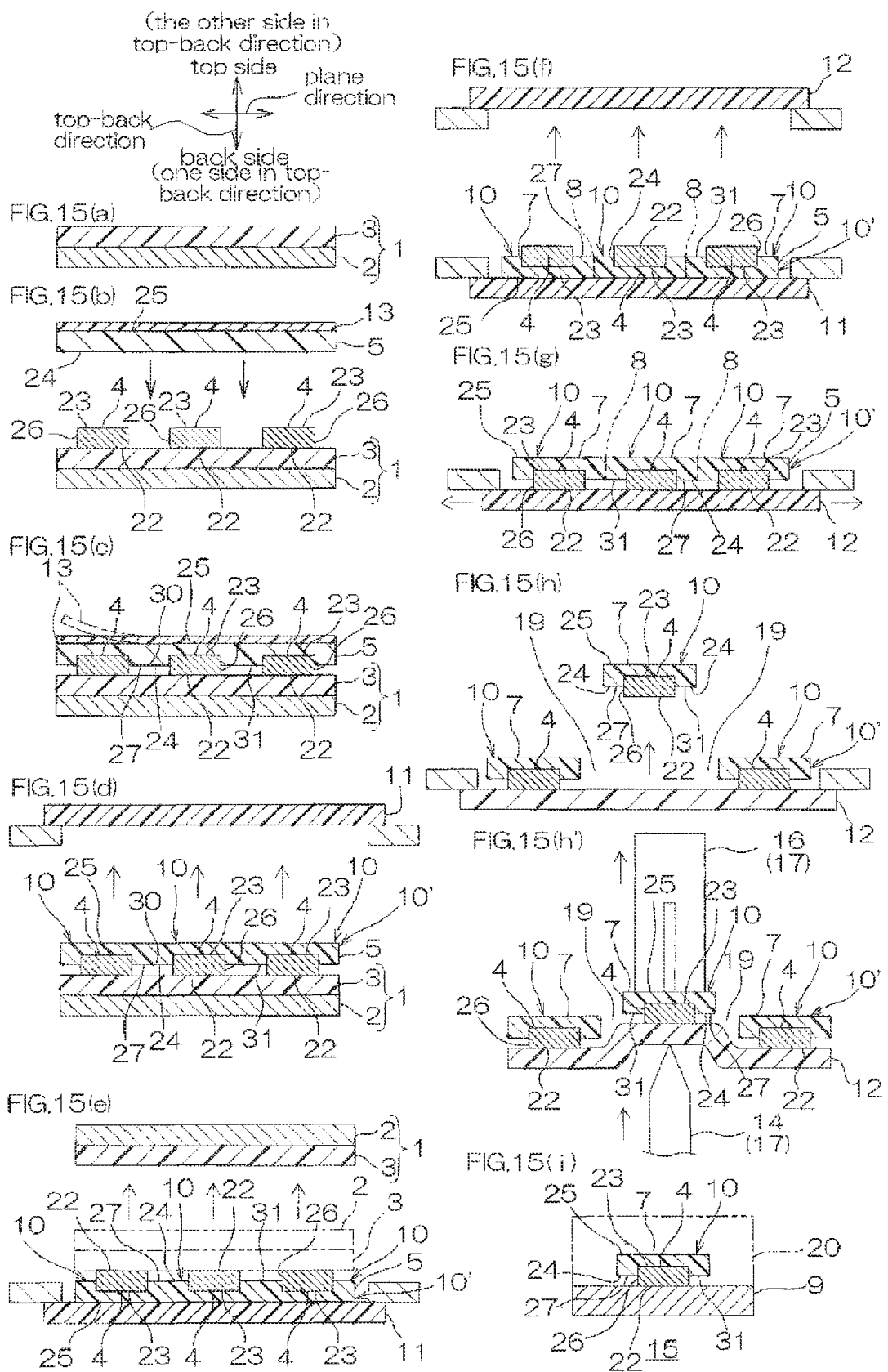

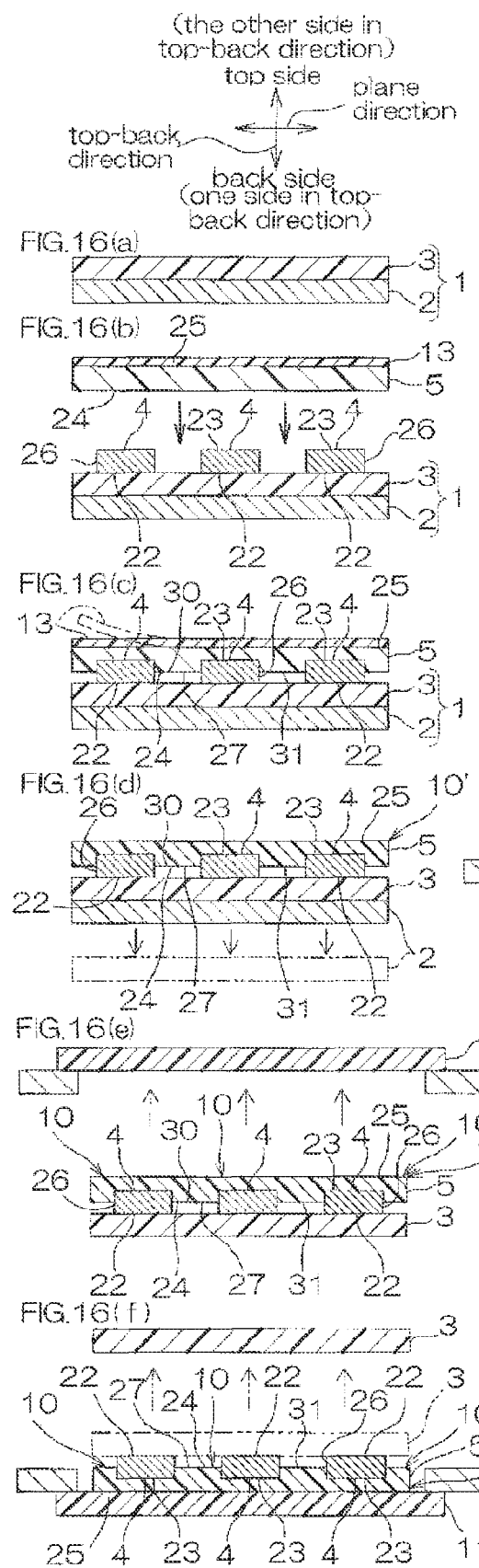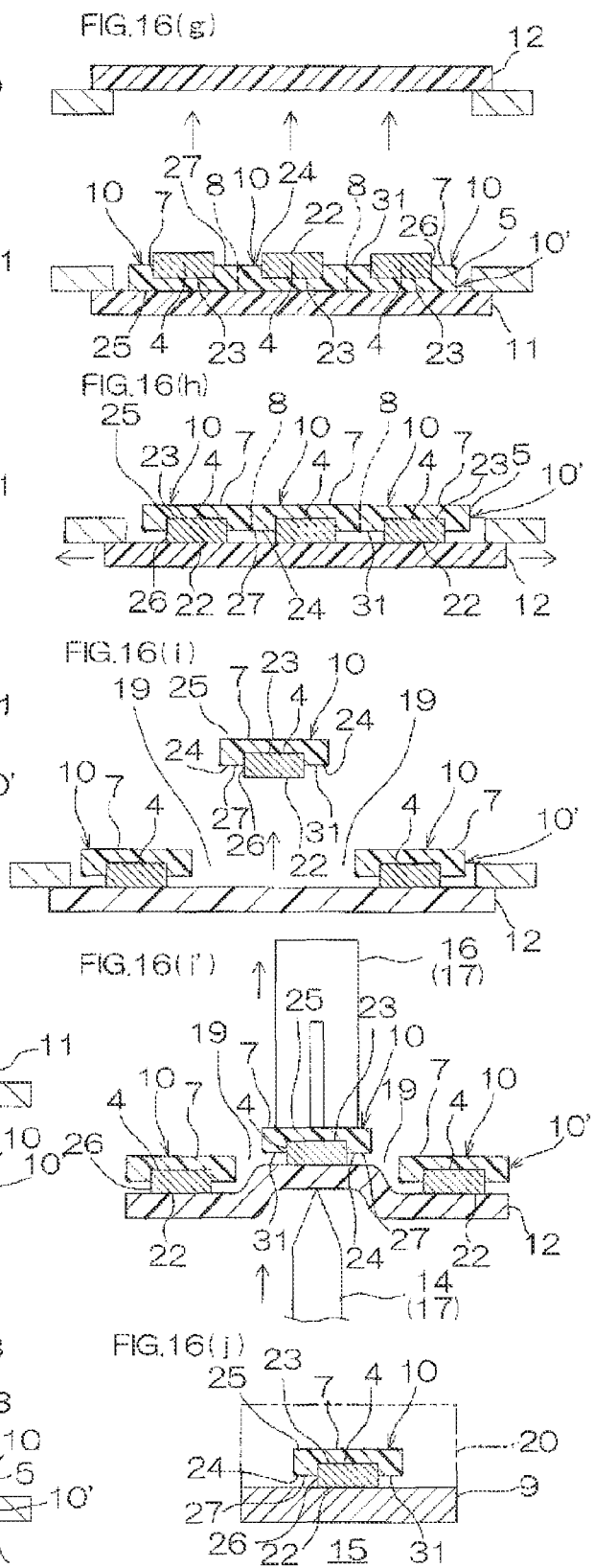

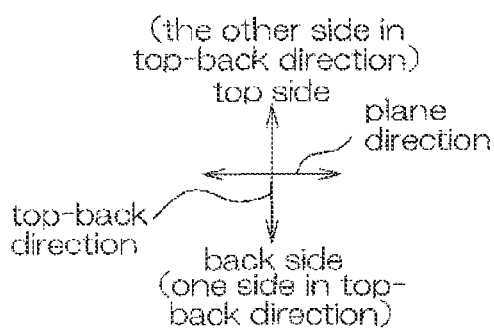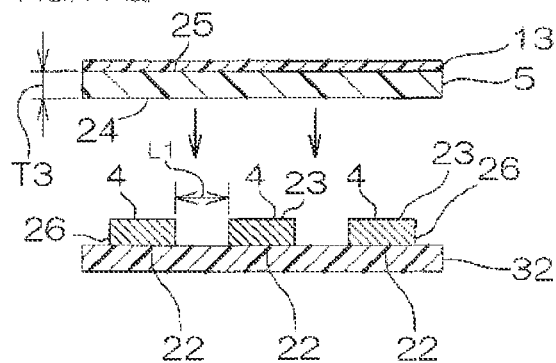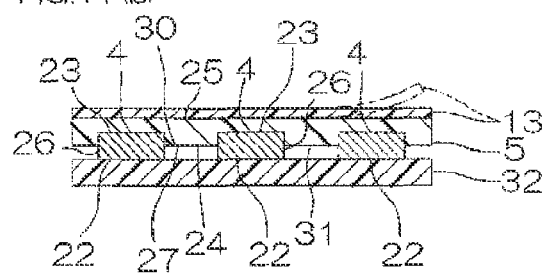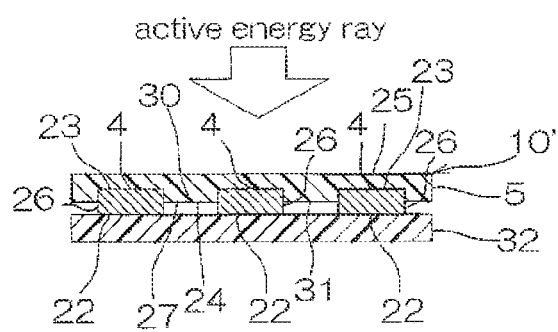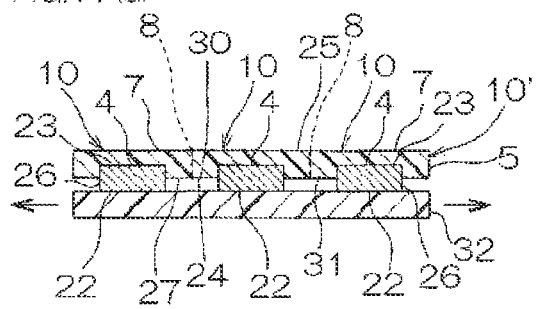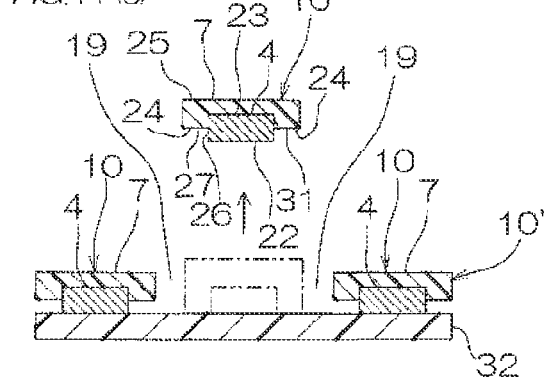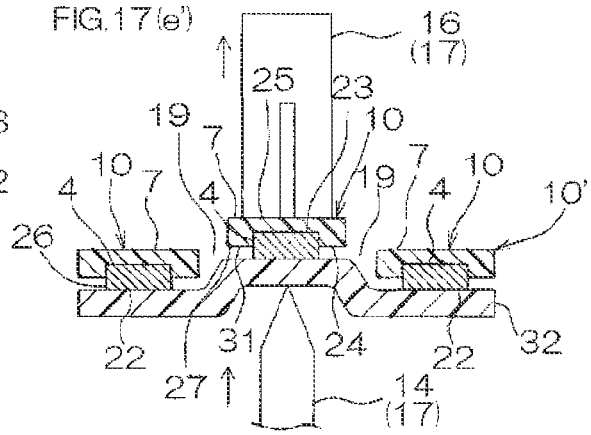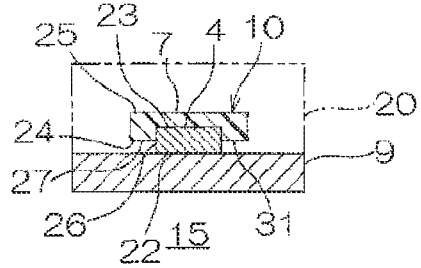

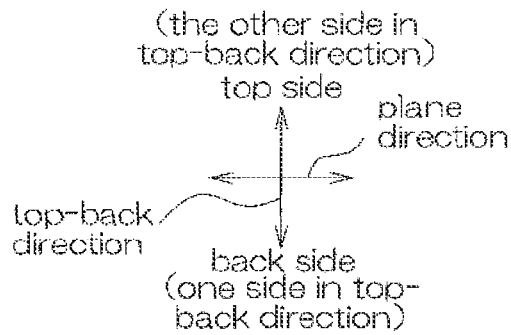
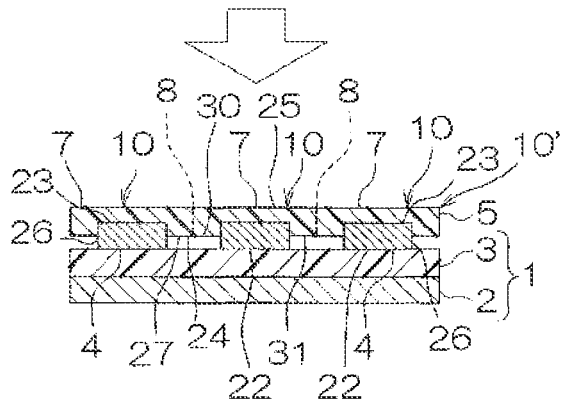
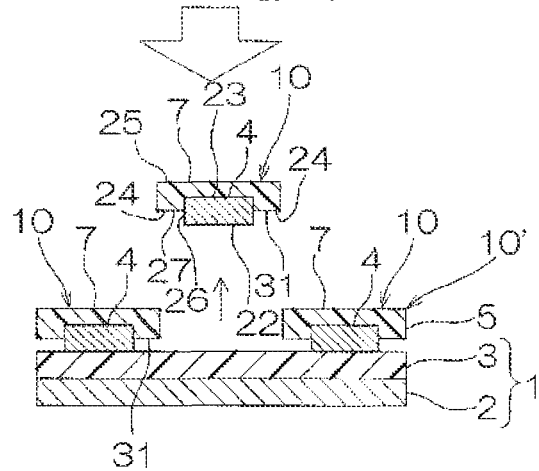
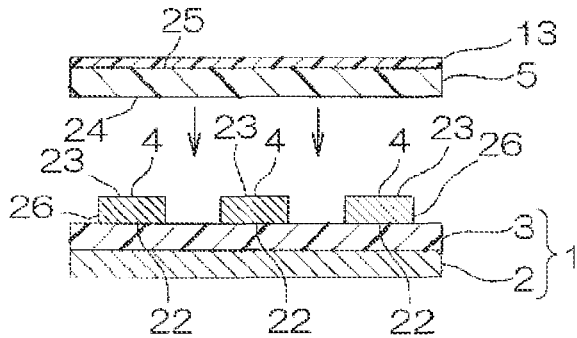
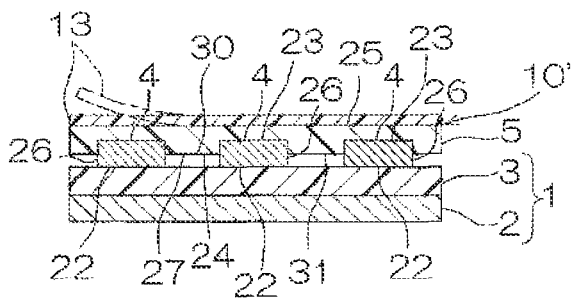
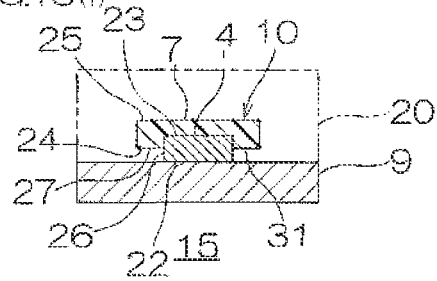

FIG.19(a)
FIG.19(b)
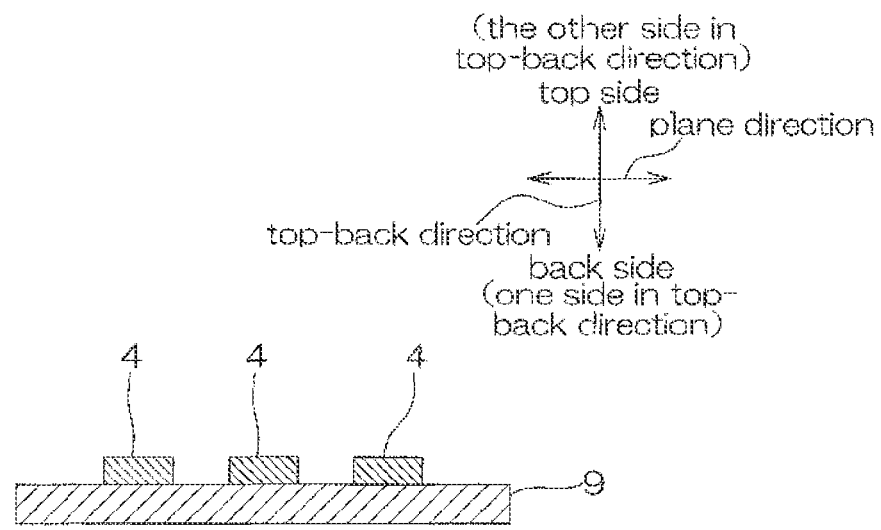
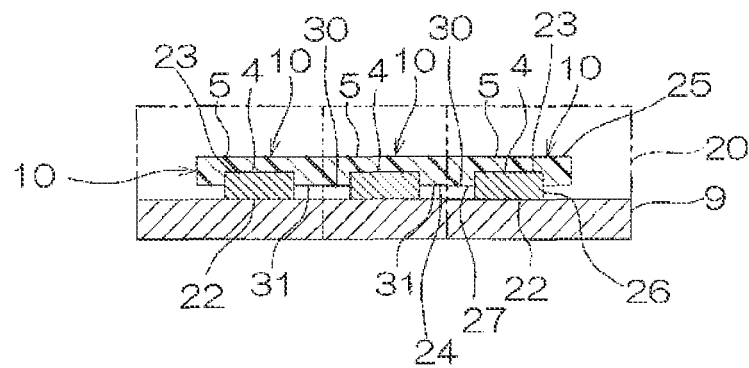

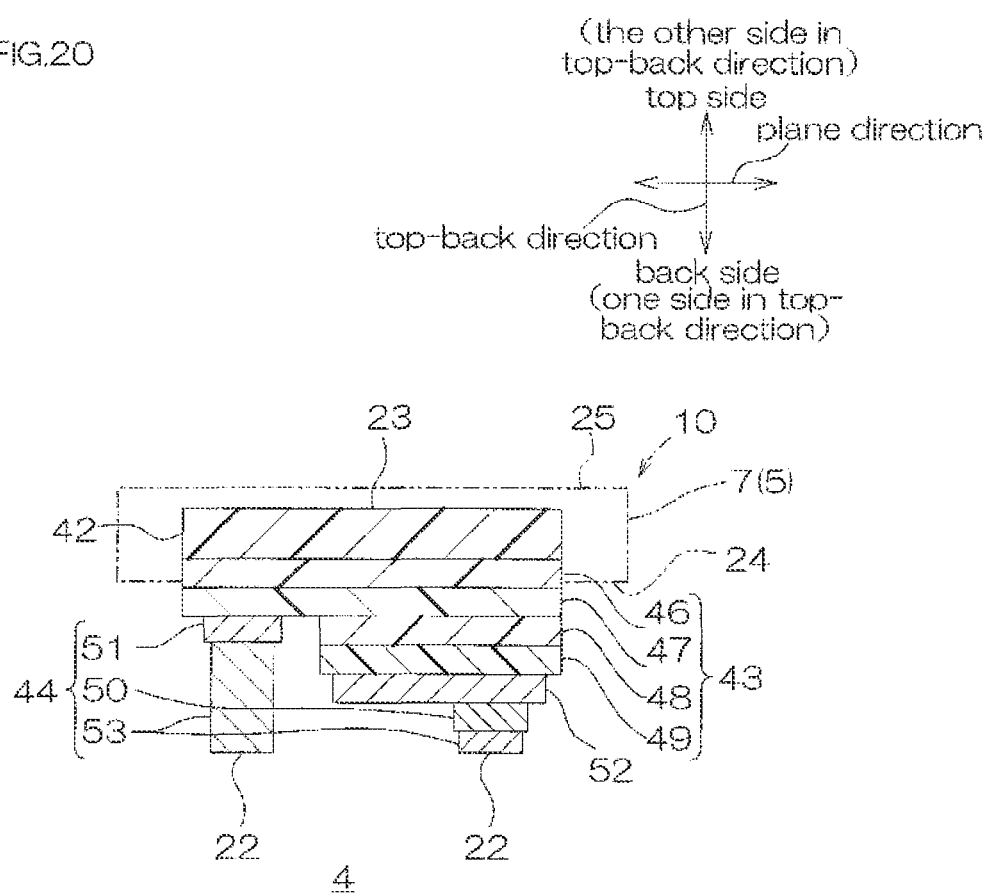

ENCAPSULATING SHEET-COVERED SEMICONDUCTOR ELEMENT AND SEMICONDUCTOR DEVICE

CROSS-REFERENCE TO RELATED APPLICATION

The present application claims priority from Japanese Patent Application No. 2012-221656 filed on Oct. 3, 2012, the contents of which are hereby incorporated by reference into this application.

BACKGROUND OF THE INVENTION

1. Field of the Invention

The present invention relates to an encapsulating sheet-covered semiconductor element, a producing method thereof, a semiconductor device, and a producing method thereof.

2. Description of Related Art

It has been known that an optical semiconductor device including an optical semiconductor element or an electronic device including an electronic element is obtained by first, mounting a plurality of semiconductor elements (the optical semiconductor elements or the electronic elements) on a board and next, providing an encapsulating layer so as to cover a plurality of the semiconductor elements.

Among all, when the optical semiconductor element and the semiconductor device are an LED and an LED device, respectively, unevenness in emission wavelength and luminous efficiency is generated between a plurality of the LEDs, so that in such an LED device mounted with the LED, there is a disadvantage that unevenness in light emission is generated between a plurality of the LEDs.

In order to solve such a disadvantage, it has been considered that, for example, a plurality of LEDs are covered with a phosphor layer to fabricate a plurality of phosphor layer-covered LEDs and thereafter, the phosphor layer-covered LED is selected in accordance with the emission wavelength and the luminous efficiency to be then mounted on a board.

For example, a chip component obtained by the following method has been proposed (ref: for example, the following Japanese Unexamined Patent Publication No. 2001-308116). In the method, a chip is attached onto a silica glass substrate via a pressure-sensitive adhesive sheet; next, a resin is applied onto the chip so as to be in contact with the upper surface of the silica glass substrate to fabricate dummy wafers made of the chips covered with the resin; thereafter, the dummy wafers are peeled from the silica glass substrate and the pressure-sensitive adhesive sheet; and then, the obtained dummy wafers are subjected to dicing on a chip basis to be singulated so as to produce the chip component. The chip component in Japanese Unexamined Patent Publication No. 2001-308116 is to be then mounted on a board, so that a semiconductor device can be obtained.

SUMMARY OF THE INVENTION

The resin is, however, applied onto the pressure-sensitive adhesive sheet including the chip and thereafter, the resin is brought into contact with the upper surface of the pressure-sensitive adhesive sheet. Thus, there is a disadvantage that a bubble is easily involved (easily contained) therein and therefore, a void is easily generated in the resin. As a result, the reliability of the semiconductor device is reduced.

It is an object of the present invention to provide an encapsulating sheet-covered semiconductor element in which generation of a void in an encapsulating sheet is suppressed, a producing method thereof, a semiconductor device including the encapsulating sheet-covered semiconductor element and having excellent reliability, and a producing method thereof.

An encapsulating sheet-covered semiconductor element of the present invention includes a semiconductor element having one surface in contact with a board and the other surface disposed at the other side of the one surface and an encapsulating sheet covering at least the other surface of the semiconductor element, wherein the encapsulating sheet includes an exposed surface that is, when projected from one side toward the other side, not included in the one surface of the semiconductor element and exposed from the one surface and the exposed surface has the other side portion that is positioned toward the other side with respect to the one surface of the semiconductor element.

In the encapsulating sheet-covered semiconductor element, the exposed surface of the encapsulating sheet has the other side portion that is positioned toward the other side with respect to the one surface of the semiconductor element, so that generation of a void in the encapsulating sheet is suppressed, compared to a case where the exposed surface of the encapsulating sheet is positioned at the same position as the one surface of the semiconductor element.

Thus, the encapsulating sheet-covered semiconductor element has excellent reliability.

In the encapsulating sheet-covered semiconductor element of the present invention, it is preferable that the entire exposed surface is the other side portion.

In the encapsulating sheet-covered semiconductor element, the entire exposed surface is the other side portion, so that the above-described generation of a void is further capable of being suppressed.

In the encapsulating sheet-covered semiconductor element of the present invention, it is preferable that the semiconductor element is an optical semiconductor element including a luminous layer; it is preferable that the luminous layer forms at least the other surface of the optical semiconductor element; it is preferable that the optical semiconductor element is an LED; and it is preferable that the encapsulating sheet is a phosphor sheet containing a phosphor.

According to the present invention, at least the other surface of the optical semiconductor element that is the LED is covered with the phosphor sheet containing the phosphor, so that a wavelength of light emitted from the optical semiconductor element, to be specific, light emitted from the luminous layer that forms at least the other surface of the LED is converted by the phosphor sheet and thus, light having high energy is capable of being emitted.

In the encapsulating sheet-covered semiconductor element of the present invention, it is preferable that a plurality of the semiconductor elements are provided at spaced intervals to each other.

In the present invention, the properties are capable of being improved by a plurality of the semiconductor elements.

A semiconductor device of the present invention includes a board, the above-described encapsulating sheet-covered semiconductor element including a semiconductor element having one surface in contact with the board and the other surface disposed at the other side of the one surface and an encapsulating sheet covering at least the other surface of the semiconductor element, wherein the encapsulating sheet includes an exposed surface that is, when projected from one side toward the other side, not included in the one surface of the semiconductor element and exposed from the one surface; the exposed surface has the other side portion that is positioned toward the other side with respect to the one surface of the semiconductor element; and the semiconductor element of the encapsulating sheet-covered semiconductor element is mounted on the board so that the one surface thereof is in contact with the board.

The semiconductor device includes the encapsulating sheet-covered semiconductor element in which the generation of a void in the encapsulating sheet is suppressed, so that it has excellent reliability.

A method for producing an encapsulating sheet-covered semiconductor element of the present invention includes a support sheet preparing step of preparing a support sheet; a semiconductor element disposing step of disposing a semiconductor element having one surface and the other surface disposed at the other side of the one surface on the support sheet so as to allow the one surface to be in contact with one surface of the support sheet; and an encapsulating sheet disposing step of disposing an encapsulating sheet including an exposed surface to be, when projected from one side toward the other side, not included in the one surface of the semiconductor element and exposed from the one surface so as to cover at least the other surface of the semiconductor element and to allow the exposed surface of the encapsulating sheet to have the other side portion positioned toward the other side with respect to the one surface of the support sheet.

This method includes the encapsulating sheet disposing step in which the encapsulating sheet including the exposed surface that is, when projected from one side toward the other side, not included in the one surface of the semiconductor element and exposed from the one surface is disposed so as to cover at least the other surface of the semiconductor element and to allow the exposed surface of the encapsulating sheet to have the other side portion that is positioned toward the other side with respect to the one surface of the support sheet. Thus, compared to a case where the entire exposed surface of the encapsulating sheet is positioned at the same position as the one surface of the support sheet, that is, compared to a case where the entire exposed surface of the encapsulating sheet is in contact with the exposed surface of the support sheet, the contact is less and thus, the generation of a void in the encapsulating sheet caused by the contact of the encapsulating sheet with the support sheet is further capable of being suppressed.

In the method for producing an encapsulating sheet-covered semiconductor element of the present invention, it is preferable that the encapsulating sheet disposing step is performed under a normal pressure atmosphere.

According to this method, the encapsulating sheet disposing step is performed under a normal pressure atmosphere, so that the encapsulating sheet disposing step can be simplified.

A method for producing a semiconductor device of the present invention includes the steps of preparing the above-described encapsulating sheet-covered semiconductor element including a semiconductor element having one surface in contact with a board and the other surface disposed at the other side of the one surface and an encapsulating sheet covering at least the other surface of the semiconductor element and mounting the semiconductor element of the encapsulating sheet-covered semiconductor element on the board or mounting a semiconductor element on the board in advance, wherein the encapsulating sheet includes an exposed surface that is, when projected from one side toward the other side, not included in the one surface of the semiconductor element and exposed from the one surface and the exposed surface has the other side portion that is positioned toward the other side with respect to the one surface of the semiconductor element.

In the method for producing a semiconductor device of the present invention, the encapsulating sheet-covered semiconductor element is prepared by the method for producing an encapsulating sheet-covered semiconductor element including the simplified encapsulating sheet disposing step, so that the semiconductor device is capable of being obtained by easy steps.

In the encapsulating sheet-covered semiconductor element of the present invention obtained by the method for producing an encapsulating sheet-covered semiconductor element of the present invention, the generation of a void in the encapsulating sheet is suppressed, so that the method for producing a semiconductor device of the present invention and the semiconductor device of the present invention obtained by the method have excellent reliability.

BRIEF DESCRIPTION OF THE DRAWINGS

FIG. 2 (a) illustrating a step of preparing a support sheet (a support sheet preparing step), FIG. 2 (b) illustrating a step of disposing LEDs on the top surface of the support sheet (an LED disposing step), FIG. 2 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 2 (d) illustrating a step of encapsulating the top surfaces of the LEDs and the top-side portions of the side surfaces thereof by the phosphor sheet (an LED encapsulating step) and a step of cutting the phosphor sheet (a cutting step), FIG. 2 (e) illustrating a step of peeling phosphor layer-covered LEDs from the support sheet (an LED peeling step), FIG. 2 (e') illustrating a step of describing the details of a state of peeling the phosphor layer-covered LEDs from a pressure-sensitive adhesive layer using a pick-up device in the LED peeling step in FIG. 2 (e), and FIG. 2 (f) illustrating a step of mounting the phosphor layer-covered LED on a board (a mounting step).

FIG. 5 shows process drawings for illustrating a modified example of the method for producing a phosphor layer-covered LED and the method for producing an LED device in the first embodiment:

FIG. 5 (a) illustrating a step of preparing a support sheet (a support sheet preparing step), FIG. 5 (b) illustrating a step of disposing an LED on the top surface of the support sheet (an LED disposing step), FIG. 5 (c) illustrating a step of disposing a phosphor sheet so as to cover the top surface of the LED and the top-side portions of the side surfaces thereof and to allow the back surface of the phosphor sheet to serve as the top-side portion (the other side portion) (a phosphor sheet disposing step), FIG. 5 (d) illustrating a step of encapsulating the top surface of the LED and the top-side portions of the side surfaces thereof by the phosphor sheet (an LED encapsulating step), FIG. 5 (e) illustrating a step of peeling a phosphor layer-covered LED from the support sheet (an LED peeling step), and FIG. 5 (e') illustrating a step of describing the details of a state of peeling the phosphor layer-covered LED from a pressure-sensitive adhesive layer using a pick-up device in the LED peeling step in FIG. 5 (e), and FIG. 5 (f) illustrating a step of mounting the phosphor layer-covered LED on a board (a mounting step).

FIG. 8 shows process drawings for illustrating a modified example of the method for producing a phosphor layer-covered LED and the method for producing an LED device shown in FIG. 7:

FIG. 8 (a) illustrating a step of disposing a phosphor sheet so as to cover the top surfaces only of LEDs and to allow the back surface of the phosphor sheet to serve as the top-side portion (the other side portion) (a phosphor sheet disposing step), FIG. 8 (b) illustrating a step of encapsulating the top surfaces only of the LEDs by the phosphor sheet (an LED encapsulating step) and a step of cutting the phosphor sheet (a cutting step), FIG. 8 (c) illustrating a step of peeling phosphor layer-covered LEDs from a support sheet (an LED peeling step), and FIG. 8 (d) illustrating a step of mounting the phosphor layer-covered LED on a board (a mounting step).

FIG. 9 shows a sectional view of a modified example of the phosphor layer-covered LED in the first embodiment.

FIG. 10 (a) illustrating a step of disposing a phosphor sheet so as to cover the top surfaces of the LEDs and the side surfaces thereof and to allow the back surface of the phosphor sheet to have the top-side portion (a phosphor sheet disposing step), FIG. 10 (b) illustrating a step of encapsulating the top surfaces of the LEDs and the side surfaces thereof by the phosphor sheet (an LED encapsulating step) and a step of cutting the phosphor sheet (a cutting step), FIG. 10 (c) illustrating a step of peeling phosphor layer-covered LEDs from a support sheet (an LED peeling step), and FIG. 10 (d) illustrating a step of mounting the phosphor layer-covered LED on a board (a mounting step).

FIG. 11 shows process drawings for illustrating a method for producing a phosphor layer-covered LED and a method for producing an LED device that are a second embodiment of a method for producing an encapsulating sheet-covered semiconductor element and a method for producing a semiconductor device of the present invention, respectively:

FIG. 11 (a) illustrating a step of preparing a support sheet (a support sheet preparing step), FIG. 11 (b) illustrating a step of disposing LEDs on the top side of the support sheet (an LED disposing step), FIG. 11 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 11 (d) illustrating a step of encapsulating the top surfaces of the LEDs and the top-side portions of the side surfaces thereof by the phosphor sheet (an LED encapsulating step) and a step of cutting the phosphor sheet (a cutting step), FIG. 11 (e) illustrating a step of peeling phosphor layer-covered LEDs from the support sheet (an LED peeling step), and FIG. 11 (f) illustrating a step of mounting the phosphor layer-covered LED on a board (a mounting step).

FIG. 13 shows process drawings for illustrating a method for producing a phosphor layer-covered LED and a method for producing an LED device that are a third embodiment of a method for producing an encapsulating sheet-covered semiconductor element and a method for producing a semiconductor device of the present invention, respectively:

FIG. 13 (a) illustrating a step of preparing a support sheet (a support sheet preparing step), FIG. 13 (b) illustrating a step of disposing LEDs on the top side of the support sheet (an LED disposing step), FIG. 13 (c) illustrating a step of disposing a phosphor sheet so as to cover the top surfaces of the LEDs and the top-side portions of the side surfaces thereof and to allow the hack surface of the phosphor sheet to serve as the top-side portion (the other side portion) (a phosphor sheet disposing step), FIG. 13 (d) illustrating a step of encapsulating the top surfaces of the LEDs and the top-side portions of the side surfaces thereof by the phosphor sheet (an LED encapsulating step) and a step of cutting the phosphor sheet (a cutting step), FIG. 13 (e) illustrating a step of peeling a support board from a pressure-sensitive adhesive layer (a support board peeling step), FIG. 13 (f) illustrating a step of peeling phosphor layer-covered LEDs from the pressure-sensitive adhesive layer (an LED peeling step), FIG. 13 (f') illustrating a step of describing the details of a state of peeling the phosphor layer-covered LEDs from the pressure-sensitive adhesive layer using a pick-up device in the LED peeling step in FIG. 13 (f), and FIG. 13 (g) illustrating a step of mounting the phosphor layer-covered LED on a board (a mounting step).

FIG. 14 shows process drawings for illustrating a method for producing a phosphor layer-covered LED and a method for producing an LED device that are a fourth embodiment of a method for producing an encapsulating sheet-covered semiconductor element and a method for producing a semiconductor device of the present invention, respectively:

FIG. 14 (a) illustrating a step of preparing a support sheet (a support sheet preparing step), FIG. 14 (b) illustrating a step of disposing LEDs on the top side of the support sheet (an LED disposing step), FIG. 14 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 14 (d) illustrating a step of encapsulating the top surfaces of the LEDs and the top-side portions of the side surfaces thereof by the phosphor sheet (an LED encapsulating step) and a step of cutting the phosphor sheet (a cutting step), FIG. 14 (e) illustrating a step of transferring phosphor layer-covered LEDs onto a transfer sheet (a first transfer step), FIG. 14 (f) illustrating a step of transferring the phosphor layer-covered LEDs onto a stretchable support sheet (a second transfer step), FIG. 14 (g) illustrating a step of peeling the phosphor layer-covered LEDs from the stretchable support sheet (a re-releasing step), FIG. 14 (g') illustrating a step of describing the details of a state of peeling the phosphor layer-covered LEDs from the stretchable support sheet using a pick-up device in the re-releasing step in FIG. 14 (g), and FIG. 14 (h) illustrating a step of mounting the phosphor layer-covered LED on a board (a mounting step).

FIG. 15 shows process drawings for illustrating a method for producing a phosphor layer-covered LED and a method for producing an LED device that are a fifth embodiment of a method for producing an encapsulating sheet-covered semiconductor element and a method for producing a semiconductor device of the present invention, respectively:

FIG. 15 (a) illustrating a step of preparing a support sheet (a support sheet preparing step), FIG. 15 (b) illustrating a step of disposing LEDs on the top side of the support sheet (an LED disposing step), FIG. 15 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 15 (d) illustrating a step of encapsulating the top surfaces of the LEDs and the top-side portions of the side surfaces thereof by the phosphor sheet (an LED encapsulating step), FIG. 15 (e) illustrating a step of transferring phosphor layer-covered LEDs onto a transfer sheet (a first transfer step), FIG. 15 (f) illustrating a step of cutting the phosphor sheet (a cutting step)

FIG. 15 (g) illustrating a step of transferring the phosphor layer-covered LEDs onto a stretchable support sheet (a second transfer step), FIG. 15 (h) illustrating a step of peeling the phosphor layer-covered LEDs from the stretchable support sheet (a re-releasing step), FIG. 15 (h') illustrating a step of describing the details of a state of peeling the phosphor layer-covered LEDs from the stretchable support sheet using a pick-up device in the re-releasing step in FIG. 15 (h), and FIG. 15 (i) illustrating a step of mounting the phosphor layer-covered LED on a board (a mounting step).

FIG. 16 shows process drawings for illustrating a method for producing a phosphor layer-covered LED and a method for producing an LED device that are a sixth embodiment of a method for producing an encapsulating sheet-covered semiconductor element and a method for producing a semiconductor device of the present invention, respectively:

FIG. 16 (a) illustrating a step of preparing a support sheet (a support sheet preparing step), FIG. 16 (b) illustrating a step of disposing LEDs on the top side of the support sheet (an LED disposing step), FIG. 16 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 16 (d) illustrating a step of encapsulating the top surfaces of the LEDs and the top-side portions of the side surfaces thereof by the phosphor sheet (an LED encapsulating step), FIG. 16 (e) illustrating a step of peeling a support board from a pressure-sensitive adhesive layer (a support board peeling step), FIG. 16 (f) illustrating a step of transferring phosphor layer-covered LEDs onto a transfer sheet (a first transfer step), FIG. 16 (g) illustrating a step of peeling the pressure-sensitive adhesive layer from the phosphor layer-covered LEDs (a pressure-sensitive adhesive layer peeling step) and a step of cutting the phosphor sheet (a cutting step), FIG. 16 (h) illustrating a step of transferring the phosphor layer-covered LEDs onto a stretchable support sheet (a second transfer step), FIG. 16 (i) illustrating a step of peeling the phosphor layer-covered LEDs from the stretchable support sheet (a re-releasing step), FIG. 16 (i') illustrating a step of describing the details of a state of peeling the phosphor layer-covered LEDs from the stretchable support sheet using a pick-up device in the re-releasing step in FIG. 16 (i), and FIG. 16 (j) illustrating a step of mounting the phosphor layer-covered LED on a board (a mounting step).

FIG. 17 shows process drawings for illustrating a method for producing a phosphor layer-covered LED and a method for producing an LED device that are a seventh embodiment of a method for producing an encapsulating sheet-covered semiconductor element and a method for producing a semiconductor device of the present invention, respectively:

FIG. 17 (a) illustrating a step of disposing LEDs on the top surface of a support sheet (an LED disposing step), FIG. 17 (b) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 17 (c) illustrating a step of applying an active energy ray to a phosphor sheet to cure the phosphor sheet and encapsulating the top surfaces of the LEDs and the top-side portions of the side surfaces thereof by the phosphor sheet (an LED encapsulating step), FIG. 17 (d) illustrating a step of cutting the phosphor sheet (a cutting step), FIG. 17 (e) illustrating a step of peeling phosphor layer-covered LEDs from the support sheet (an LED peeling step), FIG. 17 (e') illustrating a step of describing the details of a state of peeling the phosphor layer-covered LEDs from the support sheet using a pick-up device in the LED peeling step in FIG. 17 (e), and FIG. 17 (f) illustrating a step of mounting the phosphor layer-covered LED on a board (a mounting step).

FIG. 18 shows process drawings for illustrating a method for producing a phosphor layer-covered LED and a method for producing an LED device that are an eighth embodiment of a method for producing an encapsulating sheet-covered semiconductor element and a method for producing a semiconductor device of the present invention, respectively:

FIG. 18 (a) illustrating a step of preparing a support sheet (a support sheet preparing step), FIG. 18 (b) illustrating a step of disposing LEDs on the top side of the support sheet (an LED attaching step), FIG. 18 (c) illustrating a step of disposing a phosphor sheet so as to cover the top surfaces of the LEDs and the top-side portions of the side surfaces thereof and to allow the back surface of the phosphor sheet to serve as the top-side portion (the other side portion) (a phosphor sheet disposing step), FIG. 18 (d) illustrating a step of encapsulating the top surfaces of the LEDs and the top-side portions of the side surfaces thereof by the phosphor sheet (an LED encapsulating step) and a step of cutting the phosphor sheet (a cutting step).

FIG. 18 (e) illustrating a step of peeling phosphor layer-covered LEDs from the support sheet (an LED peeling step), and FIG. 18 (f) illustrating a step of mounting the phosphor layer-covered LED on a board (a mounting step).

FIG. 19 shows process drawings for illustrating a method for producing an LED device that is a ninth embodiment of a method for producing an encapsulating sheet-covered semiconductor element and a method for producing a semiconductor device of the present invention, respectively:

FIG. 19 (a) illustrating a step of mounting LEDs on a board in advance and

FIG. 19 (b) illustrating a step of disposing a phosphor sheet so as to cover the top surfaces of the LEDs and the top-side portions of the side surfaces thereof and to allow the back surface of the phosphor sheet to serve as the top-side portion (the other side portion) to obtain an LED device.

FIG. 20 shows an enlarged sectional view of the LED in the first to ninth embodiments.

DETAILED DESCRIPTION OF THE INVENTION

An encapsulating sheet-covered semiconductor element of the present invention includes a semiconductor element having one surface in contact with a board and the other surface disposed at the other side of the one surface and an encapsulating sheet covering at least the other surface of the semiconductor element, and the encapsulating sheet includes an exposed surface that is, when projected from one side toward the other side, not included in the one surface of the semiconductor element and exposed from the one surface. The exposed surface has the other side portion that is positioned toward the other side with respect to the one surface of the semiconductor element.

In the following, by the first to ninth embodiments, an encapsulating sheet-covered semiconductor element, a producing method thereof, a semiconductor device, and a producing method thereof of the present invention are described with reference to FIGS. 1 to 17.

First Embodiment

Figure 1:
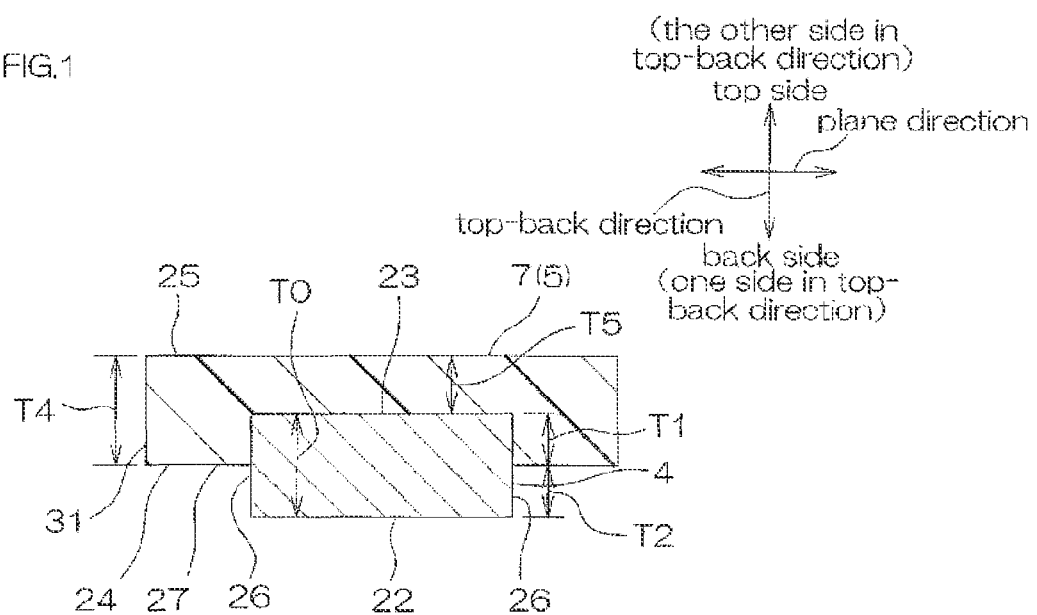
FIG. 1 shows a sectional view of a phosphor layer-covered LED that is a first embodiment of an encapsulating sheet-covered semiconductor element of the present invention.
Figure 2:
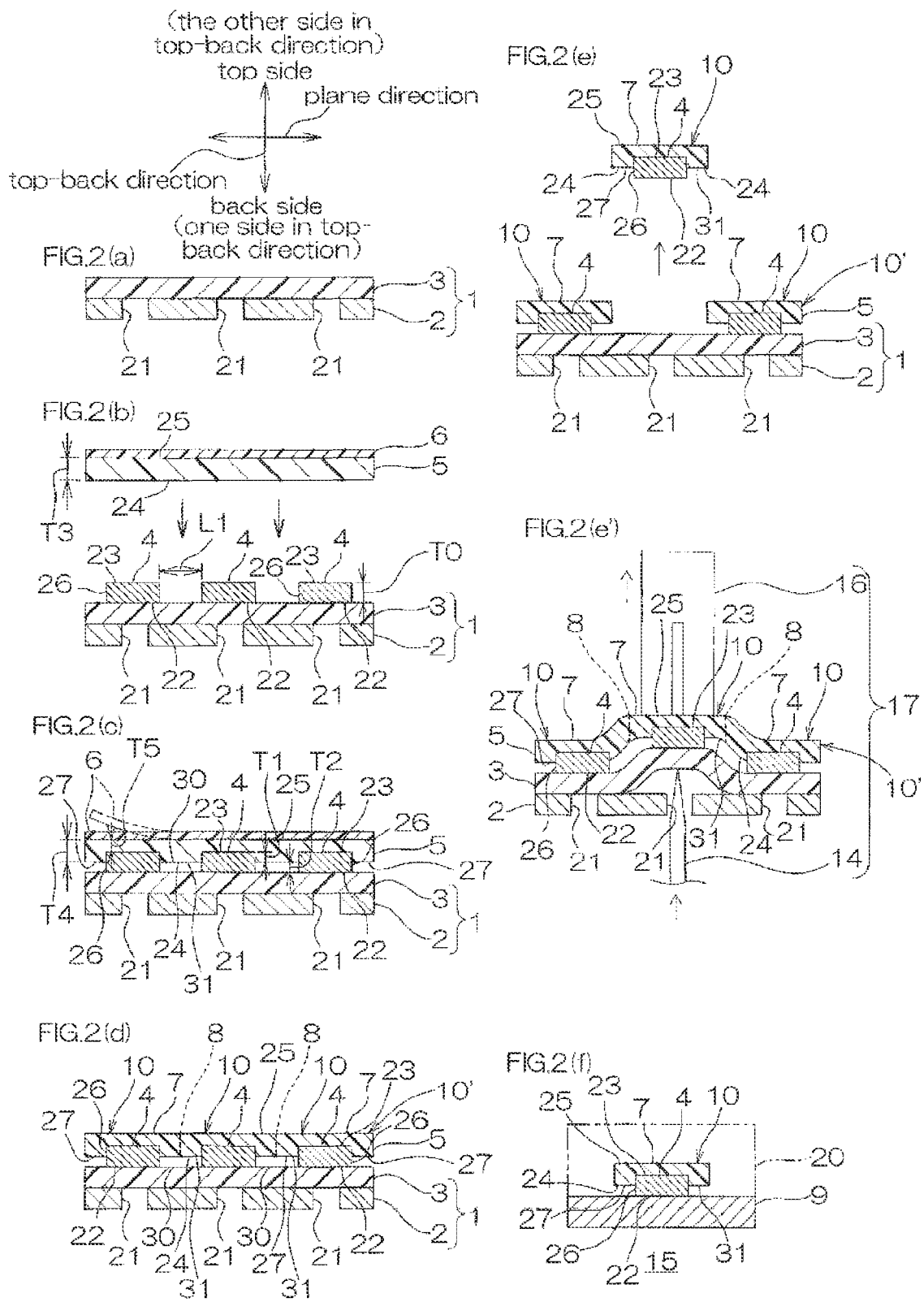
FIG. 2 shows process drawings for illustrating a method for producing a phosphor layer-covered LED and a method for producing an LED device that are a first embodiment of a method for producing an encapsulating sheet-covered semiconductor element and a method for producing a semiconductor device of the present invention, respectively.
Figure 3:
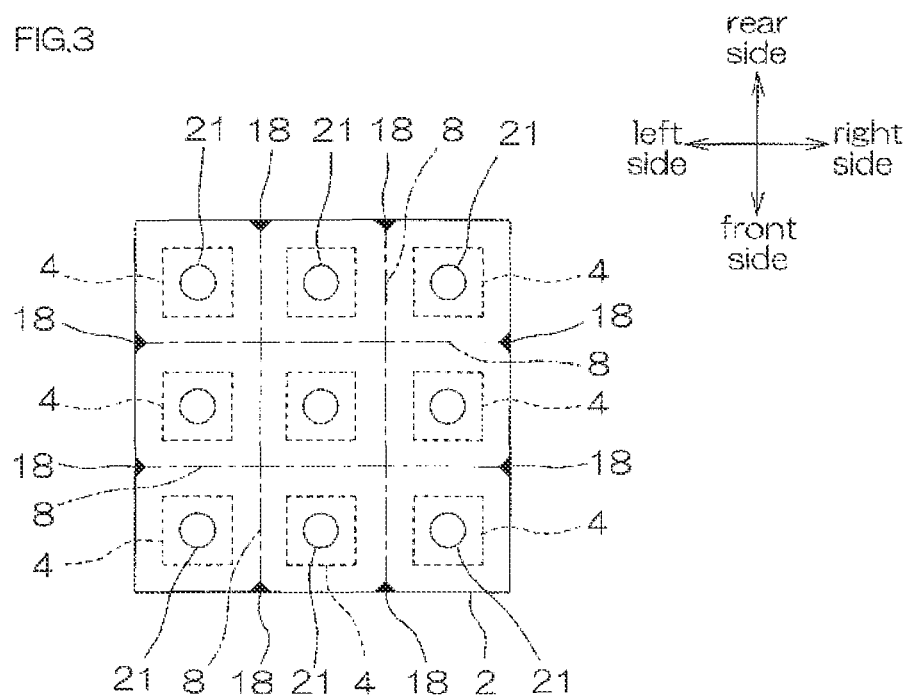
FIG. 3 shows a plan view of the support sheet shown in FIG. 2 (a).
Figure 6:
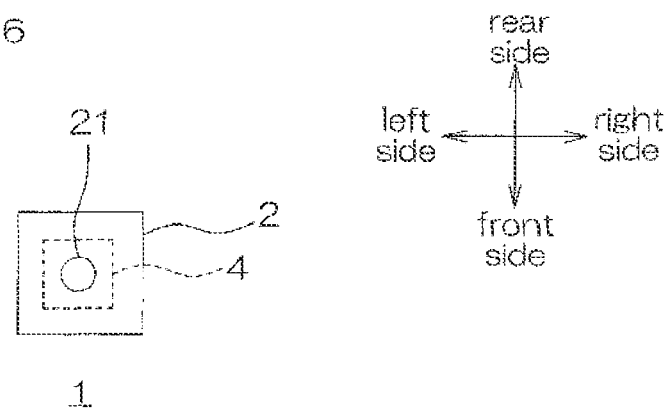
FIG. 6 shows a plan view of the support sheet shown in FIG. 5 (a).
Figure 12:
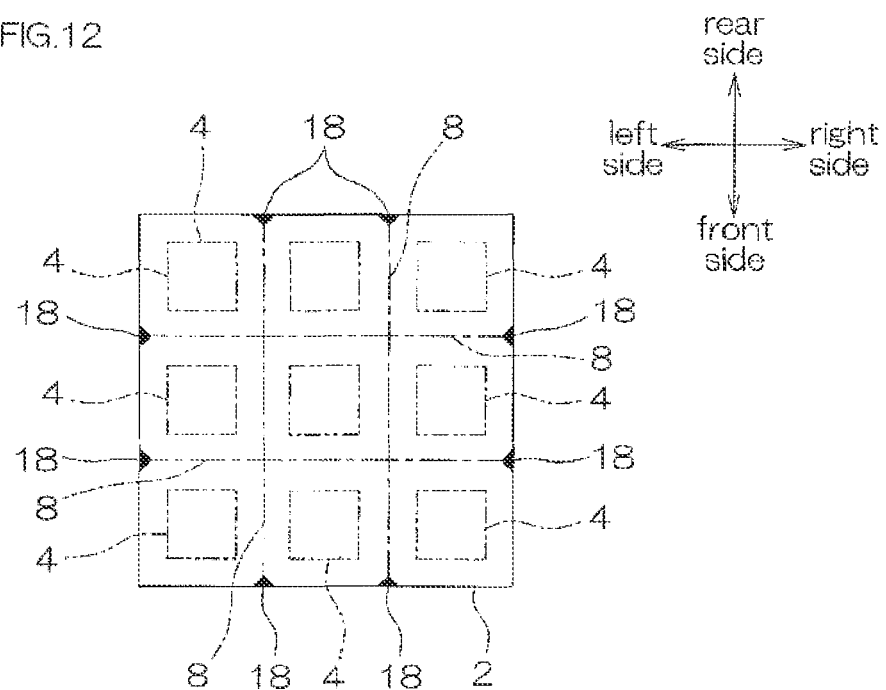
FIG. 12 shows a plan view of the support sheet shown in FIG. 11 (a).

In FIG. 1, the up-down direction of the paper surface may be referred to as a first direction (a top-back direction); the depth direction of the paper surface may be referred to as a second direction (a front-rear direction); and the right-left direction of the paper surface may be referred to as a third direction. The top-back direction is a two-way direction of a direction going from the top surface that is the other surface to the back surface that is one surface and a direction going from the back surface to the top surface in an LED 4 to be described later. Furthermore, the direction going from the top surface to the back surface is defined as one side in the top-back direction and the direction going from the back surface to the top surface is defined as the other side in the top-back direction. Directions in FIG. 2 and the subsequent figures are in conformity with the directions in FIG. 1. In FIGS. 3, 6, and 12, a pressure-sensitive adhesive layer 3 to be described later is omitted so as to clearly show the relative arrangement of a support board 2, a through hole 21 (FIGS. 3 and 6 only), and a reference mark 18 (FIGS. 3 and 12 only) to be described later.

As shown in FIG. 1, a phosphor layer-covered LED 10, as an encapsulating sheet-covered semiconductor element, includes the LED 4, as a semiconductor element, having a back surface 22, as one surface, for being brought into contact with a board 9 (described later, ref: FIG. 2 (f)) to be mounted; a top surface 23, as the other surface, that is disposed at the top side (the other side in the top-back direction, that is, the opposite side) of the back surface 22; and side surfaces 26 that are connected to the back surface 22 and the top surface 23 therebetween, and a phosphor layer 7 formed of a phosphor sheet 5 (ref: FIG. 2), as an encapsulating sheet, that covers at least the top surface 23 of the LED 4.

The LED 4 is a semiconductor element (to be specific, an optical semiconductor element) that converts electrical energy to light energy. The LED 4 is, for example, formed into a generally rectangular shape in sectional view and a generally rectangular shape in plane view with the thickness (the maximum length in the top-back direction) shorter than the length in the plane direction (the maximum length in a direction perpendicular to the top-back direction). The top surface 23 and the side surface 26 of the LED 4 are formed of a luminous layer (not shown). On the other hand, a portion of the back surface 22 of the LED 4 is formed of a bump (ref: a numeral 22 in FIG. 20) that is not shown in FIG. 1. The portion of the back surface 22 of the LED 4 is electrically connected to a terminal (not shown in FIG. 2) that is provided on the top surface of the board 9 (ref: FIG. 2 (f)), so that the LED 4 is mounted thereon. An example of the LED 4 includes a blue LED (a light emitting diode element) that emits blue light. When the top surface of the LED 4 has irregularities, the surface that is positioned at the most other side in the top-back direction is the top surface 23 of the LED 4. Also, as described in FIG. 20 to be described later, when the back surface of the LED 4 has irregularities, the surface that is positioned at the most one side in the top-back direction is the back surface 22 of the LED 4.

The maximum length in the plane direction of the LED 4 is, for example, 0.1 mm or more and 3 mm or less. The length of one side thereof is, for example, 0.1 mm or more and 3 mm or less. A thickness T0 of the LED 4 is, for example, 0.05 mm or more and 1 mm or less.

The back-side portion of the phosphor layer 7 embeds the top-side portion of the LED 4. To be specific, the phosphor layer 7 covers the top surface 23 of the LED 4 and the top-side portions of the side surfaces 26 thereof.

That is, the phosphor layer 7 is formed into a flat shape so that a top surface 25 thereof is, when projected in the plane direction (a direction perpendicular to the top-back direction), positioned toward the top side (the other side in the top-back direction) with respect to the top surface 23 of the LED 4.

On the other hand, a back surface 24 of the phosphor layer 7 is, when projected in the plane direction, positioned toward the top side with respect to the back surface 22 of the LED 4 and is positioned toward the back side (one side in the top-back direction) with respect to the top surface 23 of the LED 4. To be specific, in the back surface 24 of the phosphor layer 7, an exposed surface 27 in a flat shape that is, when projected in the top-back direction, not overlapped with the LED 4 and is exposed from the LED 4 is formed. The exposed surface 27 of the phosphor layer 7 is, in bottom view, formed into a frame shape that surrounds the LED 4. The inner end edge of the exposed surface 27 is, in side view, formed to reach the center in the top-back direction of the side surface 26 of the LED 4.

The exposed surface 27 of the phosphor layer 7 is defined as the top-side portion (the other side portion) that is positioned toward the top side (the other side in the top-back direction) with respect to the back surface 22 of the LED 4. In this way, the back-side portion of the LED 4 is extruded from the exposed surface 27 of the phosphor layer 7 toward the back side (one side in the top-back direction).

A length T1 in the top-back direction between the top surface 23 of the LED 4 and the exposed surface 27 of the phosphor layer 7, that is, a length (an embedded length of the LED 4) T1 in the top-back direction in which the LED 4 is embedded with respect to the thickness T0 of the LED 4 is, when projected in the plane direction, set to be, for example, 5% or more, preferably 10% or more, or more preferably 20% or more, and to be, for example, 95% or less, preferably 90% or less, or more preferably 80% or less. The embedded length T1 of the LED 4 with respect to a thickness T3 (ref: FIG. 2 (b)) of the phosphor sheet 5 before compressive bonding to be described later is set to be, for example, 5% or more, or preferably 10% or more, and to be, for example, 95% or less, or preferably 90% or less. To be specific, the embedded length T1 of the LED 4 is, for example, 0.01 mm or more, preferably 0.05 mm or more, or more preferably 0.1 mm or more, and is, for example, 1 mm or less, preferably 0.8 mm or less, or more preferably 0.5 mm or less.

On the other hand, a length T2 in the top-back direction between the back surface 22 of the LED 4 and the exposed surface 27 of the phosphor layer 7, that is, an extruded length T2 in which the back-side portion of the LED 4 is extruded from the back surface 24 of the phosphor layer 7 toward the back side (one side in the top-back direction) with respect to the thickness T0 of the LED 4 is, when projected in the plane direction, set to be, for example, 5% or more, preferably 10% or more, or more preferably 20% or more, and to be, for example, 95% or less, preferably 90% or less, or more preferably 80% or less. The extruded length T2 with respect to the thickness T3 (ref: FIG. 2 (b)) of the phosphor sheet 5 before compressive bonding to be described later is set to be, for example, 5% or more, or preferably 10% or more and to be, for example, 95% or less, or preferably 90% or less. To be specific, the extruded length T2 of the LED 4 is, for example, 0.01 mm or more, preferably 0.05 mm or more, or more preferably 0.1 mm or more, and is, for example, 1 mm or less, preferably 0.8 mm or less, or more preferably 0.5 mm or less.

A thickness T4 of the phosphor layer 7 is, for example, 2 mm or less, or preferably 1 mm or less, and is, for example, 0.05 mm or more, or preferably 0.1 mm or more.

The thickness T4 of the phosphor layer 7 is the maximum thickness (the maximum length in the top-back direction) T4 of the phosphor layer 7 in the phosphor layer-covered LED 10. To be specific, the thickness T4 of the phosphor layer 7 is a thickness of a portion of the phosphor layer 7 that is, when projected in the top-back direction, not overlapped with the LED 4 and is exposed therefrom, to be more specific, a thickness (that is, a length between the top surface 25 and the exposed surface 27) of the phosphor layer 7 in which the exposed surface 27 is defined in bottom view.

On the other hand, a minimum thickness T5 of the phosphor layer 7 is, for example, 0.01 mm or more, or preferably 0.02 mm or more, and is, for example, 1 mm or less, or preferably 0.5 mm or less.

Next, a method for producing the phosphor layer-covered LED 10 is described in detail.

As shown in FIGS. 2 (a) to 2 (e), the method for producing the phosphor layer-covered LED 10 includes a support sheet preparing step (ref: FIG. 2 (a)); an LED disposing step of disposing the LEDs 4 (one example of a semiconductor element disposing step, ref: FIG. 2 (b)); an LED covering step (ref: FIGS. 2 (c) and 2 (d)); a cutting step of producing the phosphor layer-covered LEDs 10 (ref: dashed lines in FIG. 2 (d)); and an LED peeling step (ref: FIGS. 2 (e) and 2 (e')).

The LED covering step includes a phosphor sheet disposing step (one example of an encapsulating sheet disposing step, ref: FIG. 2 (c)) of, after the LED disposing step, disposing the phosphor sheet 5 as an encapsulating sheet on the top-side portions of the LEDs 4 so as to cover the top surfaces 23 of the LEDs 4 and the top-side portions of the side surfaces 26 thereof and to allow the back surface 24 of the phosphor sheet 5 to serve as the exposed surface 27 that is positioned as described above and an LED encapsulating step (ref: FIG. 2 (d)) of curing the phosphor sheet 5 to encapsulate the top-side portions of the LEDs 4 by the phosphor sheet 5.

A method for producing an LED device 15 as a semiconductor device includes a mounting step (ref: FIG. 2 (f)).

In the following, the steps of the method for producing the phosphor layer-covered LED 10 and the method for producing the LED device 15 in the first embodiment are described in detail.

[Support Sheet Preparing Step]

The support sheet preparing step is a step of preparing a support sheet 1. As shown in FIGS. 2 (a) and 3, the support sheet 1 is formed into a sheet shape extending in the plane direction. The support sheet 1 is formed into, for example, a generally rectangular shape in plane view (a shape when projected in the top-back direction).

The support sheet 1 is prepared so that the reference marks 18, which serve as a reference of cutting in the cutting step (ref: the dashed lines in FIG. 2 (d)) to be described later, are provided in advance.

As shown in FIG. 3, a plurality of the reference marks 18 are provided at spaced intervals to each other at the circumference end portion in the plane direction of the support sheet 1. The reference marks 18 are, for example, provided at two sides that are opposed to each other in the support sheet 1. The reference marks 18 are formed to make a pair opposing to each other in an opposing direction of the two sides of the support sheet 1. One pair of the reference marks 18 is provided corresponding to the LEDs 4 (the dashed lines) that are subsequently disposed and is disposed so as to be capable of singulating the LEDs 4 when the phosphor sheet 5 is cut with the reference marks 18 as a reference.

Each of the reference marks 18 is formed into a shape that is easily recognized in plane view and is, for example, formed into a generally triangular shape in plane view.

In a size of the support sheet 1, the maximum length thereof is, for example, 10 mm or more and 300 mm or less and the length of one side thereof is, for example, 10 mm or more and 300 mm or less.

The support sheet 1 is configured to be capable of supporting a plurality of the LEDs 4 (ref: FIG. 2 (b)) and as shown in FIGS. 2 (a) and 3, includes, for example, the support board 2 and the pressure-sensitive adhesive layer 3 that is laminated on the top surface of the support board 2.

The support board 2 is formed into a plate shape extending in the plane direction. The support board 2 is provided on the back surface in the support sheet 1 and is formed to have the generally same shape as that of the support sheet 1 in plane view.

In the support board 2, the reference marks 18 are formed. The reference marks 18 are, in sectional view, though not shown, formed as concave portions that dent from the top surface toward the middle in the top-back direction of the support board 2 or as holes that pass through in the top-back direction thereof.

The support board 2 is incapable of stretching at least in the plane direction and is formed of a hard material. To be specific, examples of the material include an oxide such as a silicon oxide (glass, silica, or the like) and alumina and a metal such as stainless steel and silicon.

The support board 2 has a Young's modulus at 23° C. of, for example, $1 \times 10^6$ Pa or more, preferably $1 \times 10^7$ Pa or more, or more preferably $1 \times 10^8$ Pa or more, and of, for example, $1 \times 10^{12}$ Pa or less. When the Young's modulus of the support board 2 is not less than the above-described lower limit, hardness of the support board 2 is secured and the LEDs 4 (ref: FIG. 2 (b)) to be described later can be further surely supported. The Young's modulus of the support board 2 is obtained by, for example, the compressive elastic modulus in JIS H 7902:2008.

The thickness of the support board 2 is, for example, 0.1 mm or more, or preferably 0.3 mm or more, and is, for example, 5 mm or less, or preferably 2 mm or less.

In the support board 2, the through holes 21 for allowing a pressing member 14 to insert thereinto in the LED peeling step (ref: FIGS. 2 (e) and 2 (e')) to be described later are formed.

As shown in FIG. 3, a plurality of the through holes 21 are provided at spaced intervals to each other in the support board 2 corresponding to the LEDs 4 that are subsequently disposed. The through holes 21 are, for example, disposed so as to allow each of the phosphor layer-covered LEDs 10 to be pressed when phosphor sheet-covered LEDs 10' are singulated with the reference marks 18 as a reference.

To be more specific, a plurality of the through holes 21 are disposed in alignment in the support sheet 1 so as to be spaced apart from each other at equal intervals in the front-rear and the right-left directions in plane view.

The shape of each of the through holes 21 is, for example, formed into a circular shape in plane view. In a size thereof, the hole diameter is, for example, 0.1 mm or more, or preferably 0.2 mm or more, and is, for example, 1 mm or less, or preferably 0.7 mm or less.

The size (the plane area) of each of the through holes 21 with respect to the size (the plane area) of each of the LEDs 4 is, for example, 10% or more, or preferably 20% or more, and is, for example, 90% or less, or preferably 80% or less.

The pressure-sensitive adhesive layer 3 is formed on the entire top surface of the support board 2.

That is, the pressure-sensitive adhesive layer 3 is laminated on the top surface of the support board 2 so as to cover the through holes 21.

An example of a pressure-sensitive adhesive material for forming the pressure-sensitive adhesive layer 3 includes a pressure-sensitive adhesive such as an acrylic pressure-sensitive adhesive and a silicone pressure-sensitive adhesive.

The pressure-sensitive adhesive material can be widely selected from materials that can be usually used as a pressure-sensitive adhesive, in addition to materials in which the pressure-sensitive adhesive force is capable of being reduced by application of ultraviolet ray, a chemical solution, or heating.

The thickness of the pressure-sensitive adhesive layer 3 is, for example, 0.01 mm or more, or preferably 0.02 mm or more, and is, for example, 1 mm or less, or preferably 0.5 mm or less.

In order to prepare the support sheet 1, for example, the support board 2 is attached to the pressure-sensitive adhesive layer 3.

The thickness of the support sheet 1 is, for example, 0.2 mm or more, or preferably 0.5 mm or more, and is, for example, 6 mm or less, or preferably 2.5 mm or less.

[LED Disposing Step]

The LED disposing step is a step of preparing a plurality of the LEDs 4 and disposing a plurality of the LEDs 4 on the pressure-sensitive adhesive layer 3. In the LED disposing step, as shown in FIG. 2 (b) and by phantom lines in FIG. 3, a plurality of the LEDs 4 are prepared and are disposed at spaced intervals to each other so that the back surfaces 22 of a plurality of the LEDs 4 are in contact with the top surface of the support sheet 1.

In the LED disposing step, for example, a plurality of the LEDs 4 are disposed in alignment on the top surface of the support sheet 1. To be specific, a plurality of the LEDs 4 are disposed in such a manner that the side surfaces 26 of a plurality of the LEDs 4 are spaced apart from each other at equal intervals in the front-rear and the right-left directions in plane view.

The back surfaces 22 of the LEDs 4 are disposed to be in contact with the top surface of the pressure-sensitive adhesive layer 3 so as to be opposed to the through holes 21 in the top-back direction and the back surfaces 22 of the LEDs 4 are attached to the pressure-sensitive adhesive layer 3 so that the bumps thereof (ref: the numeral 22 in FIG. 20) that are not shown in FIG. 2 are opposed to the support sheet 1. In this way, the back surfaces 22 of the LEDs 4 are supported at (pressure-sensitively adhere to) the top surface of the support board 2 via the pressure-sensitive adhesive layer 3 so that the alignment state of the LEDs 4 is retained.

Each of the LEDs 4 is disposed so that each of the corresponding through holes 21 is positioned at the center thereof.

A gap L1 between the LEDs 4 is, for example, 0.05 mm or more and 2 mm or less.

[LED Covering Step]

The LED covering step is a step of covering the top surfaces 23 of the LEDs 4 and the top-side portions of the side surfaces 26 thereof with the phosphor sheet 5 to produce the phosphor layer-covered LEDs 10, each of which includes the LED 4 and the phosphor sheet 5. The LED covering step includes the phosphor sheet disposing step (ref: FIG. 2 (c)) and the LED encapsulating step (ref: FIG. 2 (d)).

(Phosphor Sheet Disposing Step)

The phosphor sheet disposing step is a step of, after the LED disposing step, disposing the phosphor sheet 5 on the top-side portions of the LEDs 4 so as to partially cover the LEDs 4 and to allow the back surface 24 of the phosphor sheet 5 to serve as the exposed surface 27 that is positioned as described above. To be specific, the phosphor sheet 5 is, when projected in the top-back direction, disposed so as to cover at least the top surfaces 23 of the LEDs 4 and to allow the exposed surface 27 of the phosphor sheet 5 to have the top-side portion (the other side portion) that is positioned toward the top side with respect to the top surface of the support sheet 1.

In the upper side view in FIG. 2 (b), and in FIG. 2 (c), the phosphor sheet 5 is formed from a phosphor resin composition containing a curable resin and a phosphor.

Examples of the curable resin include a thermosetting resin that is cured by heating and an active energy ray curable resin that is cured by application of an active energy ray (for example, an ultraviolet ray and an electron beam). Preferably, a thermosetting resin is used.

To be specific, an example of the curable resin includes a thermosetting resin such as a silicone resin, an epoxy resin, a polyimide resin, a phenol resin, a urea resin, a melamine resin, and an unsaturated polyester resin. Preferably, a silicone resin is used.

An example of the silicone resin includes a silicone resin such as a two-step curable type silicone resin and a one-step curable type silicone resin. Preferably, a two-step curable type silicone resin is used.

The two-step curable type silicone resin is a thermosetting silicone resin that has a two-step reaction mechanism and in which a silicone resin is brought into a B-stage state (a semi-cured state) in the first-step reaction and is brought into a C-stage state (a completely cured state) in the second-step reaction. On the other hand, the one-step curable type silicone resin is a thermosetting silicone resin that has a one-step reaction mechanism and in which a silicone resin is completely cured in the first-step reaction.

The B-stage state is a state between an A-stage state in which a curable silicone resin is soluble in a solvent and a C-stage state in which the curable silicone resin is completely cured. Also, the B-stage state is a state in which the curing and the gelation of the curable silicone resin are slightly progressed, and in which the curable silicone resin swells in a solvent but is not completely dissolved therein and is softened but is not melted by heating.

An example of the two-step curable type silicone resin includes a condensation reaction and addition reaction curable type silicone resin that has two reaction systems of a condensation reaction and an addition reaction.

The mixing ratio of the curable resin with respect to the phosphor resin composition is, for example, 30 mass % or more, or preferably 50 mass % or more, and is, for example, 99 mass % or less, or preferably 95 mass % or less.

The phosphor has a wavelength conversion function and examples thereof include a yellow phosphor that is capable of converting blue light into yellow light and a red phosphor that is capable of converting blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_1O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Preferably, a yellow phosphor is used.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less.

The mixing ratio of the phosphor with respect to 100 parts by mass of the curable resin is, for example, 0.1 parts by mass or more, or preferably 0.5 parts by mass or more, and is, for example, 80 parts by mass or less, or preferably 50 parts by mass or less.

Furthermore, the phosphor resin composition can also contain a filler.

Examples of the filler include organic microparticles such as silicone particles and inorganic microparticles such as silica, talc, alumina, aluminum nitride, and silicon nitride. The mixing ratio of the filler with respect to 100 parts by mass of the curable resin is, for example, 0.1 parts by mass or more, or preferably 0.5 parts by mass or more, and is, for example, 70 parts by mass or less, or preferably 50 parts by mass or less.

As shown in FIG. 2 (c), in order to dispose the phosphor sheet 5 so as to cover a plurality of the LEDs 4 and to allow the back surface 24 of the phosphor sheet 5 to serve as the exposed surface 27 that is positioned as described above, first, as shown by the upper side view in FIG. 2 (b), the phosphor sheet 5 is prepared. In order to prepare the phosphor sheet 5, a curable resin and a phosphor, and a filler, which is blended as required, are blended to prepare a phosphor resin composition. Next, the phosphor resin composition is applied to the top surface of a release sheet 6 to be then heated.

When the curable resin contains a two-step curable type silicone resin, the curable resin is brought into a B-stage state (a semi-cured state) by the above-described heating. That is, the phosphor sheet 5 in a B-stage state is formed.

The phosphor sheet 5 has a compressive elastic modulus at 23° C. of, for example, 0.01 MPa or more, or preferably 0.04 MPa or more, and of, for example, 1.0 MPa or less, or preferably 0.5 MPa or less.

When the compressive elastic modulus of the phosphor sheet 5 is not less than the above-described lower limit, sufficient flexibility can be secured. On the other hand, when the compressive elastic modulus of the phosphor sheet 5 is not more than the above-described upper limit, excessive stress applied to the LED 4 is prevented and the LED 4 can be embedded.

The thickness T3 of the phosphor sheet 5, that is, the thickness (the maximum length in the top-back direction) of the phosphor sheet 5 before compressive bonding is, for example, 2 mm or less, or preferably 1 mm or less, and is, for example, 0.05 mm or more, or preferably 0.1 mm or more.

Next, as shown in FIG. 2 (c), the phosphor sheet 5 is disposed on the top-side portions of the LEDs 4 so as to partially cover a plurality of the LEDs 4 and to allow the back surface 24 of the phosphor sheet 5 to serve as the exposed surface 27 that is positioned as described above.

That is, the phosphor sheet 5 is disposed on the top-side portions of the LEDs 4 so as to cover the top-side portions of a plurality of the LEDs 4 and to allow the back surface 24 of the phosphor sheet 5 to serve as the exposed surface 27 that is positioned toward the top-side portion with respect to the top surface of the pressure-sensitive adhesive layer 3.

To be specific, in order to dispose the phosphor sheet 5 on the top-side portions of the LEDs 4, for example, the phosphor sheet 5 is compressively bonded to the top-side portions of a plurality of the LEDs 4. The compressive bonding is, for example, performed with a flat plate pressing device that is provided with two metal flat plates. In this way, the back-side portion of the phosphor sheet 5 is embedded in the top-side portions of the gaps between a plurality of the LEDs 4.

The compressive bonding of the phosphor sheet 5 with respect to the top-side portions of a plurality of the LEDs 4 is performed by controlling a pressure or a pushed-in amount of the phosphor sheet 5.

The pressure is appropriately set in accordance with the compressive elastic modulus at 23° C. of the phosphor sheet 5.

The pushed-in amount is controlled as follows: a spacer that is not shown and has a predetermined thickness is disposed in a generally frame shape in plane view on the top surface of the support sheet 1 so as to surround a plurality of the LEDs 4 and then, the resulting product is pressed or the amount of displacement of a pressing board in a flat plate pressing device in the top-back direction is adjusted. The thickness of the spacer is, for example, a length obtained by subtracting the embedded length T1 of the LED 4 from the thickness T0 of the LED 4.

The compressive bonding is performed under a reduced pressure atmosphere or under a normal pressure atmosphere. Preferably, in view of simplifying the process, the compressive bonding is performed under a normal pressure atmosphere.

The phosphor sheet 5 is placed on the top surfaces of a plurality of the LEDs 4 and thereafter, the phosphor sheet 5 is allowed to stand for a predetermined hour. Then, the phosphor sheet 5 slightly hangs toward the back side (one side in the top-back direction) based on the self-weight thereof and the flexibility (the low compressive elastic modulus) thereof, so that the phosphor sheet 5 can be also embedded in the top-side portions of the gaps between a plurality of the LEDs 4.

Of the phosphor sheet 5, portions, which are embedded in (sunk into) the top-side portions (the other side portions in the top-back direction) of the gaps between a plurality of the LEDs 4, are defined as entering portions 31. Each of the entering portions 31 is extruded from the top-side portion of the phosphor sheet 5 toward the back side into a generally rectangular shape in sectional view. The side surfaces of each of the entering portions 31 cover the top-side portions of the side surfaces 26 of each of the LEDs 4. On the other hand, the phosphor sheet 5 fails to cover and exposes the back-side portions of the side surfaces 26 (the opposing surfaces in which a plurality of the LEDs 4 are opposed to each other) of each of the LEDs 4. The thickness (the length in the top-back direction) of the entering portion 31 is the same as the embedded length T1 of the LED 4 described above.

By the compressive bonding of the phosphor sheet 5 with respect to the top-side portions of the LEDs 4, the top surface 25 of the phosphor sheet 5 retains its flat shape by the flat plate pressing and a portion in the phosphor sheet 5 that is overlapped with the LED 4 is, when projected in the top-back direction, moved outwardly in the plane direction, that is, moved to a portion that is not overlapped with the LED 4 to constitute the top-side portion that is positioned toward the top side with respect to the entering portion 31. Thus, the minimum thickness T5 of the phosphor layer 7 after compressive bonding is below the thickness T3 of the phosphor sheet 5 before compressive bonding, while the maximum thickness T4 of the phosphor layer 7 after compressive bonding is above the thickness T3 of the phosphor sheet 5 before compressive bonding.

In this way, a space 30, which is obtained by exposing the back-side portions of the gaps between a plurality of the LEDs 4 from the phosphor sheet 5, is formed, while the top surface 25 of each of the LEDs 4 and the top-side portions of the side surfaces 26 thereof are covered with the phosphor sheet 5.

The space 30 is a space defined by the side surfaces 26 of the back-side portions of a plurality of the LEDs 4, the top surface of the pressure-sensitive adhesive layer 3, and the back surface (the back surface of the entering portion 31) 24 of the phosphor sheet 5. The space 30 is a space that is communicated with each other in a plurality of the LEDs 4. To be specific, as referred in FIG. 3, the space 30 is, in plane view, formed into a generally grid shape (a generally checker-board shape) that is obtained by removing the shape of the LED 4 from the outer shape of the pressure-sensitive adhesive layer 3. In the space 30, a portion of the top surface of the pressure-sensitive adhesive layer 3 that is exposed from the LEDs 4 is not in contact with the back surface 24 of the phosphor sheet 5 and to be specific, is disposed at spaced intervals to the back surfaces 24 of the entering portions 31 in the top-back direction. The thickness of the space 30 is the same as the extruded length T2 of the LED 4.

Thereafter, as shown by the phantom lines in FIG. 2 (c), the release sheet 6 is peeled from the top surface 25 of the phosphor sheet 5.

(LED Encapsulating Step)

The LED encapsulating step is a step of curing the phosphor sheet 5 to encapsulate the top-side portions of the LEDs 4 by the phosphor sheet 5 that is flexible. The LED encapsulating step is performed after the phosphor sheet disposing step (ref: FIG. 2 (c)).

In the LED encapsulating step, as shown in FIG. 2 (d), the phosphor sheet 5 is cured. To be specific, the phosphor sheet 5 is heated at, for example, 80° C. or more, or preferably 100° C. or more, and at, for example, 200° C. or less, or preferably 180° C. or less.

When the curable resin contains a two-step curable type silicone resin and when the phosphor sheet 5 that embeds the LEDs 4 is in a B-stage state, the phosphor sheet 5 is completely cured to be brought into a C-stage state by the above-described heating.

When the curable resin contains a one-step curable type silicone resin, the phosphor sheet 5 that is made from the curable resin is completely cured to be brought into a C-stage state by the above-described heating.

When the curable resin is an active energy ray curable resin, an active energy ray is applied to the phosphor sheet 5 from the top side.

The cured (completely cured) phosphor sheet 5 has flexibility. To be specific, the cured (completely cured) phosphor sheet 5 has a compressive elastic modulus at 23° C. of, for example, 0.5 MPa or more, or preferably 1 MPa or more, and of, for example, 100 MPa or less, or preferably 10 MPa or less.

When the compressive elastic modulus of the phosphor sheet 5 is not more than the above-described upper limit, the flexibility can be surely secured and in the cutting step (ref: FIG. 2 (d)) to be described next, for example, the phosphor sheet 5 can be cut using a cutting device (described later). When the compressive elastic modulus of the phosphor sheet 5 is not less than the above-described lower limit, the shape thereof after being cut can be retained.

In this way, the top-side portions of the side surfaces 26 of the LEDs 4 and the top surfaces 23 thereof are covered with the phosphor sheet 5 in close contact with each other. That is, the top-side portions of the LEDs 4 are encapsulated by the phosphor sheet 5 in a C-stage state.

In this way, at the top side of the support sheet 1 before the cutting step, as one example of an encapsulating sheet-covered semiconductor element, the phosphor sheet-covered LEDs 10', which include a plurality of the LEDs 4 and the phosphor sheet 5 that collectively covers and encapsulates the top-side portions of a plurality of the LEDs 4, are obtained. The phosphor sheet-covered LEDs 10' are obtained in a state where the back surfaces 22 of a plurality of the LEDs 4 are in close contact with the support sheet 1. In the phosphor sheet-covered LEDs 10', the back surface 24 of the phosphor sheet 5 serves, when projected in the plane direction, as the exposed surface 27 that is positioned toward the top side (the other side in the top-back direction) with respect to the back surfaces 22 of a plurality of the LEDs 4.

[Cutting Step]

The cutting step is a step of, after the LED encapsulating step, cutting the phosphor sheet 5 corresponding to each of a plurality of the LEDs 4 to produce the phosphor layer-covered LED 10 that includes one LED 4 from the phosphor sheet-covered LEDs 10' that include a plurality of the LEDs 4. As shown by the dashed lines in FIG. 2 (d), in the cutting step, the flexible phosphor sheet 5 around a plurality of the LEDs 4 is cut along the top-back direction. As shown by dash-dot lines in FIG. 3, for example, the phosphor sheet 5 is cut into a generally rectangular shape in plane view that surrounds each of the LEDs 4.

In order to cut the phosphor sheet 5, for example, a cutting device is used. Examples thereof include a dicing device using a disc-shaped dicing saw (dicing blade), a cutting device using a cutter, and a laser irradiation device.

The cutting of the phosphor sheet 5 is performed with the reference marks 18 as a reference. To be specific, the phosphor sheet 5 is cut so as to form cuts 8 along the straight lines (shown by the dash-dot lines in FIG. 3) that connect the reference marks 18 making one pair.

In the cutting of the phosphor sheet 5, for example, the phosphor sheet 5 is cut from the top side toward the back side so that the cuts 8 fail to pass through the support sheet 1, to be specific, fail to pass through the pressure-sensitive adhesive layer 3.

By the cutting step, the phosphor layer-covered LEDs 10, each of which includes one LED 4 and the phosphor layer 7 that is formed of the phosphor sheet 5 covering the top-side portion of the LED 4, are obtained in a state where the LEDs 4 are in close contact with the support sheet 1. That is, the phosphor sheet-covered LEDs 10' that include a plurality of the LEDs 4 are singulated so as to correspond to each of a plurality of the LEDs 4, so that the phosphor layer-covered LEDs 10, each of which includes one LED 4, are produced.

[LED Peeling Step]

As shown in FIG. 2 (e), the LED peeling step is a step of peeling each of the phosphor layer-covered LEDs 10 from the pressure-sensitive adhesive layer 3. As shown in FIG. 2 (e'), in the LED peeling step, using a pick-up device 17 that is provided with the pressing member 14 such as a needle and an absorbing member 16 such as a collet, the pressure-sensitive adhesive layer 3 is pressed by the pressing member 14 via the through hole 21, so that each of the phosphor layer-covered LEDs 10 is peeled from the support board 2 and the pressure-sensitive adhesive layer 3.

To be specific, first, the support sheet 1 is placed in the pick-up device 17. Then, the pressing member 14 is disposed from the back side in opposed relation to the through hole 21 corresponding to the phosphor layer-covered LED 10 that is intended to be peeled off.

Then, the pressing member 14 is inserted into the through hole 21 from the back side.

Then, the pressure-sensitive adhesive layer 3 corresponding to the through hole 21 is pressed relatively toward the top side with respect to the support board 2 and the pressure-sensitive adhesive layer 3 is pushed up along with the phosphor layer-covered LED 10.

The pushed-up phosphor layer-covered LED 10 is absorbed by the absorbing member 16.

The phosphor layer-covered LED 10 is absorbed by the absorbing member 16 and is further moved relatively toward the top side with respect to the support board 2. Thereafter, the phosphor layer-covered LED 10 is peeled from the pressure-sensitive adhesive layer 3.

Before the LED peeling step, the pressure-sensitive adhesive force of the pressure-sensitive adhesive layer 3 is reduced by application of ultraviolet ray, a chemical solution, or heating as required and then, each of the phosphor layer-covered LEDs 10 can be also easily peeled off.

In the LED peeling step, the phosphor layer 7 is not in contact with the pressure-sensitive adhesive layer 3 and the LED 4 only is in contact with the pressure-sensitive adhesive layer 3, so that each of the phosphor layer-covered LEDs 10 can be easily peeled from the pressure-sensitive adhesive layer 3.

In this way, as shown in FIG. 2 (e), each of the phosphor layer-covered LEDs 10 that is peeled from the support sheet 1 is obtained.

[Mounting Step]

The mounting step is a step of, after the LED peeling step, mounting the phosphor layer-covered LED 10 on the board 9. In the mounting step, after the phosphor layer-covered LED 10 is selected in accordance with emission wavelength and luminous efficiency, as shown in FIG. 2 (f), the selected phosphor layer-covered LED 10 is mounted on the board 9. In this way, the LED device 15 as a semiconductor device is obtained.

To be specific, the phosphor layer-covered LED 10 is disposed in opposed relation to the board 9 so that a bump (ref: the numeral 22 in FIG. 20) that is provided on the back surface 22 of the LED 4 is opposed to a terminal (not shown) that is provided on the top surface of the board 9. That is, the LED 4 in the phosphor layer-covered LED 10 is flip-chip mounted on the board 9.

In this way, the LED device 15 including the board 9 and the phosphor layer-covered LED 10 that is mounted on the board 9 is obtained. In the LED device 15, the exposed surface 27 of the phosphor layer 7 and the board 9 are disposed at spaced intervals to each other in the top-back direction. That is, the exposed surface 27 of the phosphor layer 7 is, when projected in the plane direction, positioned toward the top side (the other side in the top-back direction) with respect to the top surface of the board 9.

Thereafter, as shown by the phantom line in FIG. 2 (f), an encapsulating protective layer 20 (an encapsulating layer that is different from the phosphor layer 7) that encapsulates the phosphor layer-covered LED 10 can be provided in the LED device 15 as required. In this way, the reliability of the LED device 15 can be improved.

In the phosphor layer-covered LED 10 and the phosphor sheet-covered LED 10', the exposed surface 27 of the phosphor sheet 5 is positioned toward the top side with respect to the back surface 22 of the LED 4, so that the generation of a void in the phosphor sheet 5 is suppressed, compared to a case where the exposed surface 27 of the phosphor sheet 5 is positioned at the same position as the back surface 22 of the LED 4.

Thus, the phosphor layer-covered LED 10 and the phosphor sheet-covered LED 10' have excellent reliability.

In the phosphor layer-covered LED 10 and the phosphor sheet-covered LED 10', the entire exposed surface 27 is the top-side portion (the other side portion) that is positioned toward the top side (the other side in the top-back direction) with respect to the back surface 22 of the LED 4, so that the generation of a void is further capable of being suppressed.

The LED 4 is covered with the phosphor sheet 5 containing a phosphor, so that a wavelength of light emitted from the LED 4, to be specific, light emitted from a luminous layer (not shown) that forms at least the top surface 23 of the LED 4 is converted by the phosphor layer 7 and thus, light having high energy is capable of being emitted.

In the phosphor sheet-covered LED 10' and the LED device 15 mounted with the phosphor sheet-covered LED 10', the properties are capable of being improved by a plurality of the LEDs 4. To be specific, the luminous strength is capable of being improved by light emission of a plurality of the LEDs 4.

Accordingly, the LED device 15 includes the phosphor layer-covered LED 10 in which the generation of a void in the phosphor sheet 5 is suppressed, so that it has excellent reliability.

The above-described method for producing the phosphor layer-covered LED 10 includes the phosphor sheet disposing step in which the phosphor sheet 5 including the exposed surface 27 that is, when projected in the top-back direction, not included in the back surface 22 of the LED 4 and exposed from the back surface 22 of the LED 4 is disposed so as to cover at least the top surface 23 of the LED 4 and to allow the exposed surface 27 of the phosphor sheet 5 to serve as the top-side portion (the other side portion) that is positioned toward the top side (the other side in the top-back direction) with respect to the top surface of the support sheet 1. Thus, compared to a case where the entire exposed surface 27 that is exposed from the LED 4 in the phosphor sheet 5 is positioned at the same position as the top surface of the support sheet 1, that is, compared to a case where the entire exposed surface 27 of the phosphor sheet 5 is in contact with the top surface of the support sheet 1, the contact is less and thus, the generation of a void in the phosphor sheet 5 caused by the contact of the phosphor sheet 5 with the support sheet 1 is further capable of being suppressed.

In this method, when the phosphor sheet disposing step is performed under a normal pressure atmosphere, the phosphor sheet disposing step can be simplified, compared to a case where the phosphor sheet disposing step is performed under a reduced pressure atmosphere.

In the method for producing the LED device 15, the phosphor layer-covered LED 10 is prepared by the method for producing the phosphor layer-covered LED 10 including the simplified phosphor sheet disposing step, so that the LED device 15 is capable of being obtained by easy steps.

Furthermore, in the above-described phosphor layer-covered LEDs 10, the phosphor sheet 5 is disposed so as to partially cover a plurality of the LEDs 4 and to form the space 30 over the LEDs 4 that are adjacent to each other. Thus, when the phosphor sheet 5 is brought into contact with (compressively bonded to) a plurality of the LEDs 4, the stress applied from the phosphor sheet 5 to a plurality of the LEDs 4 can be released to the space 30. Therefore, the stress in the plane direction applied from the phosphor sheet 5 to a plurality of the LEDs 4 can be reduced. As a result, the phosphor layer-covered LED 10 in which a shift of position of the LED 4, that is, the LED 4 is shifted in the plane direction is suppressed is capable of being produced.

By exposing the side surfaces 26 of the back-side portions of the LEDs 4 that are opposed to each other, the above-described space 30 is capable of being surely formed.

The phosphor sheet 5 containing a phosphor is brought into contact with the top-side portions of the LEDs 4, so that a wavelength of light emitted from the LED 4 is converted by the phosphor layer 7 and thus, light having high energy is capable of being emitted.

In the phosphor layer-covered LED 10, a shift of position of the LED 4 is suppressed, so that unevenness in size is suppressed. Thus, stable optical properties, to be specific, stable brightness, stable chromaticity, stable degree of orientation, and the like are capable of being ensured.

The method for producing the LED device 15 includes a step of preparing the phosphor layer-covered LED 10 in which stable optical properties are ensured, so that the LED device 15 having stable optical properties is capable of being produced.

In the LED device 15, a shift of position of the LED 4 is suppressed, so that unevenness in size is suppressed. Thus, the LED device 15 is capable of ensuring stable brightness, stable chromaticity, stable degree of orientation, and the like.

According to the above-described method for producing the phosphor layer-covered LED 10, in the support sheet preparing step, the hard support board 2 in which the through holes 21 are formed in advance is prepared and in the LED peeling step, using the above-described pick-up device 17, the pressing member 14 is inserted into the through hole 21 in the support board 2 to press the pressure-sensitive adhesive layer 3, so that each of the phosphor layer-covered LEDs 10 is peeled from the pressure-sensitive adhesive layer 3.

Thus, each of the LEDs 4 can be peeled from the pressure-sensitive adhesive layer 3 without requiring a step in which the pressure-sensitive adhesive force of the pressure-sensitive adhesive layer 3 is reduced before the LED peeling step.

As a result, the number of steps required for the production of the phosphor layer-covered LED 10 can be reduced.

Also, a material for forming the pressure-sensitive adhesive layer 3 can be widely selected in addition to materials in which the pressure-sensitive adhesive force is capable of being reduced by application of ultraviolet ray, a chemical solution, or heating.

As a result, the freedom in process planning can be improved.

On the other hand, the method for producing the phosphor layer-covered LED 10 includes the cutting step and after the cutting step, each of the phosphor layer-covered LEDs 10 is peeled from the support sheet 1. That is, in the cutting step, the phosphor sheet 5 is capable of being cut, while the LEDs 4 and the phosphor sheet 5 are supported by the support sheet 1 including the hard support board 2. Thus, the phosphor layer-covered LED 10 having excellent size stability can be obtained.

The LED device 15 includes the phosphor layer-covered LED 10 having excellent size stability, so that it has excellent reliability and thus, its luminous efficiency is improved.

After the LED encapsulating step in which the phosphor sheet 5 is cured, the cutting step in which the phosphor sheet 5 is cut is performed, so that a dimensional deviation caused by shrinkage of the phosphor sheet 5 that may occur in the curing can be cancelled in the cutting step. Thus, the phosphor layer-covered LED 10 having further excellent size stability can be obtained.

In addition, the phosphor sheet 5 that encapsulates the top-side portions of the LEDs 4 is flexible, so that in the cutting step, the phosphor sheet 5 is capable of being smoothly cut not only using an expensive dicing device, but also using various cutting devices including a relatively cheap cutting device.

In addition, in the phosphor sheet disposing step in this method, the top-side portions of the LEDs 4 are embedded by the phosphor sheet 5 in a B-stage state; in the LED encapsulating step, the phosphor sheet 5 is cured to be brought into a C-stage state; and the phosphor sheet 5 in a C-stage state encapsulates the top-side portions of the LEDs 4. Thus, the top-side portions of the LEDs 4 are easily and surely covered with the phosphor sheet 5 in a B-stage state and the phosphor sheet 5 in a C-stage state is capable of surely encapsulating the top-side portions of the LEDs 4.

Consequently, the phosphor layer-covered LED 10 has excellent size stability.

In the phosphor layer-covered LED 10, the number of steps required for the production thereof is reduced, so that its cost can be reduced.

The LED device 15 includes the above-described phosphor layer-covered LED 10, so that its cost can be reduced.

In the support sheet preparing step in this method, the support sheet 1 is prepared so that the reference marks 18, which serve as a reference of cutting in the cutting step, are provided in advance.

On the other hand, in the method described in Japanese Unexamined Patent Publication No. 2001-308116 in which dummy wafers are peeled from a silica glass substrate or a pressure-sensitive adhesive sheet to be then subjected to dicing, the dummy wafers are not at the top side of the silica glass substrate when subjected to dicing and thus, the dicing is not capable of being performed with the above-described reference marks 18 as a reference.

In contrast, in the above-described method, the LEDs 4 are supported by the support sheet 1 in the cutting step, so that in this way, the LEDs 4 can be singulated with excellent accuracy with the reference marks 18 as a reference.

Modified Example

In the second embodiment, first, in the cutting step, as shown by the dashed lines in FIG. 2 (d), the phosphor sheet-covered LEDs 10', which include a plurality of the LEDs 4 and the phosphor sheet 5 that covers the top-side portions of a plurality of the LEDs 4, are singulated into each of a plurality of the phosphor layer-covered LEDs 10. Next, in the LED peeling step, as shown in FIG. 2 (e), each of a plurality of the phosphor layer-covered LEDs 10 is peeled from the pressure-sensitive adhesive layer 3. Alternatively, as shown in FIG. 4, in the cutting step, the phosphor sheet-covered LEDs 10' are not cut and singulated and in the LED peeling step, a plurality of the LEDs 4, along with the phosphor sheet 5, in the phosphor sheet-covered LEDs 10' can be peeled from the pressure-sensitive adhesive layer 3.

Figure 4:
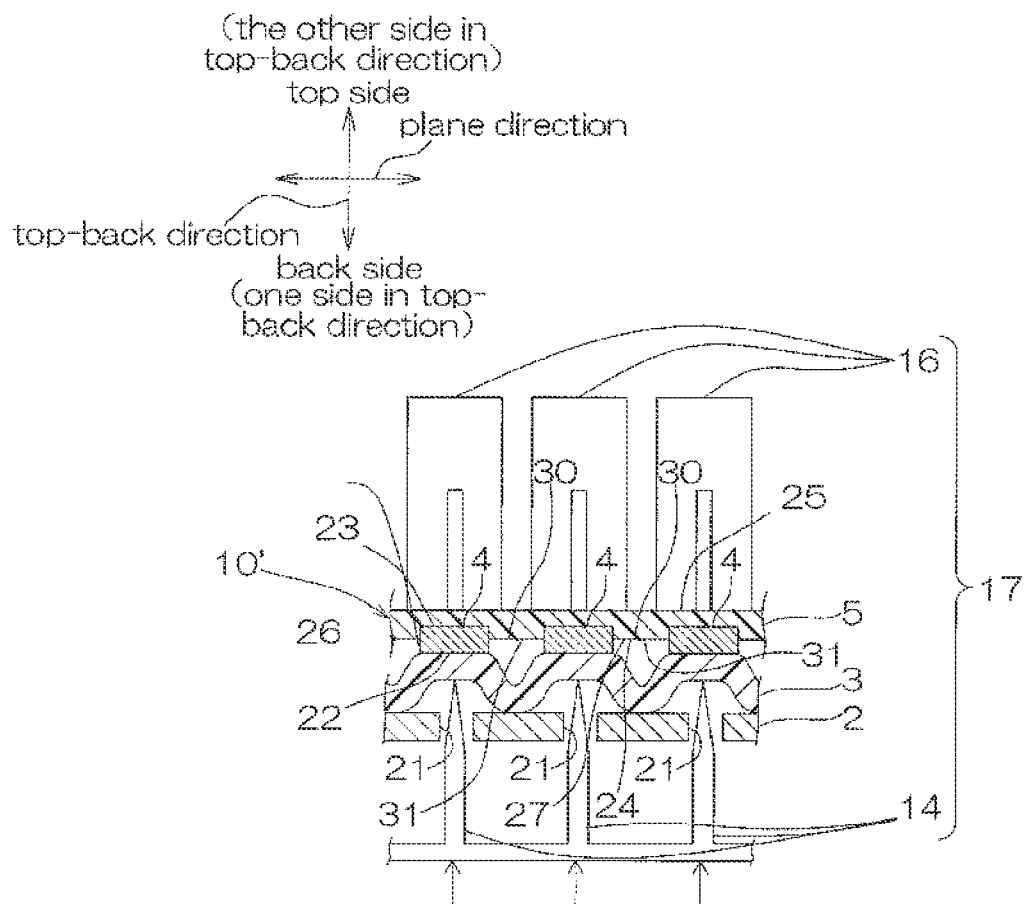
FIG. 4 shows a modified example of the LED peeling step shown in FIGS. 2 (e) and 2 (e') and shows a modified example of peeling a plurality of phosphor layer-covered LEDs that are not singulated.

In such a case, as shown in FIG. 4, the pick-up device 17 is provided with a plurality of the pressing members 14 and a plurality of the absorbing members 16 corresponding to a plurality of the LEDs 4. A plurality of the pressing members 14 move relative to one another in the top-back direction at the same time.

In order to peel a plurality of the LEDs 4, first, the phosphor sheet-covered LEDs 10' that include a plurality of the LEDs 4 are placed in the pick-up device 17 and each of a plurality of the pressing members 14 is disposed from the back side in opposed relation to each of a plurality of the through holes 21.

A plurality of the pressing members 14 are simultaneously inserted into a plurality of the through holes 21 from the back side.

Then, the entire pressure-sensitive adhesive layer 3 is pressed relatively toward the top side with respect to the support board 2 and the entire pressure-sensitive adhesive layer 3 is pushed up along with a plurality of the LEDs 4 and the phosphor sheet 5.

The pushed-up plurality of the LEDs 4 and phosphor sheet 5 are absorbed by a plurality of the absorbing members 16.

A plurality of the LEDs 4 and the phosphor sheet 5 are absorbed by a plurality of the absorbing members 16 and are further moved relatively toward the top side with respect to the support board 2. Thereafter, a plurality of the LEDs 4 and the phosphor sheet 5 are peeled from the pressure-sensitive adhesive layer 3.

In this way, the phosphor sheet-covered LEDs 10', which include a plurality of the LEDs 4 and the phosphor sheet 5 that covers the top-side portions of a plurality of the LEDs 4, are obtained.

On the other hand, in the embodiments in FIGS. 2 and 3, as shown in FIG. 2 (b), in the LED disposing step, a plurality of the LEDs 4 are disposed on the support sheet 1; in the LED covering step, as shown in FIGS. 2 (c) and 2 (d), the phosphor sheet-covered LEDs 10' are fabricated; and thereafter, in the cutting step, as shown by the dashed lines in FIG. 2 (d), the phosphor sheet-covered LEDs 10' are cut and singulated to produce each of the phosphor layer-covered LEDs 10. Alternatively, for example, as shown in FIGS. 5 and 6, the support sheet 1 having a desired size is prepared in advance; next, one piece of the LED 4 is disposed on the support sheet 1; subsequently, the phosphor sheet 5 is disposed on the top-side portion of the LED 4; and thereafter, the phosphor layer-covered LED 10 is peeled from the support sheet 1 without performing the cutting step (ref: the dashed lines in FIG. 2 (d)), so that the phosphor layer-covered LED 10 can be also produced.

That is, as shown in FIGS. 5 (a) to 5 (e), this embodiment includes a support sheet preparing step (ref: FIG. 5 (a)), an LED disposing step (ref: FIG. 5 (b)), an LED covering step (ref: FIGS. 5 (c) and 5 (d)), and an LED peeling step (ref: FIGS. 5 (e) and 5 (e')). On the other hand, this embodiment does not include a cutting step (ref: the dashed lines in FIG. 2 (d)).

In the support sheet preparing step, as shown in FIGS. 5 (a) and 6, the support sheet 1 is trimmed into a size that is capable of supporting one piece of the LED 4 in advance to be prepared. The support sheet 1 is formed into a generally rectangular shape in plane view that includes the through hole 21 but is not formed with the reference mark 18.

In the LED disposing step, as shown in FIG. 5 (b), one piece of the LED 4 is prepared to be disposed on the pressure-sensitive adhesive layer 3.

In the phosphor sheet disposing step in the LED covering step, as shown in FIG. 5 (c), the phosphor sheet 5 is trimmed into a shape and size corresponding to the phosphor layer 7 (ref: FIG. 5 (d)) in the phosphor layer-covered LED 10 in advance to be prepared. The phosphor sheet 5 is disposed on the top-side portion of the LED 4 so as to cover the top-side portion of the LED 4 and to allow the back surface 24 of the phosphor sheet 5 to serve as the exposed surface 27 that is positioned as described above. Thereafter, as shown in FIG. 5 (d), in the LED encapsulating step, the top-side portion of the LED 4 is encapsulated by the phosphor layer 7 that is obtained by curing the phosphor sheet 5, so that the phosphor layer-covered LED 10 that includes one piece of the LED 4 is produced.

Thereafter, in the LED peeling step, as shown in FIG. 5 (e), the phosphor layer-covered LED 10 is peeled from the pressure-sensitive adhesive layer 3 without performing the cutting step (ref: the dashed lines in FIG. 2 (d)).

As shown in FIG. 5 (f), the phosphor layer-covered LED 10 obtained in this way is mounted on the board 9, so that the LED device 15 is obtained.

In the phosphor layer-covered LED 10 and the LED device 15 including the phosphor layer-covered LED 10, the same function and effect as those of the phosphor layer-covered LED 10 (ref: FIG. 2 (e)) and the LED device 15 (ref: FIG. 2 (f)), which are obtained via the above-described cutting step (ref: the dashed lines in FIG. 2 (d)), can be achieved. Furthermore, according to the above-described producing method, the cutting step (ref: the dashed lines in FIG. 2 (d)) is not performed and thus, the steps can be simplified.

Figure 7:
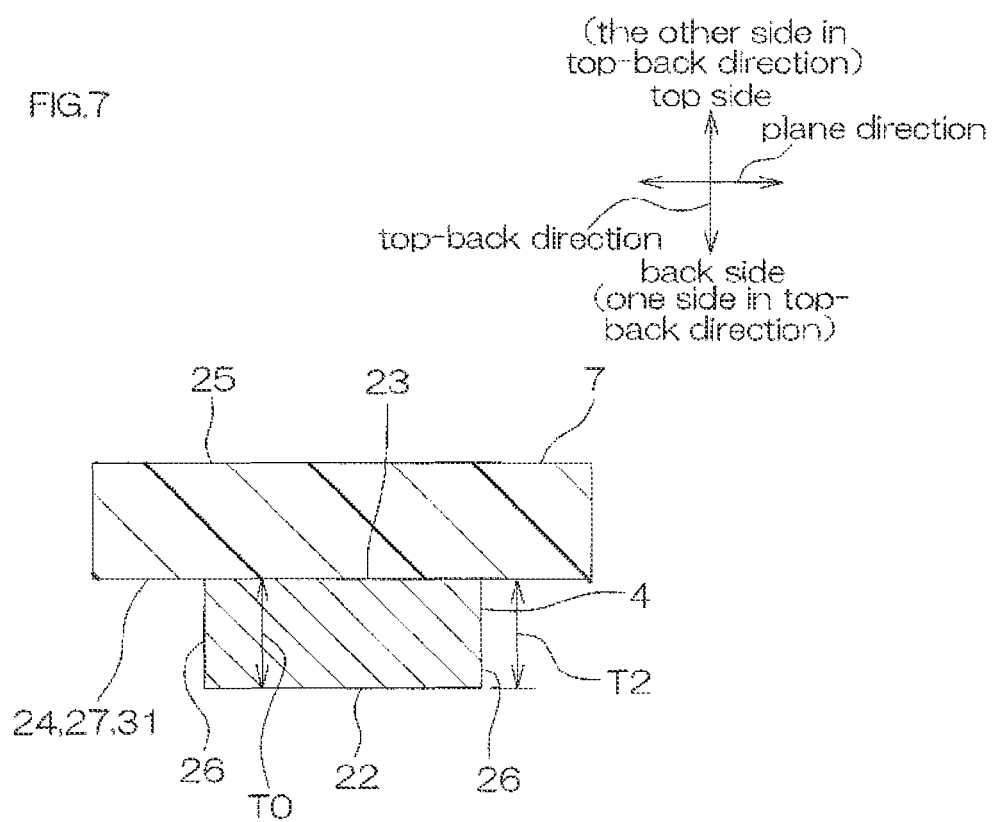
FIG. 7 shows a sectional view of a modified example of the phosphor layer-covered LED in the first embodiment.
Figure 10A:
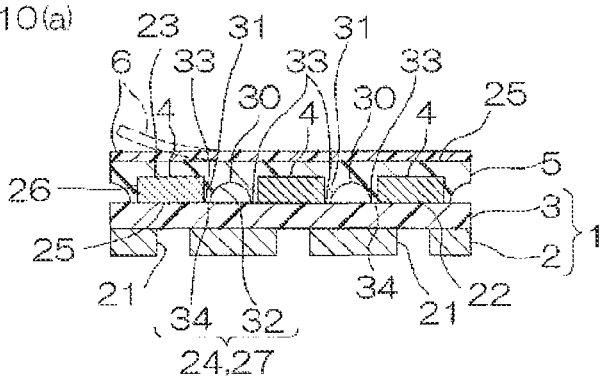
FIG. 10 shows process drawings for illustrating a modified example of the method for producing a phosphor layer-covered LED and the method for producing an LED device shown in FIG. 9.
Figure 10B:
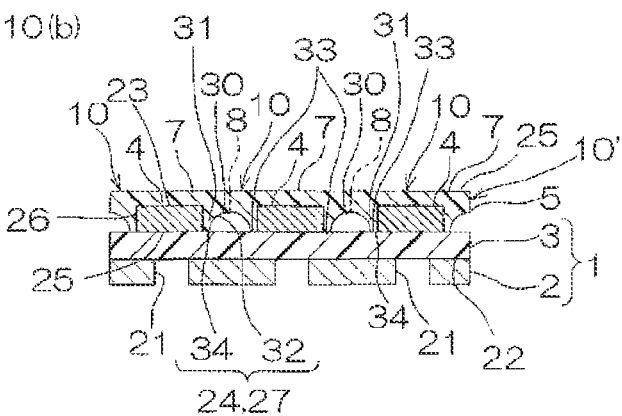
Figure 10C:
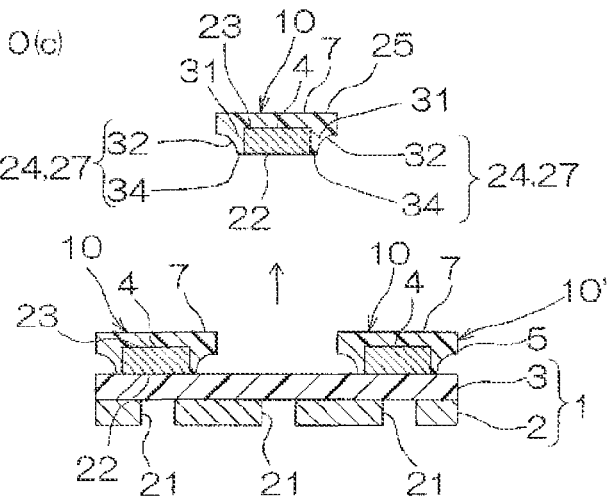
Figure 10D:
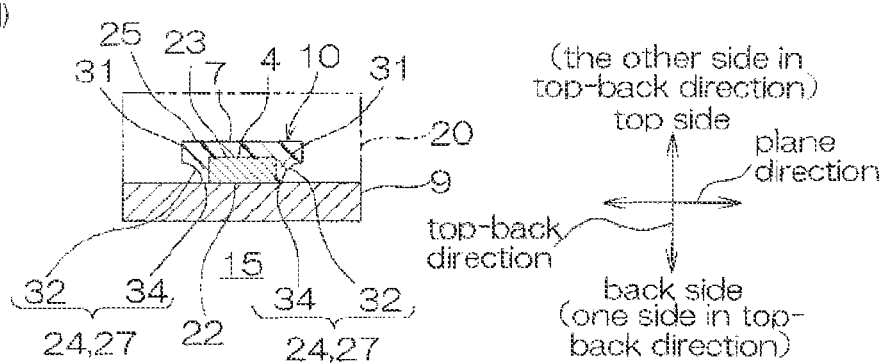

In the embodiment in FIG. 1, at the back surface 24 of the phosphor layer 7, the exposed surface 27 that is exposed from the LED 4 is, when projected in the plane direction, disposed at the center in the top-back direction of the LED 4. Alternatively, for example, as shown in FIG. 7, the exposed surface 27 can be also disposed on the top surface 23 of the LED 4.

In such a case, the phosphor layer 7 covers the top surface 23 only of the LED 4 and exposes all of the side surfaces 26 (the entire side surfaces). That is, the phosphor layer 7 is formed so that the back surface 24 thereof is positioned at the same plane surface as the top surface 23 of the LED 4. That is, the phosphor layer 7 is formed so that the back surface 24 of the phosphor sheet 5 and the top surface 23 of the LED 4 form the same plane surface that is parallel to the back surface 22 of the LED 4.

As shown in FIG. 8 (*a*), in order to obtain the phosphor layer-covered LED 10, the phosphor sheet 5 is placed on the top surfaces 23 of a plurality of the LEDs 4 so as not to form the entering portion 31. To be specific, the compressive elastic modulus is set so that the phosphor sheet 5 is not compressively bonded and in the phosphor sheet 5, the entering portion 31 is not formed based on the self-weight thereof. In such a case, the phosphor sheet 5 has a compressive elastic modulus at 23° C. of, for example, 0.02 MPa or more, or preferably, 0.05 MPa or more, and of, for example, 1.0 MPa or less, or preferably 0.5 MPa or less.

Subsequently, as shown in FIG. 8 (*b*), the phosphor sheet 5 is cured. In this way, the top surfaces 23 of the LEDs 4 are covered with the phosphor sheet 5 in close contact with each other. That is, the top surfaces 23 of the LEDs 4 are encapsulated by the phosphor sheet 5 in a C-stage state.

Thereafter, the cutting step (ref: the dashed lines in FIG. 8 (*b*)), the LED peeling step (ref: FIG. 8 (*c*)), and the mounting step (ref: FIG. 8 (*d*)) are sequentially performed.

In the embodiments in FIGS. 7 and 8, the same function and effect as those of the embodiments in FIGS. 1 and 2 can be achieved. Furthermore, compared to the embodiments in FIGS. 1 and 2, a step of forming the entering portion 31 can be omitted and thus, the steps can be simplified. In addition, in the embodiments in FIGS. 7 and 8, the length T2 in the top-back direction between the back surface 22 of the LED 4 and the exposed surface 27 of the phosphor layer 7 is the same as the thickness T0 of the LED 4, so that a sufficient length can be ensured. Thus, the contact of the entire back surface 24 of the phosphor layer 7 with the top surface 23 of the LED 4 is capable of being further prevented and thus, the generation of a void in the phosphor layer 7 is capable of being further suppressed.

In the embodiments in FIGS. 7 and 8, preferably, the LED 4 having a luminous layer (not shown) that forms the top surface 23 only is used.

On the other hand, in the embodiments in FIGS. 1 and 2, the top-side portions of the side surfaces 26 of the LEDs 4 are encapsulated by the entering portions 31, so that the LED 4 having a luminous layer (not shown) that forms the top surface 23 and the side surface 26 can be used.

In the embodiment in FIG. 1, the entire exposed surface 27 of the phosphor layer 7 is defined as the top-side portion (the other side portion in the top-back direction) that is positioned toward the top side with respect to the back surface 22 of the LED 4. Alternatively, for example, as shown in FIG. 9, a portion of the exposed surface 27 can be defined as a top-side portion 32.

In such a case, as shown in FIG. 9, the phosphor layer 7 covers all of the side surfaces 26 (the entire side surfaces 26) of the LED 4. That is, the exposed surface 27 of the phosphor layer 7 is formed on the same plane surface as the back surface 22 of the LED 4. The exposed surface 27 has a contact surface 34 that extends outwardly from the back surface 22 of the LED 4 so as to be in contact with the support sheet 1 (ref: FIGS. 10 (*a*) and 10 (*b*)) and the board 9 (ref: FIG. 10 (*d*)) and a curved surface 32 (the top-side portion), as the top-side portion (the other side portion), that is continuous to the contact surface 34 and is, when projected in the plane direction, formed into a curved shape at spaced intervals with respect to the back surface 22 of the LED 4 at the top side thereof.

A width L3 of the contact surface 34 is, for example, 0.01 mm or more, or preferably 0.02 mm or more, and is, for example, 0.5 mm or less, or preferably 0.3 mm or less. A width (the minimum distance in the plane direction) L4 of the curved surface 32 is, for example, 0.01 mm or more, or preferably 0.02 mm or more, and is, for example, 1 mm or less, or preferably 0.5 mm or less. When the width L3 is not less than the above-described lower limit, the generation of a minute void (a length of 1 to 10 μm) can be suppressed.

In this method, after the phosphor sheet disposing step (ref: FIG. 10 (*a*)), the LED encapsulating step (ref: FIG. 10 (*b*)), the cutting step (ref: the dashed lines in FIG. 10 (*b*)), the LED peeling step (ref: FIG. 10 (*c*)), and the mounting step (ref: FIG. 10 (*d*)) are sequentially performed.

In the phosphor sheet disposing step in the LED encapsulating step, as shown in FIG. 10 (*a*), the phosphor sheet 5 is disposed on the LEDs 4 so that the back surface 24 of the phosphor sheet 5 has the contact surface 34 that is in contact with the top surface of the pressure-sensitive adhesive layer 3 and the curved surface 32.

In the mounting step, as shown in FIG. 10 (*d*), the contact surface 34 of the phosphor layer 7 is in contact with the top surface of the board 9.

In the embodiments in FIGS. 9 and 10, the same function and effect as those of the embodiments in FIGS. 1 and 2 can be achieved. Furthermore, compared to the embodiments in FIGS. 1 and 2, the entire side surfaces 26 of the LED 4 are encapsulated by the phosphor sheet 5, so that the durability of the LED 4 and the luminous efficiency of the LED device 15 can be improved. In addition, the LED 4 having a luminous layer (not shown) on the entire top surface 23 and the entire side surface 26 can be preferably used.

In FIGS. 3 and 6, each of the through holes 21 is formed into a circular shape in plane view. However, the shape thereof is not particularly limited and can be formed into an appropriate shape such as a generally rectangular shape in plane view or a generally polygonal shape in plane view including a generally triangular shape in plane view.

In FIG. 3, each of the reference marks 18 is formed into a generally triangular shape in plane view. However, the shape thereof is not particularly limited and can be formed into an appropriate shape such as a generally circular shape in plane view, a generally rectangular shape in plane view, a generally X-shape in plane view, and a generally T-shape in plane view.

In the first embodiment, the LED 4, the phosphor layer-covered LED 10 (the phosphor sheet-covered LED 10'), and the LED device 15 are described as one example of the semiconductor element, the encapsulating sheet-covered semiconductor element, and the semiconductor device of the present invention, respectively. Alternatively, for example, the semiconductor element, the encapsulating sheet-covered semiconductor element, and the semiconductor device of the present invention can also include an optical semiconductor element, a phosphor sheet-covered optical semiconductor element, and an optical semiconductor device, respectively. To be specific, the optical semiconductor element, the phosphor sheet-covered optical semiconductor element, and the optical semiconductor device can include an LD (laser diode) 4, a phosphor layer-covered LD 10 (a phosphor sheet-covered LD 10'), and a laser diode device 7, respectively.

Furthermore, the LED 4, the phosphor sheet 5 (the phosphor layer 7), the phosphor layer-covered LED 10 (the phosphor sheet-covered LED 10'), and the LED device 15 are described as one example of the semiconductor element, the encapsulating sheet, the encapsulating sheet-covered semiconductor element, and the semiconductor device of the present invention, respectively. Alternatively, for example, though not shown, the semiconductor element, the encapsulating sheet, the encapsulating sheet-covered semiconductor element, and the semiconductor device of the present invention can also include an electronic element, an encapsulating sheet (an encapsulating layer), an encapsulating layer-covered electronic element (an encapsulating sheet-covered electronic element), and an electronic device, respectively.

The electronic element is a semiconductor element that converts electrical energy to energy other than electricity, to be specific, to signal energy or the like. To be specific, examples thereof include a transistor and a diode. The size of the electronic element is appropriately selected in accordance with its use and purpose.

The encapsulating sheet is formed from an encapsulating resin composition that contains a curable resin as an essential component and a filler as an optional component. An example of the filler further includes a black pigment such as carbon black. The mixing ratio of the filler with respect to 100 parts by mass of the curable resin is, for example, 5 parts by mass or more, or preferably 10 parts by mass or more, and is, for example, 99 parts by mass or less, or preferably 95 parts by mass or less.

The properties other than light transmission properties (to be specific, compressive elastic modulus and the like) of the encapsulating sheet are the same as those of the phosphor sheet 5 in the first embodiment.

As referred by the dashed lines in FIG. 2 (*d*), the encapsulating sheet is cut and the encapsulating layer is formed as a protective layer that covers the top surface of each of the electronic elements and the top-side portions of the side surfaces thereof.

Second Embodiment

In FIGS. 11 and 12, the same reference numerals are provided for members and steps corresponding to each of those in the first embodiment, and their detailed description is omitted.

In the first embodiment, the through holes 21 are provided in the support board 2. Alternatively, for example, as shown in FIGS. 11 (*a*) and 12, the support board 2 can be formed into a flat plate shape having no through hole 21.

As shown in FIGS. 11 (*a*) to 11 (*e*), the method for producing the phosphor layer-covered LED 10 in the second embodiment includes a support sheet preparing step of preparing the support sheet 1 (ref: FIG. 11 (*a*)); an LED disposing step of disposing the LEDs 4 on the top side of the support sheet 1 (ref: FIG. 11 (*b*)); a phosphor sheet disposing step of, after the LED disposing step, disposing the phosphor sheet 5 on the top-side portions of the LEDs 4 so as to partially cover the LEDs 4 and to allow the back surface 24 of the phosphor sheet 5 to serve as the exposed surface 27 that is positioned as described above (ref: FIG. 11 (*c*)); an LED encapsulating step of curing the phosphor sheet 5 to encapsulate the top-side portions of the LEDs 4 by the phosphor sheet 5 (ref: FIG. 11 (*d*)); a cutting step of after the LED encapsulating step, cutting the phosphor sheet 5 corresponding to each of the LEDs 4 to produce the phosphor layer-covered LEDs 10 (ref: the dashed lines in FIG. 11 (*d*)); and an LED peeling step of, after the cutting step, peeling the phosphor layer-covered LEDs 10 from the support sheet 1 (ref: FIG. 11 (*e*)).

The method for producing the LED device 15 includes a mounting step (ref: FIG. 11 (*f*)).

In the following, the steps of the method for producing the phosphor layer-covered LED 10 and the method for producing the LED device 15 in the second embodiment are described in detail.

[Support Sheet Preparing Step]

As shown in FIGS. 11 (*a*) and 12, the support sheet 1 is formed into a flat plate sheet shape extending in the plane direction. The support sheet 1 is formed into, for example, a rectangular shape in plane view.

As shown in FIG. 12, the support sheet 1 is prepared so that the reference marks 18, which serve as a reference of cutting in the cutting step to be described later, are provided in advance. On the other hand, unlike the first embodiment, the through hole 21 is not provided in the support sheet 1.

The support sheet 1 is configured to be capable of supporting the LEDs 4 (ref: FIG. 11 (*b*)) to be described next and as shown in FIGS. 11 (*a*) and 12, includes, for example, the support board 2 and the pressure-sensitive adhesive layer 3 that is laminated on the top surface of the support board 2.

The support board 2 is formed into a plate shape extending in the plane direction. The support board 2 is provided on the back surface in the support sheet 1 and is formed to have the generally same shape as that of the support sheet 1 in plane view. Unlike the first embodiment, the through hole 21 is not provided in the support board 2.

The pressure-sensitive adhesive layer 3 is formed on the entire top surface of the support board 2.

An example of a pressure-sensitive adhesive material for forming the pressure-sensitive adhesive layer 3 includes the same pressure-sensitive adhesive as that in the first embodiment. The pressure-sensitive adhesive layer 3 can be also formed of, for example, an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) or a thermal release sheet in which the pressure-sensitive adhesive force is capable of being reduced by heating (to be specific, a thermal release sheet such as REVALPHA (a registered trademark, manufactured by NITTO DENKO CORPORATION)). To be specific, when a phosphor resin composition in the phosphor sheet 5 (ref: the upper side view in FIG. 11 (*b*)) contains a thermosetting resin, preferably, the pressure-sensitive adhesive layer 3 is formed of an active energy ray irradiation release sheet. On the other hand, when the phosphor resin composition in the phosphor sheet 5 to be described later contains an active energy ray curable resin, preferably, the pressure-sensitive adhesive layer 3 is formed of a thermal release sheet.

[LED Disposing Step]

In the LED disposing step, as shown in FIG. 11 (*b*) and by the phantom lines in FIG. 12, a plurality of the LEDs 4 are prepared to be disposed on the top side of the support sheet 1.

[Phosphor Sheet Disposing Step]

As shown in FIG. 11 (*c*), the phosphor sheet 5 is disposed so as to cover the top-side portions of a plurality of the LEDs 4 and to allow the back surface 24 of the phosphor sheet 5 to serve as the exposed surface 27 that is positioned as described above.

To be specific, as shown by arrows in FIG. 11 (*b*), the phosphor sheet 5 that is laminated on a release sheet 13 is, for example, compressively bonded toward the pressure-sensitive adhesive layer 3. The compressive bonding is performed under a reduced pressure atmosphere or under a normal pressure atmosphere. Preferably, in view of simplifying the process, the compressive bonding is performed under a normal pressure atmosphere.

Thereafter, as shown by the phantom lines in FIG. 11 (*c*), the release sheet 13 is peeled from the top surface 25 of the phosphor sheet 5.

[LED Encapsulating Step]

The LED encapsulating step is performed after the phosphor sheet disposing step (ref: FIG. 11 (c)).

As shown in FIG. 11 (d), in the LED encapsulating step, the phosphor sheet 5 is cured.

In this way, the top-side portions of the side surfaces 26 of the LEDs 4 and the top surfaces 23 thereof are covered with the phosphor sheet 5 in close contact with each other. That is, the top-side portions of the LEDs 4 are encapsulated by the phosphor sheet 5 in a C-stage state.

[Cutting Step]

As shown by the dashed lines in FIG. 11 (d), in the cutting step, the flexible phosphor sheet 5 around the LEDs 4 is cut along the top-back direction. As shown by the dash-dot lines in FIG. 12, for example, the phosphor sheet 5 is cut into a generally rectangular shape in plane view that surrounds each of the LEDs 4.

By the cutting step, the phosphor layer-covered LEDs 10, each of which includes the LED 4 and the phosphor layer 7 that is formed of the phosphor sheet 5 covering the LED 4, are obtained in a state where the LEDs 4 are in close contact with the support sheet 1.

[LED Peeling Step]

In FIG. 11 (e), in the LED peeling step, each of the phosphor layer-covered LEDs 10 is peeled from the top surface of the pressure-sensitive adhesive layer 3. That is, each of the phosphor layer-covered LEDs 10 is peeled from the support board 2 and the pressure-sensitive adhesive layer 3. To be specific, an active energy ray is applied to the pressure-sensitive adhesive layer 3 or the pressure-sensitive adhesive layer 3 is heated so as to reduce the pressure-sensitive adhesive force of the pressure-sensitive adhesive layer 3. In the LED peeling step, unlike the first embodiment, each of the phosphor layer-covered LEDs 10 is peeled from the pressure-sensitive adhesive layer 3 without using the pressing member 14 (ref: FIG. 2 (e')).

In the LED peeling step, the phosphor layer 7 is not in contact with the pressure-sensitive adhesive layer 3 and the LED 4 only is in contact with the pressure-sensitive adhesive layer 3, so that each of the phosphor layer-covered LEDs 10 can be easily peeled from the pressure-sensitive adhesive layer 3.

In this way, each of the phosphor layer-covered LEDs 10 that is peeled from the support sheet 1 is obtained.

[Mounting Step]

Thereafter, after the phosphor layer-covered LED 10 is selected in accordance with emission wavelength and luminous efficiency, as shown in FIG. 11 (f), the selected phosphor layer-covered LED 10 is mounted on the board 9. In this way, the LED device 15 is obtained.

In this way, the LED device 15 including the board 9 and the phosphor layer-covered LED 10 that is mounted on the board 9 is obtained.

Thereafter, as shown by the phantom line in FIG. 11 (f), the encapsulating protective layer 20 (an encapsulating layer that is different from the phosphor layer 7) that encapsulates the phosphor layer-covered LED 10 is provided in the LED device 15 as required. In this way, the reliability of the LED device 15 can be improved.

In the method for producing the phosphor layer-covered LED 10 in the second embodiment, the same function and effect as that of the first embodiment can be achieved.

In the support sheet preparing step (ref: FIG. 11 (a)) in the second embodiment, the support sheet 1 is prepared so as to include the support board 2 and the pressure-sensitive adhesive layer 3. Alternatively, for example, though not shown, the support sheet 1 can be also prepared so as to include the support board 2 only without including the pressure-sensitive adhesive layer 3.

Preferably, as shown in FIG. 11 (a), the support sheet 1 is prepared so as to include the support board 2 and the pressure-sensitive adhesive layer 3.

In this way, in the LED disposing step shown in FIG. 11 (b), when the LEDs 4 are disposed, the LEDs 4 can adhere to the support board 2 via the pressure-sensitive adhesive layer 3. Thus, the support sheet 1 can surely support the LEDs 4.

Third Embodiment

In FIG. 13, the same reference numerals are provided for members and steps corresponding to each of those in the first and second embodiments, and their detailed description is omitted.

In the LED peeling step (ref: FIG. 11 (e)) in the second embodiment, each of the phosphor layer-covered LEDs 10 is peeled from the support board 2 and the pressure-sensitive adhesive layer 3. Alternatively, for example, as shown in FIG. 13 (e), first, the support board 2 is peeled from the pressure-sensitive adhesive layer 3 and thereafter, as shown in FIG. 13 (f), each of the phosphor layer-covered LEDs 10 can be peeled from the pressure-sensitive adhesive layer 3 only.

That is, the method for producing the phosphor layer-covered LED 10 includes the same steps of support sheet preparing step (ref: FIG. 13 (a)), LED disposing step (ref: FIG. 13 (b)), phosphor sheet disposing step (ref: FIG. 13 (c)), LED encapsulating step (ref: FIG. 13 (d)), cutting step (ref: the dashed lines in FIG. 13 (d)), and LED peeling step (ref: FIG. 13 (f)) as those in the second embodiment. In addition, as shown in FIG. 13 (e), the method for producing the phosphor layer-covered LED 10 further includes a support board peeling step in which the support board 2 is peeled from the pressure-sensitive adhesive layer 3 after the cutting step (ref: FIG. 13 (d)) and before the LED peeling step (ref: FIG. 13 (f)).

[Support Board Peeling Step]

As shown in FIG. 13 (e), in the support board peeling step, the support board 2 is peeled from the back surface of the pressure-sensitive adhesive layer 3.

In order to peel the support board 2 from the pressure-sensitive adhesive layer 3, for example, the pressure-sensitive adhesive layer 3 is formed from a pressure-sensitive adhesive in which the pressure-sensitive adhesive force is capable of being reduced by application of an active energy ray such as an ultraviolet ray and the active energy ray is applied to the pressure-sensitive adhesive layer 3, so that the pressure-sensitive adhesive force of the pressure-sensitive adhesive layer 3 is reduced. Thereafter, the support board 2 is peeled from the pressure-sensitive adhesive layer 3.

Alternatively, the pressure-sensitive adhesive layer 3 is formed from a pressure-sensitive adhesive in which the pressure-sensitive adhesive force is capable of being reduced by heating and the pressure-sensitive adhesive layer 3 is heated, so that the pressure-sensitive adhesive force of the pressure-sensitive adhesive layer 3 is reduced. Thereafter, the support board 2 is peeled from the pressure-sensitive adhesive layer 3.

[LED Peeling Step]

Next, in the LED peeling step shown by the arrow in FIG. 13 (f), each of the phosphor layer-covered LEDs 10 is peeled from the pressure-sensitive adhesive layer 3.

To be specific, as shown in FIG. 13 (f), for example, each of the phosphor layer-covered LEDs 10 is peeled from the pressure-sensitive adhesive layer 3 with the pick-up device 17. In the pick-up device 17, the pressing member 14 presses (pushes up) the pressure-sensitive adhesive layer 3 corresponding to the phosphor layer-covered LED 10 that is intended to be peeled off from the back side thereof. In this way, the phosphor layer-covered LED 10 that is intended to be peeled off is pushed up toward the top side, and the pushed-up phosphor layer-covered LED 10 is peeled from the pressure-sensitive adhesive layer 3, while being absorbed by the absorbing member 16 such as a collet.

In this way, as shown in FIG. 13 (*f*), each of the phosphor layer-covered LEDs 10 that is peeled from the support sheet 1 is obtained.

[Mounting Step]

Thereafter, after the phosphor layer-covered LED 10 is selected in accordance with emission wavelength and luminous efficiency, as shown in FIG. 13 (*g*), the selected phosphor layer-covered LED 10 is mounted on the board 9. In this way, the LED device 15 is obtained.

According to the method in the third embodiment, in the LED peeling step, each of the phosphor layer-covered LEDs 10 is peeled from the pressure-sensitive adhesive layer 3, so that the phosphor layer-covered LED 10 can be easily and surely peeled from the pressure-sensitive adhesive layer 3 using the above-described pick-up device 17.

Fourth Embodiment

In FIG. 14, the same reference numerals are provided for members and steps corresponding to each of those in the first to third embodiments, and their detailed description is omitted.

In the LED peeling steps (ref: FIGS. 2 (*e*), 11 (*e*), and 13 (*f*)) in the first to third embodiments, each of the phosphor layer-covered LEDs 10 is peeled from the support sheet 1 and in the mounting step (ref: FIGS. 2 (*f*), 11 (*f*), and 13 (*g*)), the peeled phosphor layer-covered LED 10 is then mounted on the board 9. Alternatively, for example, as shown in FIGS. 14 (*e*) and 14 (*f*), the phosphor layer-covered LEDs 10 are sequentially transferred onto a transfer sheet 11 and a stretchable support sheet 12, and thereafter, as shown in FIG. 14 (*g*), each of the phosphor layer-covered LEDs 10 can be peeled from the stretchable support sheet 12.

That is, the method for producing the phosphor layer-covered LED 10 includes the same steps of support sheet preparing step (ref: FIG. 14 (*a*)), LED disposing step (ref: FIG. 14 (*b*)), phosphor sheet disposing step (ref: FIG. 14 (*c*)), LED encapsulating step (ref: FIG. 14 (*d*)), and cutting step (ref: the dashed lines in FIG. 14 (*d*)) as those in the second embodiment and furthermore, includes the above-described LED peeling step (ref: FIGS. 14 (*e*) to 14 (*g*)). The method for producing the LED device 15 includes a mounting step (ref: FIG. 14 (*h*)).

[LED Peeling Step]

The LED peeling step includes a transfer step of transferring the phosphor layer-covered LEDs 10 onto the stretchable support sheet 12 (ref: FIG. 14 (*f*)) and a re-releasing step of peeling the phosphor layer-covered LEDs 10 from the stretchable support sheet 12, while stretching the stretchable support sheet 12 in the plane direction (ref: FIGS. 14 (*g*) and 14 (*g'*)).

[Transfer Step]

In order to transfer the phosphor layer-covered LEDs 10 onto the stretchable support sheet 12, as shown by the arrows in FIG. 14 (*d*), and in FIG. 14 (*e*), the phosphor layer-covered LEDs 10 after the cutting step (ref: the dashed lines in FIG. 14 (*d*)) are transferred onto the transfer sheet 11 in advance (a first transfer step).

The transfer sheet 11 is formed of the same material and with the same thickness as those in the stretchable support sheet 12 to be described next.

By the transfer of the phosphor layer-covered LEDs 10 onto the transfer sheet 11, the back surface 24 (the top surface 25 before the transfer, ref: FIG. 14 (*d*)) of the phosphor layer 7 is in contact (in close contact) with the top surface of the transfer sheet 11, while the top surfaces 23 (the back surfaces 22 before the transfer, ref: FIG. 14 (*d*)) of the LEDs 4 in which bumps (ref: the numeral 22 in FIG. 20) that are not shown are formed and the top-side portions (the back-side portions before the transfer, ref: FIG. 14 (*d*)) of the side surfaces 26 thereof are exposed from the phosphor layer 7 around the LEDs 4.

Thereafter, as shown in FIG. 14 (*f*), the phosphor layer-covered LEDs 10 are transferred onto the stretchable support sheet 12 (a second transfer step).

The stretchable support sheet 12 is a stretchable pressure-sensitive adhesive sheet that is capable of stretching in the plane direction. Examples thereof include an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) and a thermal release sheet in which the pressure-sensitive adhesive force is capable of being reduced by heating (to be specific, a thermal release sheet such as REVALPHA (a registered trademark, manufactured by NITTO DENKO CORPORATION)). Preferably, an active energy ray irradiation release sheet is used.

The stretchable support sheet 12 has a tensile elasticity at 23° C. of, for example, 0.01 MPa or more, or preferably 0.1 MPa or more, and of, for example, 10 MPa or less, or preferably 1 MPa or less.

The thickness of the stretchable support sheet 12 is, for example, 0.1 mm or more and 1 mm or less.

A commercially available product can be used as the stretchable support sheet 12. To be specific, the UE series (manufactured by NITTO DENKO CORPORATION) or the like is used.

By the transfer of the phosphor layer-covered LEDs 10 onto the stretchable support sheet 12, the top surface 25 of the phosphor layer 7 is exposed, while the back surfaces 22 of the LEDs 4 in which bumps (ref: the numeral 22 in FIG. 20) that are not shown are formed are in contact (in close contact) with the top surface of the stretchable support sheet 12.

[Re-Releasing Step]

After the transfer step, as shown in FIG. 14 (*g*), the stretchable support sheet 12 is stretched in the plane direction and each of the phosphor layer-covered LEDs 10 is peeled from the stretchable support sheet 12.

To be specific, first, as shown by the arrows in FIG. 14 (*f*), the stretchable support sheet 12 is stretched outwardly in the plane direction. In this way, as shown in FIG. 14 (*g*), in a state where the phosphor layer-covered LEDs 10 are in close contact with the stretchable support sheet 12, the tensile stress is concentrated in the cuts 8; thus, the cuts 8 expand; and the LEDs 4 are separated from each other, so that gaps 19 are formed. Each of the gaps 19 is formed into a generally grid shape (a generally checker-board shape) in plane view so as to separate the LEDs 4.

Subsequently, as shown in FIG. 14 (*g'*), the stretchable support sheet 12 corresponding to the phosphor layer-covered LED 10 that is intended to be peeled off is pushed up from the back side thereof by the pressing member 14. In this way, the phosphor layer-covered LED 10 is pushed up toward the top side, and the pushed-up phosphor layer-covered LED 10 is peeled from the stretchable support sheet 12, while being absorbed by the absorbing member 16.

When the stretchable support sheet 12 is an active energy ray irradiation release sheet, in a case where each of the phosphor layer-covered LEDs 10 is peeled from the stretchable support sheet 12, an active energy ray is applied to the stretchable support sheet 12. When the stretchable support sheet 12 is a thermal release sheet, the stretchable support sheet 12 is heated. The pressure-sensitive adhesive force of the stretchable support sheet 12 is reduced by those treatments, so that each of the phosphor layer-covered LEDs 10 can be easily and surely peeled from the stretchable support sheet 12.

In this way, each of the phosphor layer-covered LEDs 10 that is peeled from the support sheet 1 is obtained.

[Mounting Step]

Thereafter, after the phosphor layer-covered LED 10 is selected in accordance with emission wavelength and luminous efficiency, as shown in FIG. 14 (*h*), the selected phosphor layer-covered LED 10 is mounted on the board 9. In this way, the LED device 15 is obtained.

In the method in the fourth embodiment, the stretchable support sheet 12 is stretched in the plane direction and each of the phosphor layer-covered LEDs 10 is peeled from the stretchable support sheet 12.

Thus, the gaps 19 are formed around each of the phosphor layer-covered LEDs 10, so that each of the phosphor layer-covered LEDs 10 can be further easily and surely peeled from the stretchable support sheet 12 using the pick-up device 17.

Additionally, the gap 19 is formed between the phosphor layer-covered LED 10 that is intended to be peeled off and the phosphor layer-covered LED 10 that is adjacent thereto. Thus, it can be prevented that when the absorbing member 16 is brought into contact with the phosphor layer-covered LED 10 that is intended to be peeled off, the absorbing member 16 comes in contact with the phosphor layer-covered LED 10 that is adjacent thereto to cause a damage to the phosphor layer-covered LED 10.

Fifth Embodiment

In FIG. 15, the same reference numerals are provided for members and steps corresponding to each of those in the first to fourth embodiments, and their detailed description is omitted.

In the fourth embodiment, as shown in FIG. 14 (*e*), each of the phosphor layer-covered LEDs 10 after the cutting step (ref: the dashed lines in FIG. 14 (*d*)) is transferred onto the transfer sheet 11. Alternatively, as referred in FIG. 15, as shown by the arrows in FIG. 15 (*d*), and in FIG. 15 (*e*), first, the phosphor layer-covered LEDs 10 are transferred onto the transfer sheet 11 and thereafter, as shown by the dashed lines in FIG. 15 (*f*), the cutting step can be performed.

That is, the method for producing the phosphor layer-covered LED 10 in the fifth embodiment includes the same steps of support sheet preparing step (ref: FIG. 15 (*a*)), LED disposing step (ref: FIG. 15 (*b*)), phosphor sheet disposing step (ref: FIG. 15 (*c*)), LED encapsulating step (ref: FIG. 15 (*d*)), transfer step (ref: FIGS. 15 (*e*) and 15 (*f*)), cutting step (ref: the dashed lines in FIG. 15 (*f*)), and re-releasing step (ref: FIG. 15 (*g*)) as those in the fourth embodiment. The method for producing the LED device 15 in the fifth embodiment includes a mounting step (ref: FIG. 15 (*i*)).

The cutting step shown by the dashed lines in FIG. 15 (*f*) is performed after the first transfer step (ref: FIG. 15 (*e*)) and before the second transfer step (ref: FIG. 15 (*f*)).

Then, after the obtained phosphor layer-covered LED 10 is selected in accordance with emission wavelength and luminous efficiency, as shown in FIG. 15 (*i*), the selected phosphor layer-covered LED 10 is mounted on the board 9. In this way, the LED device 15 is obtained.

Sixth Embodiment

In FIG. 16, the same reference numerals are provided for members and steps corresponding to each of those in the first to fifth embodiments, and their detailed description is omitted.

In the fifth embodiment, as shown in FIG. 15 (*e*), in the first transfer step, the phosphor layer-covered LEDs 10 made of the phosphor sheet 5 and a plurality of the LEDs 4 are transferred onto the transfer sheet 11 and at this time, the support sheet 1 made of the support board 2 and the pressure-sensitive adhesive layer 3 is peeled from the phosphor layer-covered LEDs 10. Alternatively, as shown in FIG. 16 (*d*), first, the support board 2 in the support sheet 1 is peeled from the pressure-sensitive adhesive layer 3 in advance; next, as shown by the arrows in FIG. 16 (*e*), and in FIG. 16 (*f*), the phosphor layer-covered LEDs 10, along with the pressure-sensitive adhesive layer 3, are transferred onto the transfer sheet 11; and subsequently, as shown in FIG. 16 (*f*), the pressure-sensitive adhesive layer 3 can be peeled from the phosphor layer-covered LEDs 10.

That is, the method for producing the phosphor layer-covered LED 10 in the sixth embodiment includes, support board peeling step (ref: FIG. 16 (*e*)), pressure-sensitive adhesive layer peeling step (ref: the arrows in FIG. 16 (*f*), and in FIG. 16 (*g*)) the same steps of support sheet preparing step (ref: FIG. 16 (*a*)), LED disposing step (ref: FIG. 16 (*b*)), phosphor sheet disposing step (ref: FIG. 16 (*c*)), LED encapsulating step (ref: FIG. 16 (*d*)), transfer step (ref: FIGS. 16 (*f*) and 16 (*h*)), cutting step (ref: the dashed lines in FIG. 16 (*g*)), and re-releasing step (ref: FIG. 16 (*i*)) as those in the fifth embodiment. The method for producing the LED device 15 in the sixth embodiment includes a mounting step (ref: FIG. 16 (*j*)).

The support board peeling step shown by the arrows in FIG. 16 (*d*), and in FIG. 16 (*e*) is performed after the LED encapsulating step (ref: FIG. 16 (*d*)). Thereafter, as shown in FIG. 16 (*f*), in the first transfer step in the transfer step, the pressure-sensitive adhesive layer 3 and the phosphor layer-covered LEDs 10 are transferred onto the transfer sheet 11. Then, as shown by the arrows in FIG. 16 (*f*), and in FIG. 16 (*g*), in the pressure-sensitive adhesive layer peeling step, the pressure-sensitive adhesive layer 3 is peeled from the phosphor layer-covered LEDs 10. Thereafter, as shown in FIG. 16 (*g*), in the second transfer step in the transfer step, the phosphor layer-covered LEDs 10 are transferred onto the stretchable support sheet 12.

Then, after the obtained phosphor layer-covered LED 10 is selected in accordance with emission wavelength and luminous efficiency, as shown in FIG. 16 (*j*), the selected phosphor layer-covered LED 10 is mounted on the board 9. In this way, the LED device 15 is obtained.

Seventh Embodiment

In FIG. 17, the same reference numerals are provided for members and steps corresponding to each of those in the first to sixth embodiments, and their detailed description is omitted.

As shown in FIGS. 17 (*a*) to 17 (*e*), the method for producing the phosphor layer-covered LED 10 in the seventh embodiment includes an LED disposing step of disposing the LEDs 4 on the top surface of a support sheet 32 (ref: FIG. 17 (a)); a phosphor sheet disposing step of disposing the phosphor sheet 5 so as to partially cover the LEDs 4 and to allow the back surface 24 of the phosphor sheet 5 to serve as the exposed surface 27 that is positioned as described above (ref: FIG. 17 (b)); an LED encapsulating step of applying an active energy ray to the phosphor sheet 5 and encapsulating the top-side portions of the LEDs 4 by the phosphor sheet 5 (ref: FIG. 17 (c)); a cutting step of cutting the phosphor sheet 5 corresponding to each of the LEDs 4 (ref: FIG. 17 (d)); and an LED peeling step of peeling the phosphor layer-covered LEDs 10 from the support sheet 32 (ref: FIG. 17 (e)). The method for producing the LED device 15 in the seventh embodiment includes a mounting step (ref: FIG. 17 (f)).

In the following, the steps of the method for producing the phosphor layer-covered LED 10 and the method for producing the LED device 15 in the seventh embodiment are described in detail.

<LED Disposing Step>

As shown in FIG. 17 (a), in the LED disposing step, the support sheet 32 is formed into a sheet shape extending in the plane direction. The support sheet 32 is formed into a generally rectangular shape in plane view that is the same as or larger than the phosphor sheet 5 to be described next. To be specific, the support sheet 32 is formed into a generally rectangular sheet shape in plane view.

The support sheet 32 is not required to have heat resistance with respect to the heating and curing of the phosphor sheet 5 to be described later, so that it can be also selected from a sheet having low heat resistance. The support sheet 32 is capable of supporting the LEDs 4 and is also capable of stretching in the plane direction. Examples thereof may include a thermal release sheet in which the pressure-sensitive adhesive force is capable of being reduced by heating (to be specific, a thermal release sheet such as REVALPHA (a registered trademark, manufactured by NITTO DENKO CORPORATION)) or an active energy ray irradiation release sheet in which the pressure-sensitive adhesive force is capable of being reduced by application of an active energy ray (for example, an ultraviolet ray and an electron beam) (to be specific, an active energy ray irradiation release sheet described in Japanese Unexamined Patent Publication No. 2005-286003 or the like). When the support sheet 32 is an active energy ray irradiation release sheet, the active energy ray curable resin and the irradiation conditions are selected so as not to reduce the pressure-sensitive adhesive force of the support sheet 32 by application of the active energy ray to the phosphor sheet 5.

In a size of the support sheet 32, the maximum length thereof is, for example, 10 mm or more and 300 mm or less and the length of one side thereof is, for example, 10 mm or more and 300 mm or less.

The support sheet 32 has a tensile elasticity at 23° C. of, for example, $1 \times 10^4$ Pa or more, or preferably $1 \times 10^5$ Pa or more, and of, for example, $1 \times 10^9$ Pa or less. When the tensile elasticity of the support sheet 32 is not less than the above-described lower limit, the stretchability of the support sheet 32 in the plane direction is secured and the stretching (ref: FIG. 17 (e)) of the support sheet 32 in the plane direction to be described later can be smoothly performed.

The thickness of the support sheet 32 is, for example, 0.1 mm or more, or preferably 0.2 mm or more, and is, for example, 1 mm or less, or preferably 0.5 mm or less.

In the LED disposing step, for example, a plurality of the LEDs 4 are disposed in alignment on the top surface of the support sheet 32. To be specific, a plurality of the LEDs 4 are disposed on the top surface of the support sheet 32 in such a manner that a plurality of the LEDs 4 are spaced apart from each other at equal intervals in the front-rear and the right-left directions in plane view. The back surfaces 22 of the LEDs 4 are attached to the top surface of the support sheet 32 so that the bumps (ref: the numeral 22 in FIG. 20), that are, though not shown, provided on the back surfaces 22 are opposed to the top surface of the support sheet 32. In this way, the back surfaces 22 of the LEDs 4 are supported at (pressure-sensitively adhere to) the top surface of the support sheet 32 so that the alignment state thereof is retained.

The gap between the LEDs 4 is, for example, 0.05 mm or more and 2 mm or less.

<Phosphor Sheet Disposing Step>

The phosphor sheet disposing step is performed after the LED disposing step.

In the phosphor sheet disposing step shown in FIG. 17 (b), the phosphor sheet 5 shown by the upper side view in FIG. 17 (a) is formed from a phosphor resin composition containing an active energy ray curable resin and a phosphor.

The active energy ray curable resin is a curable resin that is capable of being cured by application of an active energy ray. To be specific, an example thereof includes a silicone semi-cured material. The silicone semi-cured material is obtained as a sheet by heating a first silicone resin composition or a second silicone resin composition.

In the following, the first silicone resin composition and the second silicone resin composition are described in detail.

[First Silicone Resin Composition]

The first silicone resin composition contains, for example, a first polysiloxane containing at least one pair of condensable substituted groups that is capable of condensation by heating and at least one addable substituted group that is capable of addition by an active energy ray and a second polysiloxane containing at least one addable substituted group that is capable of addition by an active energy ray and makes one pair with the addable substituted group in the first polysiloxane.

An example of the one pair of condensable substituted groups includes combination (a first combination group) of at least one substituted group selected from the group consisting of a hydroxyl group (—OH), an alkoxy group, an acyloxy group, an amino group (—NH$_2$), an alkylamino group, an alkenyloxy group, and a halogen atom and a hydroxyl group.

The alkoxy group is represented by —OR$^1$. R$^1$ represents an alkyl group or a cycloalkyl group. An example of the alkyl group includes a straight chain or branched chain alkyl group having 1 or more and 20 or less carbon atoms such as a methyl group, an ethyl group, a propyl group, an isopropyl group, a butyl group, an isobutyl group, a pentyl group, and a hexyl group. Preferably, an alkyl group having 1 or more carbon atoms is used, more preferably, an alkyl group having 10 or less carbon atoms is used, or further more preferably, an alkyl group having 6 or less carbon atoms is used. An example of the cycloalkyl group includes a cycloalkyl group having 3 or more and 6 or less carbon atoms such as a cyclopentyl group and a cyclohexyl group.

An example of the alkoxy group includes an alkoxy group containing a straight chain or branched chain alkyl group having 1 or more and 20 or less carbon atoms such as a methoxy group, an ethoxy group, a propoxy group, an isopropoxy group, a butoxy group, an isobutoxy group, a pentyloxy group, and a hexyloxy group.

An example of the alkoxy group also includes an alkoxy group containing a cycloalkyl group having 3 or more and 6 or less carbon atoms such as a cyclopentyloxy group and a cyclohexyloxy group.

As the alkoxy group, preferably, in view of easy preparation and thermal stability, an alkoxy group containing an alkyl group having 1 or more carbon atoms is used, more preferably, an alkoxy group containing an alkyl group having 10 or less carbon atoms is used, further more preferably, an alkoxy group containing an alkyl group having 6 or less carbon atoms is used, or even more preferably, a methoxy group is used.

The acyloxy group is represented by —OCOR$^1$. R$^1$ represents the above-described alkyl group or cycloalkyl group. Preferably, as R$^1$, an alkyl group is used.

Examples of the acyloxy group include an acetoxy group (—OCOCH$_3$), —OCOC$_2$H$_5$, and —OCOC$_3$H$_7$. Preferably, an acetoxy group is used.

Examples of the alkylamino group include a monoalkylamino group and a dialkylamino group.

The monoalkylamino group is represented by —NR$^2$H. R$^2$ represents an alkyl group or a cycloalkyl group. Preferably, as R$^2$, an alkyl group is used. An example of the monoalkylamino group includes a monoalkylamino group having 1 or more and 10 or less carbon atoms of an N-substituted alkyl group such as a methylamino group, an ethylamino group, an n-propylamino group, and an isopropylamino group.

The dialkylamino group is represented by —NR$^2$$_2$. R$^2$ represents alkyl groups or cycloalkyl groups that may be the same or different from each other. R$^2$ is the same as that described above. An example of the dialkylamino group includes a dialkylamino group having 1 or more and 10 or less carbon atoms of an N,N-substituted alkyl such as a dimethylamino group, a diethylamino group, a di-n-propylamino group, a diisopropylamino group, an ethylmethylamino group, a methyl-n-propylamino group, and a methylisopropylamino group.

As the alkylamino group, preferably, a dialkylamino group is used, more preferably, a dialkylamino group having the same number of carbon atoms of N,N-substituted alkyl is used, or further more preferably, a dimethylamino group is used.

The alkenyloxy group is represented by —OCOR$^3$. R$^3$ represents an alkenyl group or a cycloalkenyl group. An example of the alkenyl group includes an alkenyl group having 3 or more and 10 or less carbon atoms such as a vinyl group, an allyl group, a propenyl group, an isopropenyl group, a butenyl group, a pentenyl group, a hexenyl group, a heptenyl group, and an octenyl group. An example of the cycloalkenyl group includes a cycloalkenyl group having 2 or more and 10 or less carbon atoms such as a cyclohexenyl group, a cyclooctenyl group, and a norbornenyl group.

As the alkenyloxy group, preferably, an alkenyloxy group containing an alkenyl group having 2 or more and 10 or less carbon atoms is used, or more preferably, an isopropenyloxy group is used.

Examples of the halogen atom include a fluorine atom, a chlorine atom, a bromine atom, and an iodine atom. Preferably, a chlorine atom is used.

To be specific, an example of the first combination group includes one pair of combinations such as combination of hydroxyl groups with themselves, combination of an alkoxy group and a hydroxyl group, combination of an acyloxy group and a hydroxyl group, combination of an amino group and a hydroxyl group, combination of an alkylamino group and a hydroxyl group, combination of an alkenyloxy group and a hydroxyl group, and combination of a halogen atom and a hydroxyl group.

Furthermore, an example of the first combination group also includes two pairs (to be specific, the total of two pairs of one pair of an alkoxy group and a hydroxyl group and the other pair of an acyloxy group and a hydroxyl group) or more of combinations such as combination of an alkoxy group, an acyloxy group, and a hydroxyl group.

As the first combination group, preferably, combination of hydroxyl groups with themselves and combination of an alkoxy group and a hydroxyl group are used, more preferably, combination of an alkoxy group and a hydroxyl group is used, further more preferably, combination of an alkoxy group containing an alkyl group having 1 or more and 10 or less carbon atoms and a hydroxyl group is used, or particularly preferably, combination of a methoxy group and a hydroxyl group is used.

In the one pair of condensable substituted groups made of the first combination group, two silicon atoms are bonded to each other via an oxide atom by condensation represented by the following formula (1), that is, silanol condensation.

Formula (1):

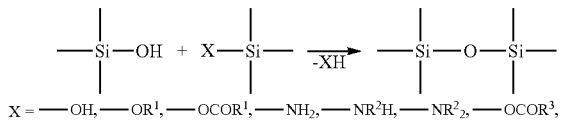

$X = $ —OH, —OR$^1$, —OCOR$^1$, —NH$_2$, —NR$^2$H, —NR$^2$$_2$, —OCOR$^3$, halogen atom (where, in formula, R$^1$ to R$^3$ are the same as those described above.)

An example of the one pair of condensable substituted groups includes combination (a second combination group) of at least one substituted group selected from a hydroxyl group and an alkoxy group and a hydrogen atom.

An example of the alkoxy group includes the alkoxy group illustrated in the first combination group.

To be specific, an example of the second combination group includes one pair of combinations such as combination of a hydroxyl group and a hydrogen atom and combination of an alkoxy group and a hydrogen atom.

Furthermore, an example of the second combination group also includes two pairs (to be specific, the total of two pairs of one pair of a hydroxyl group and a hydrogen atom and the other pair of an alkoxy group and a hydrogen atom) or more of combinations such as combination of a hydroxyl group, an alkoxy group, and a hydrogen atom.

In one pair of condensable substituted groups made of the second combination group, two silicon atoms are bonded to each other via an oxide atom by condensation represented by the following formula (2), that is, hydrosilane condensation.

Formula (2):

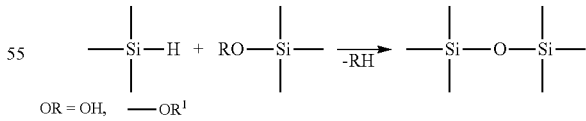

OR = OH, —OR$^1$ (where, in formula, R$^1$ is the same as that described above.)

The above-described first combination groups and second combination groups can be contained in the first polysiloxane alone or in combination of a plurality of groups.

Each of the condensable substituted groups is bonded to a silicon atom that is at the end of the main chain, which constitutes a molecule in the first polysiloxane; in the middle of the main chain; and/or in a side chain that branches off from the main chain. Preferably, one condensable substituted group (preferably, a hydroxyl group) is bonded to the silicon atoms at both ends of the main chain and the other condensable substituted group (preferably, an alkoxy group) is bonded to the silicon atom in the middle of the main chain (ref: formula (16) to be described later).

In one pair of addable substituted groups, at least one piece of one addable substituted group is contained in the first polysiloxane and at least one piece of the other addable substituted group is contained in the second polysiloxane.

Examples of the one pair of addable substituted groups include combination of a hydrosilyl group and an ethylenically unsaturated group-containing group, combination of (meth)acryloyl group-containing groups with themselves, combination of epoxy group-containing groups with themselves, and combination of a thiol group-containing group and an ethylenically unsaturated group-containing group.

The hydrosilyl group is represented by —SiH and is a group in which a hydrogen atom is directly bonded to a silicon atom.

The ethylenically unsaturated group-containing group contains, in a molecule, an ethylenically unsaturated group. Examples of the ethylenically unsaturated group-containing group include the above-described alkenyl group and cycloalkenyl group. Preferably, an alkenyl group is used, or more preferably, a vinyl group is used.

The (meth)acryloyl group-containing group contains, in a molecule, a methacryloyl group ($CH_2$=C($CH_3$)COO—) and/or an acryloyl group ($CH_2$=CHCOO—) and to be specific, is represented by the following formula (3).

Formula (3):

$$CH_2=CYCOO-R^4- \quad (3)$$

(where, in formula, Y represents a hydrogen atom or a methyl group and $R^4$ represents a divalent hydrocarbon group selected from a saturated hydrocarbon group and an aromatic hydrocarbon group.)

Examples of the divalent saturated hydrocarbon group include an alkylene group having 1 or more and 6 or less carbon atoms such as a methylene group, an ethylene group, a propylene group, and a butylene group and a cycloalkylene group having 3 or more and 8 or less carbon atoms such as a cyclopentylene group and a cyclohexylene group.

An example of the divalent aromatic hydrocarbon group includes an arylene group having 6 or more and 10 or less carbon atoms such as a phenylene group and a naphthylene group.

As the divalent hydrocarbon group, preferably, a divalent saturated hydrocarbon group is used, more preferably, an alkylene group is used, or further more preferably, a propylene group is used.

To be specific, an example of the (meth)acryloyl group-containing group includes a 3-(meth)acryloxypropyl group.

The epoxy group-containing group contains, in a molecule, an epoxy group. Examples of the epoxy group-containing group include an epoxy group, a glycidyl ether group, and an epoxy cycloalkyl group. Preferably, a glycidyl ether group and an epoxy cycloalkyl group are used.

The glycidyl ether group is a glycidoxy alkyl group, for example, represented by formula (4).

Formula (4):

$$-R^4-O-CH_2-CH-CH_2 \quad (4)$$
$$\phantom{-R^4-O-CH_2-CH}\backslash O\diagup$$

(where, in formula (4), $R^4$ represents a divalent hydrocarbon group selected from a saturated hydrocarbon group and an aromatic hydrocarbon group.)

The divalent hydrocarbon group represented by $R^4$ is the same as the divalent hydrocarbon group in the above-described formula (3).

An example of the glycidyl ether group includes a 3-glycidoxypropyl group.

An example of the epoxy cycloalkyl group includes an epoxy cyclohexyl group represented by the following formula (5).

Formula (5):

$$-R^4-\!\!\left\langle\begin{array}{c}CH\\|\\CH\end{array}\!\!>\!\!O\right. \quad (5)$$

(where, in formula, $R^4$ represents a divalent hydrocarbon group selected from a saturated hydrocarbon group and an aromatic hydrocarbon group.)

An example of the divalent saturated hydrocarbon group includes the divalent hydrocarbon group in the above-described formula (3). Preferably, the above-described alkylene group having 1 or more and 6 or less carbon atoms is used, or more preferably, an ethylene group is used.

To be specific, an example of the epoxy cycloalkyl group includes a 2-(3,4-epoxy cyclohexyl)ethyl group.

The thiol group-containing group contains, in a molecule, a thiol group (—SH). Examples thereof include a thiol group and a mercaptoalkyl group such as mercaptomethyl, mercaptoethyl, and mercaptopropyl.

One addable substituted group is replaced with the end and the middle of the main chain and/or a side chain in the first polysiloxane. The other addable substituted group is replaced with or positioned at the end and the middle of the main chain and/or a side chain in the second polysiloxane.

An example of the addable substituted group includes one pair or two or more pairs of combinations described above.

As one pair of addable substituted groups, in view of heat resistance and transparency, preferably, combination of a hydrosilyl group and an alkenyl group is used.

As shown in the following formulas (6) to (9), one pair of addable substituted groups is subjected to addition.

Formula (6):

$$\begin{array}{c}|\\-Si-\!\!\diagup\!\!\diagup\\|\end{array} + \begin{array}{c}|\\H-Si-\\|\end{array} \longrightarrow \begin{array}{c}|\\-Si-\\|\\\diagdown\\-Si-\\|\end{array} \quad (6)$$

Formula (7):

$$\begin{array}{c}|\\-Si\!\!\sim\!\!\sim\!\!O-\\|\end{array}\!\!\!\overset{O}{\underset{Z}{\diagup\!\!\diagdown}}\quad\longrightarrow \quad (7)$$

-continued

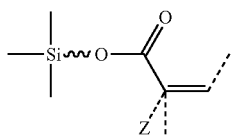

(where, in formula, Z represents a hydrogen atom or a methyl group.)

Formula (8):

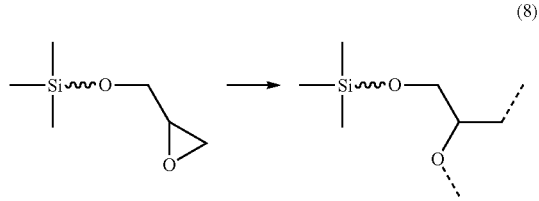

Formula (9):

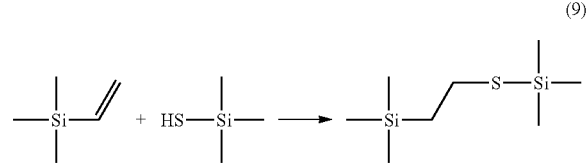

To be specific, when one pair of addable substituted groups is combination of a hydrosilyl group and an alkenyl group (to be specific, a vinyl group), as shown by the above-described formula (6), hydrosilylation (hydrosilylation addition) is performed.

When one pair of addable substituted groups is combination of (meth)acryloyl groups with themselves, as shown by the above-described formula (7), polymerization (addition polymerization) is performed.

When one pair of addable substituted groups is combination of glycidyl ether groups with themselves, as shown by the above-described formula (8), ring-opening addition is performed based on ring opening of an epoxy group.

When one pair of addable substituted groups is combination of a thiol group and an alkenyl group (to be specific, a vinyl group), as shown by the above-described formula (9), a thiol-ene reaction (addition) is performed.

To be specific, the first polysiloxane is represented by the following formula (10).

Formula (10):

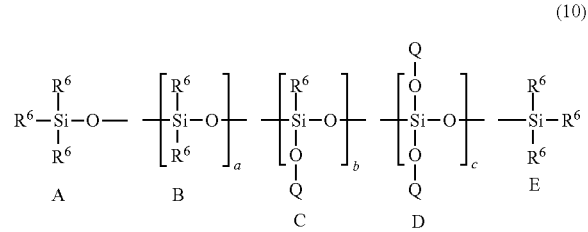

(where, in formula, $R^6$ represents a monovalent hydrocarbon group selected from a saturated hydrocarbon group and an aromatic hydrocarbon group; a condensable substituted group; and/or an addable substituted group. $SiR^6$ may represent an addable substituted group. A to E represent a constituent unit, A and E represent an end unit, and B to D represent a repeating unit. Q represents a constituent unit of B to E. "a"+"b"+"c" is an integer of 1 or more. Of a plurality of $R^6$s, at least one pair of $R^6$s represents a condensable substituted group, and at least one $R^6$ or at least one $SiR^6$ represents an addable substituted group.)

In formula (10), of the monovalent hydrocarbon groups represented by $R^6$, examples of the monovalent saturated hydrocarbon group include an alkyl group and a cycloalkyl group. Examples of the alkyl group and the cycloalkyl group include the same alkyl group and cycloalkyl group as those illustrated in the above-described $R^1$, respectively.

In formula (10), of the monovalent hydrocarbon groups represented by $R^6$, an example of the monovalent aromatic hydrocarbon group includes an aryl group having 6 or more and 10 or less carbon atoms such as a phenyl group and a naphthyl group.

As the monovalent hydrocarbon group, preferably, methyl and phenyl are used.

"a" is, for example, an integer of 0 or more, preferably an integer of 1 or more, or more preferably an integer of 2 or more. "a" is also, for example, an integer of 100000 or less, preferably an integer of 10000 or less, or more preferably an integer of 10000 or less.

"b" is, for example, an integer of 0 or more and 100000 or less, or preferably an integer of 0 or more and 10000 or less.

"c" is, for example, an integer of 0 or more and 100000 or less, or preferably an integer of 0 or more and 10000 or less.

"a"+"b"+"c" is preferably an integer of 1 or more and 100000 or less, or more preferably an integer of 1 or more and 10000 or less. That is, of "a" to "c", at least one is an integer of 1 or more.

Examples of the condensable substituted group represented by $R^6$ and the addable substituted group represented by $R^6$ or $SiR^6$ include the above-described condensable substituted group and addable substituted group, respectively.

The first polysiloxane is, for example, prepared by allowing a first silicon compound containing both at least one condensable substituted group and at least one addable substituted group, and a second silicon compound containing at least one condensable substituted group to be partially subjected to condensation (ref: formula (16) to be described later).

The first silicon compound is, for example, represented by the following formula (11).

Formula (11):

$$R^7SiB_nX^1_{3-n} \quad (11)$$

(where, in formula, $R^7$ or $SiR^7$ represents an addable substituted group; B represents a monovalent hydrocarbon group selected from a saturated hydrocarbon group and an aromatic hydrocarbon group; and $X^1$ represents a condensable substituted group. "n" represents 0 or 1.)

As the addable substituted group represented by $R^7$ or $SiR^7$, for example, the above-described addable substituted group is used; preferably, one of the substituted groups constituting one pair of addable substituted groups is used; more preferably, an ethylenically unsaturated group-containing group, a (meth)acryloyl group-containing group, and an epoxy group-containing group are used; further more preferably, an ethylenically unsaturated group-containing group is used; particularly preferably, an alkenyl group is used; or most preferably, a vinyl group is used.

As the condensable substituted group represented by $X^1$, for example, the above-described condensable substituted group is used; preferably, one of the substituted groups constituting one pair of condensable substituted groups is used; more preferably, a hydroxyl group, an alkoxy group, an acyloxy group, an amino group, an alkylamino group, an alkenyloxy group, and a halogen atom are used; or further more preferably, an alkoxy group is used.

As the alkoxy group represented by $X^1$, for example, in view of reactivity, preferably, an alkoxy group containing an alkyl group having 1 or more and 10 or less carbon atoms is used, or more preferably, an alkoxy group containing an alkyl group having 1 or more and 6 or less carbon atoms is used. To be specific, a methoxy group is used.

The monovalent hydrocarbon group represented by B is the same monovalent hydrocarbon group as that illustrated by $R^6$ in formula (10).

When "n" is 0, the first silicon compound is represented by the following formula (12) and is defined as a trifunctional silicon compound containing three condensable substituted groups.

Formula (12):

$$R^7SiX^1_3 \qquad (12)$$

(where, in formula, $R^7$ or $SiR^7$ represents an addable substituted group and $X^1$ represents a condensable substituted group.)

Examples of the trifunctional silicon compound include a vinyltrimethoxysilane, a vinyltriethoxysilane, an allyltrimethoxysilane, a propenyltrimethoxysilane, a norbornenyltrimethoxysilane, an octenyltrimethoxysilane, a 3-acryloxypropyltrimethoxysilane, a 3-methacryloxypropyltriethoxysilane, a 3-methacryloxypropyltrimethoxysilane, a 3-glycidoxypropyltriethoxysilane, a 3-glycidoxypropyltrimethoxysilane, and a 2-(3,4-epoxycyclohexyl)ethyltrimethoxysilane.

These trifunctional silicon compounds can be used alone or in combination of two or more.

As the trifunctional silicon compound, preferably, a vinyltrimethoxysilane in which $R^7$ is a vinyl group and all of the $X^1$s are methoxy groups in the above-described formula (12) is used.

On the other hand, in the above-described formula (11), when "n" is 1, the first silicon compound is represented by the following formula (13) and is defined as a bifunctional silicon compound containing two condensable substituted groups.

Formula (13):

$$R^7SiBX^1_2 \qquad (13)$$

(where, in formula, $R^7$ or $SiR^7$ represents an addable substituted group; B represents a monovalent hydrocarbon group selected from a saturated hydrocarbon group and an aromatic hydrocarbon group; and $X^1$ represents a condensable substituted group.)

$R^7$, $SiR^7$, B, and $X^1$ are the same as those described above.

Examples of the bifunctional silicon compound include a vinyldimethoxymethylsilane, a vinyldiethoxymethylsilane, an allyldimethoxymethylsilane, a propenyldimethoxymethylsilane, a norbornenyldimethoxymethylsilane, an octenyldimethoxymethylsilane, an octenyldiethoxymethylsilane, a 3-acryloxypropyldimethoxymethylsilane, a 3-methacryloxypropyldimethoxymethylsilane, a 3-methacryloxypropyldimethoxymethylsilane, a 3-glycidoxypropyldimethoxymethylsilane, a 3-glycidoxypropyldimethoxymethylsilane, and a 2-(3,4-epoxycyclohexyl)ethyldimethoxymethylsilane.

These bifunctional silicon compounds can be used alone or in combination of two or more.

As the bifunctional silicon compound, preferably, a vinyldimethoxymethylsilane in which $R^7$ is a vinyl group, B is a methyl group, and all of the $X^1$s are methoxy groups in the above-described formula (13) is used.

A commercially available product can be used as the first silicon compound and a first silicon compound synthesized in accordance with a known method can be also used.

These first silicon compounds can be used alone or in combination of two or more.

To be specific, a trifunctional silicon compound is used alone, a bifunctional silicon compound is used alone, or a trifunctional silicon compound and a bifunctional silicon compound are used in combination. Preferably, a trifunctional silicon compound is used alone, and a trifunctional silicon compound and a bifunctional silicon compound are used in combination.

An example of the second silicon compound includes a polysiloxane containing at least two condensable substituted groups, to be specific, containing a condensable substituted group bonded to a silicon atom at the end of the main chain and/or a condensable substituted group bonded to a silicon atom in a side chain that branches off from the main chain.

Preferably, the second silicon compound contains a condensable substituted group bonded to the silicon atoms at both ends of the main chain (a bifunctional silicon compound).

The second silicon compound is a dual-end type polysiloxane (a bifunctional polysiloxane) represented by the following formula (14).

Formula (14):

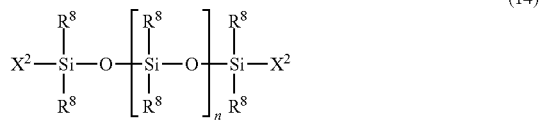

(14)

(where, in formula, $R^8$ represents a monovalent hydrocarbon group selected from a saturated hydrocarbon group and an aromatic hydrocarbon group; $X^2$ represents a condensable substituted group; and "n" represents an integer of 1 or more.)

In formula (14), an example of the monovalent hydrocarbon group represented by $R^8$ includes the monovalent hydrocarbon group illustrated by $R^6$ in the above-described formula (10). Preferably, methyl and phenyl are used.

In formula (14), an example of the condensable substituted group represented by $X^2$ includes the condensable substituted group illustrated by $R^6$ in the above-described formula (10). Preferably, a hydroxyl group and a hydrogen atom are used, or more preferably, a hydroxyl group is used.

When the condensable substituted group is a hydroxyl group, the dual-end type polysiloxane is defined as a polysiloxane containing silanol groups at both ends (a silicone oil containing silanol groups at both ends) represented by the following formula (15).

Formula (15):

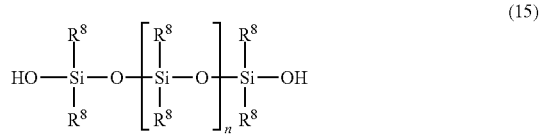

(15)

(where, in formula, $R^8$ represents a monovalent hydrocarbon group selected from a saturated hydrocarbon group and an aromatic hydrocarbon group. "n" represents an integer of 1 or more.)

$R^8$ is the same as that described above.

In the above-described formulas (14) and (15), "n" is, in view of stability and/or handling ability, preferably an integer of 1 or more and 10000 or less, or more preferably an integer of 1 or more and 1000 or less.

To be specific, examples of the dual-end type polysiloxane include a polydimethylsiloxane containing silanol groups at both ends, a polymethylphenylsiloxane containing silanol groups at both ends, and a polydiphenylsiloxane containing silanol groups at both ends.

A commercially available product can be used as the second silicon compound and a second silicon compound synthesized in accordance with a known method can be also used.

The number average molecular weight of the second silicon compound is, in view of stability and/or handling ability, for example, 100 or more, or preferably 200 or more, and is, for example, 1000000 or less, or preferably 100000 or less. The number average molecular weight is calculated by conversion based on standard polystyrene with a gel permeation chromatography. The number average molecular weight of materials, other than the second silicon compound, is also calculated in the same manner as described above.

In order to allow the first silicon compound and the second silicon compound to be partially subjected to condensation, a condensation material made of those is blended with a condensation catalyst.

The mixing ratio of the second silicon compound with respect to 100 parts by mass of the total amount of the first silicon compound and the second silicon compound (that is, the total amount of the condensation material) is, for example, 1 part by mass or more, preferably 50 parts by mass or more, or more preferably 80 parts by mass or more, and is, for example, 99.99 parts by mass or less, preferably 99.9 parts by mass or less, or more preferably 99.5 parts by mass or less.

The molar ratio ($X^2/X^1$) of the condensable substituted group ($X^2$ in the above-described formula (14), to be specific, a hydroxyl group) in the second silicon compound to the condensable substituted group ($X^1$ in the above-described formula (11), to be specific, an alkoxy group) in the first silicon compound is, for example, 20/1 or less, or preferably 10/1 or less, and is, for example, 1/5 or more, preferably 1/2 or more, or most preferably substantially 1/1.

When the molar ratio is above the above-described upper limit, in a case where the first polysiloxane is obtained by allowing the first and the second silicon compounds to be partially subjected to condensation and thereafter, the first and the second polysiloxanes are completely subjected to condensation, a silicone semi-cured material having an appropriate toughness may not be obtained. On the other hand, when the molar ratio is below the above-described lower limit, the mixing proportion of the first silicon compound is excessively large, so that the heat resistance of a silicone cured material to be obtained may be reduced.

When the molar ratio is within the above-described range (preferably, substantially 1/1), the condensable substituted group (to be specific, an alkoxy group) in the first silicon compound and the condensable substituted group (to be specific, a hydroxyl group) in the second silicon compound can be completely subjected to condensation neither too much nor too little.

When the trifunctional silicon compound and the bifunctional silicon compound are used in combination, the ratio (the number of parts by mass of the bifunctional silicon compound/the number of parts by mass of the trifunctional silicon compound) of the bifunctional silicon compound to the trifunctional silicon compound, based on mass, is, for example, 70/30 or less, or preferably 50/50 or less, and is, for example, 1/99 or more, or preferably 5/95 or more. When the trifunctional silicon compound and the bifunctional silicon compound are used in combination, the molar ratio ($X^2/X^1$) of the condensable substituted group ($X^2$ in the above-described formula (14), to be specific, a hydroxyl group) in the second silicon compound to the condensable substituted group ($X^1$ in the above-described formula (12), to be specific, an alkoxy group) in the trifunctional silicon compound is, for example, 20/1 or less, preferably 10/1 or less, and is, for example, 1/5 or more, preferably 1/2 or more, or most preferably substantially 1/1. On the other hand, when the trifunctional silicon compound and the bifunctional silicon compound are used in combination, the molar ratio ($X^2/X^1$) of the condensable substituted group ($X^2$ in the above-described formula (14), to be specific, a hydroxyl group) in the second silicon compound to the condensable substituted group ($X^1$ in the above-described formula (13), to be specific, an alkoxy group) in the bifunctional silicon compound is, for example, 20/1 or less, or preferably 10/1 or less, and is, for example, 1/5 or more, preferably 1/2 or more, or most preferably substantially 1/1.

The condensation catalyst is not particularly limited as long as it is a catalyst that promotes condensation of the first silicon compound with the second silicon compound. Examples of the condensation catalyst include an acid, a base, and a metal catalyst.

An example of the acid includes an inorganic acid (a Broensted acid) such as a hydrochloric acid, an acetic acid, a formic acid, and a sulfuric acid. The acid includes a Lewis acid and an example of the Lewis acid includes an organic Lewis acid such as pentafluorophenyl boron, scandium triflate, bismuth triflate, scandium trifurylimide, oxovanadium triflate, scandium trifurylmethide, and trimethylsilyl trifurylimide.

Examples of the base include an inorganic base such as potassium hydroxide, sodium hydroxide, and potassium carbonate and tetramethylammonium hydroxide. Preferably, an organic base such as tetramethylammonium hydroxide is used.

Examples of the metal catalyst include an aluminum-based catalyst, a titanium-based catalyst, a zinc-based catalyst, and a tin-based catalyst. Preferably, a tin-based catalyst is used.

Examples of the tin-based catalyst include a carboxylic acid tin salt such as di (or bis)(carboxylic acid)tin (II) containing a straight chain or branched chain carboxylic acid having 1 or more and 20 or less carbon atoms including di(2-ethylhexanoate)tin (II), dioctanoate tin (II) (dicaprylic acid tin (II)), bis(2-ethylhexanoate)tin, bis(neodecanoate)tin, and tin oleate and an organic tin compound such as dibutylbis (2,4-pentanedionate)tin, dimethyltindiversatate, dibutyltindiversatate, dibutyltindiacetate(dibutyldiacetoxytin), dibutyltindioctoate, dibutylbis(2-ethylhexylmaleate)tin, dioctyldilauryltin, dimethyldineodccanoatetin, dibutyltindioleate, dibutyltindilaulate, dioctyltindilaulate, dioctyltindiversatate, dioctyltinbis(mercaptoacetic acid isooctyl ester) salt, tetramethyl-1,3-diacetoxydistannoxane, bis(triethyltin) oxide, tetramethyl-1,3-diphenoxydistannoxane, bis (tripropyltin)oxide, bis(tributyltin)oxide, bis(triphenyltin) oxide, poly(dibutyltin maleate), diphenyltindiacetate, dibutyltin oxide, dibutyltindimethoxide, and dibutylbis(triethoxy)tin.

As the tin-based catalyst, preferably, a carboxylic acid tin salt is used, more preferably, di(carboxylic acid)tin (II) containing a straight chain or branched chain carboxylic acid having 1 or more and 20 or less carbon atoms is used, further more preferably, di(carboxylic acid)tin (II) containing a straight chain or branched chain carboxylic acid having 4 or more and 14 or less carbon atoms is used, or particularly preferably, di(carboxylic acid)tin (II) containing a branched chain carboxylic acid having 6 or more and 10 or less carbon atoms is used.

These condensation catalysts can be used alone or in combination.

A commercially available product can be used as the condensation catalyst. A condensation catalyst synthesized in accordance with a known method can be also used.

The condensation catalyst can be, for example, solved in a solvent to be prepared as a condensation catalyst solution. The concentration of the condensation catalyst in the condensation catalyst solution is adjusted to be, for example, 1 mass % or more and 99 mass % or less.

The mixing ratio of the condensation catalyst with respect to 100 mol of the second silicon compound is, for example, 0.001 mol or more, or preferably 0.01 mol or more, and is, for example, 50 mol or less, or preferably 5 mol or less.

Next, in this method, after the blending of the first silicon compound, the second silicon compound, and the condensation catalyst, the mixture is stirred and mixed at a temperature of, for example, 0° C. or more, or preferably 10° C. or more, and of, for example, 80° C. or less, or preferably 75° C. or less for, for example, 1 minute or more, or preferably 2 hours or more, and of, for example, 24 hours or less, or preferably 10 hours or less.

By the above-described mixing, the first and the second silicon compounds are partially subjected to condensation in the presence of the condensation catalyst.

To be specific, the condensable substituted group ($X^1$ in the above-described formula (11)) in the first silicon compound and the condensable substituted group ($X^2$ in the above-described formula (14)) in the second silicon compound are partially subjected to condensation.

To be more specific, when the condensable substituted group in the first silicon compound is an alkoxy group and the condensable substituted group in the second silicon compound is a hydroxyl group, as shown by the following formula (16), they are partially subjected to condensation.

Formula (16):

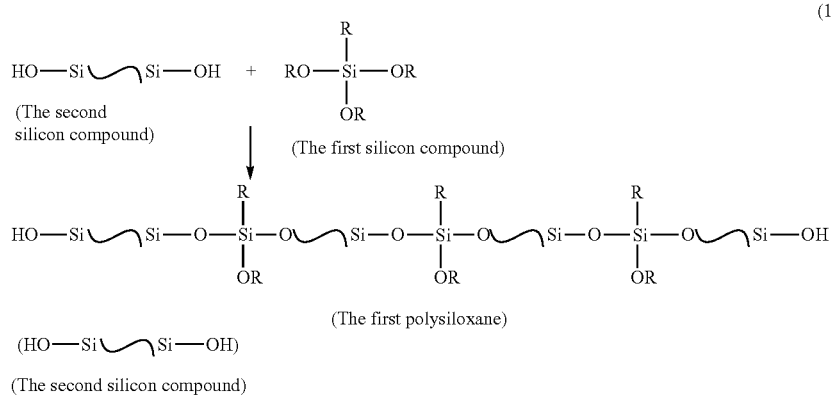

(16)

A portion in the second silicon compound is not subjected to condensation and remains to be subjected to condensation with the condensable substituted group in the first polysiloxane by next further condensation (a complete curing step).

The first polysiloxane obtained in this way is in a liquid state (in an oil state) and in an A-stage state.

An example of the second polysiloxane includes a side-chain type polysiloxane that is represented by the following formula (17) and contains at least one condensable substituted group in a side chain.

Formula (17):

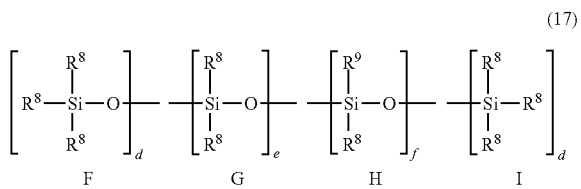

(17)

(where, in formula, F to I represent a constituent unit; F and I represent an end unit; and G and H represent a repeating unit. $R^8$ represents a monovalent hydrocarbon group selected from a saturated hydrocarbon group and an aromatic hydrocarbon group, and $R^9$ or $SiR^9$ represents an addable substituted group. "d" is 0 or 1, "e" is an integer of 0 or more, and "f" is an integer of 1 or more. All of the $R^8$s or the $R^9$s may be the same or different from each other.)

In formula (17), an example of the monovalent hydrocarbon group represented by $R^8$ includes the monovalent hydrocarbon group illustrated by $R^6$ in the above-described formula (10). Preferably, methyl and phenyl are used.

In formula (17), as the addable substituted group represented by $R^9$ or $SiR^9$, for example, the above-described addable substituted group is used; preferably, the other of the substituted groups constituting one pair of addable substituted groups is used; more preferably, a hydrosilyl group and an ethylenically unsaturated group-containing group (to be specific, a vinyl group) are used; or further more preferably, a hydrosilyl group is used.

When "d" is 1, the side-chain type polysiloxane is a straight chain polysiloxane and when "d" is 0, the side-chain type polysiloxane is a cyclic polysiloxane.

Preferably, "d" is 1.

"e" represents the number of repeating unit in the constituent unit G and is, in view of reactivity, preferably an integer of 0 or more, or more preferably an integer of 1 or more, and is preferably an integer of 100000 or less, or more preferably an integer of 10000 or less.

"f" represents the number of repeating unit in the constituent unit H and is, in view of reactivity, preferably an integer of 1 or more, or more preferably an integer of 2 or more, and is, preferably an integer of 100000 or less, or more preferably an integer of 10000 or less.

The number average molecular weight of the side-chain type polysiloxane is, for example, in view of stability and handling ability, 100 or more and 1000000 or less, or preferably 100 or more and 100000 or less.

To be specific, examples of the side-chain type polysiloxane include a methylhydrogenpolysiloxane, a methylvinylpolysiloxane, a dimethylpolysiloxane-co-methylhydrogenpolysiloxane, a dimethylpolysiloxane-co-vinylmethylpolysiloxane, an ethylhydrogenpolysiloxane, a methylhydrogenpolysiloxane-co-methylphenylpolysiloxane, a methylvinylpolysiloxane-co-methylphenylpolysiloxane, a 2,4,6,8-tetramethyl-2,4,6,8-tetravinylcyclotetrasiloxane, and a 1,3,5,7-tetramethylcyclotetrasiloxane.

These side-chain type polysiloxanes can be used alone or in combination of two or more.

Preferably, a straight chain side-chain type polysiloxane in which $R^8$ is a methyl group; $R^9$ is a hydrogen atom (that is, SiR⁹ is a hydrosilyl group) or a vinyl group; "d" is 1; "e" is an integer of 1 or more; and "h" is an integer of 2 or more is used.

An example of the second polysiloxane includes a dual-end type polysiloxane (a polysiloxane containing addable substituted groups at both ends) that is represented by the following formula (18) and contains the addable substituted groups at both ends of a molecule.

Formula (18):

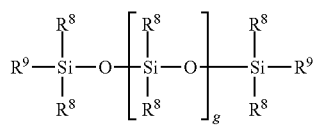

(where, in formula, $R^8$ represents a monovalent hydrocarbon group selected from a saturated hydrocarbon group and an aromatic hydrocarbon group; $R^9$ or $SiR^9$ represents an addable substituted group; and "g" represents an integer of 1 or more. All of the $R^8$s or the $R^9$s may be the same or different from each other.)

An example of the monovalent hydrocarbon group represented by $R^8$ includes the monovalent hydrocarbon group illustrated by $R^6$ in the above-described formula (10). Preferably, methyl and phenyl are used.

As the addable substituted group represented by $R^9$ or $SiR^9$, for example, the above-described addable substituted group is used; preferably, the other of the substituted groups constituting one pair of addable substituted groups is used; more preferably, a hydrosilyl group and an ethylenically unsaturated group-containing group (to be specific, a vinyl group) are used; or further more preferably, a hydrosilyl group is used.

"g" is, in view of reactivity, preferably an integer of 1 or more, or more preferably an integer of 2 or more, and is preferably an integer of 100000 or less, or more preferably an integer of 10000 or less.

The number average molecular weight of the dual-end type polysiloxane is, for example, in view of stability and handling ability, 100 or more and 1000000 or less, or preferably 100 or more and 100000 or less.

Examples of the dual-end type polysiloxane include a polydimethylsiloxane containing hydrosilyl groups at both ends, a polydimethylsiloxane containing vinyl groups at both ends, a polymethylphenylsiloxane containing hydrosilyl groups at both ends, a polymethylphenylsiloxane containing vinyl groups at both ends, a polydiphenylsiloxane containing hydrosilyl groups at both ends, a polydimethylsiloxane containing vinyl groups at both ends, and a polydiphenylsiloxane containing vinyl groups at both ends.

These dual-end type polysiloxanes can be used alone or in combination of two or more.

Preferably, a polydimethylsiloxane containing hydrosilyl groups at both ends (an organohydrogenpolysiloxane) or a polydimethylsiloxane containing vinyl groups at both ends in which all of the $R^8$s are methyl groups; $R^9$ is a hydrogen atom (that is, $SiR^9$ is a hydrosilyl group) or a vinyl group; and "g" is an integer of 2 or more and 10000 or less is used.

Of the above-described side-chain type polysiloxane and dual-end type polysiloxane, as the second polysiloxane, preferably, a dual-end type polysiloxane is used.

A commercially available product can be used as the second polysiloxane. A second polysiloxane synthesized in accordance with a known method can be also used.

In order to prepare the first silicone resin composition, the first polysiloxane and the second polysiloxane are blended. Preferably, the first polysiloxane and the second polysiloxane are blended with an addition catalyst.

The molar ratio ($R^7$/$SiR^9$) of the addable substituted group (one side, preferably a vinyl group ($R^7$ in formula (11)) in the first polysiloxane to the addable substituted group (the other side, preferably a hydrosilyl group ($SiR^9$ in formula (18)) in the second polysiloxane is, for example, 20/1 or less, preferably 10/1 or less, or more preferably 5/1 or less and is, for example, 1/20 or more, preferably 1/10 or more, or more preferably 1/5 or more.

The mixing ratio of the second polysiloxane with respect to 100 parts by mass of the total amount of the first polysiloxane and the second polysiloxane is, for example, 1 part by mass or more, preferably 50 parts by mass or more, or more preferably, 80 parts by mass or more, and is, for example, 99.99 parts by mass or less, preferably 99.9 parts by mass or less, or more preferably 99.5 parts by mass or less.

The addition catalyst is not particularly limited as long as it is a catalyst that promotes addition of the addable substituted group in the first polysiloxane with the addable substituted group in the second polysiloxane, to be specific, addition in the above-described formulas (6) to (9). Preferably, in view of promoting condensation by an active energy ray, a photocatalyst having active properties with respect to the active energy ray is used.

An example of the photocatalyst includes a hydrosilylation catalyst.

The hydrosilylation catalyst promotes a hydrosilylation addition reaction of a hydrosilyl group with an alkenyl group. An example of the hydrosilylation catalyst includes a transition element catalyst. To be specific, examples thereof include a platinum-based catalyst; a chromium-based catalyst (hexacarbonyl chromium ($Cr(CO)_6$ and the like); an iron-based catalyst (carbonyltriphenylphosphine iron (Fe(CO)$PPh_3$ and the like), tricarbonylbisphenylphosphine iron (trans-$Fe(CO)_3(PPh_3)_2$), polymer-substrate-(aryl-diphenylphosphine)5-n[carbonyl iron] (polymer substrate-(Ar—$PPh_3)_5$-n[$Fe(CO)_n$]), pentacarbonyl iron ($Fe(CO)_5$), and the like): a cobalt-based catalyst (tricarbonyltriethylsilylcobalt ($Et_3SiCo(CO)_3$), tetracarbonyltriphenylsilylcobalt ($Ph_3SiCo(CO)_4$), octacarbonylcobalt ($Co_2(CO)_8$), and the like); a molybdenum-based catalyst (hexacarbonylmolybdenum ($Mo(CO)_6$ and the like); a palladium-based catalyst; and a rhodium-based catalyst.

As the hydrosilylation catalyst, preferably, a platinum-based catalyst is used. Examples thereof include inorganic platinum such as platinum black, platinum chloride, and chloroplatinic acid and a platinum complex such as a platinum olefin complex, a platinum carbonyl complex, a platinum cyclopentadienyl complex, and a platinum acetylacetonate complex.

Preferably, in view of reactivity, a platinum complex is used, or more preferably, a platinum cyclopentadienyl complex and a platinum acetylacetonate complex are used.

Examples of the platinum cyclopentadienyl complex include trimethyl(methylcyclopentadienyl) platinum (IV) and a trimethyl(cyclopentadienyl) platinum (IV) complex.

An example of the platinum acetylacetonate complex includes 2,4-pentanedionato platinum (II) (platinum (II) acetylacetonate).

An example of the transition element catalyst can also include one described in the following document.

Document: ISSN 1070-3632, Russian Journal of General Chemistry, 2011, Vol. 81, No. 7, pp. 1480 to 1492, "Hydrosilylation on Photoactivated Catalysts", D. A. de Vekki These addition catalysts can be used alone or in combination.

A commercially available product can be used as the addition catalyst. An addition catalyst synthesized in accordance with a known method can be also used.

The addition catalyst can be, for example, solved in a solvent to be prepared as an addition catalyst solution. The concentration of the addition catalyst in the addition catalyst solution is, for example, 1 mass % or more and 99 mass % or less. When the addition catalyst is a transition element catalyst, the concentration of the transition element is adjusted to be, for example, 0.1 mass % or more and 50 mass % or less.

The mixing ratio of the addition catalyst with respect to 100 parts by mass of the total of the first silicone resin composition is, for example, $1.0 \times 10^{-11}$ parts by mass or more, or preferably, $1.0 \times 10^{-9}$ parts by mass or more, and is, for example, 0.5 parts by mass or less, or preferably 0.1 parts by mass or less.

The addition catalyst can be also used in combination with a photoassistance agent such as a photoactive agent, a photo-acid generator, and a photobase generator with an appropriate amount as required.

Each of the components containing the first polysiloxane and the second polysiloxane is blended at the above-described mixing proportion to be stirred and mixed, so that the first silicone resin composition can be obtained.

The first silicone resin composition contains a part of the second silicon compound that remains in the preparation of the first polysiloxane.

The first silicone resin composition obtained as described above is, for example, in a liquid state, or preferably, in an oil state (in a viscous liquid state). The viscosity thereof under conditions of 25° C. and one pressure is, for example, 100 mPa·s or more, or preferably 1000 mPa·s or more, and is, for example, 100000 mPa·s or less, or preferably 50000 mPa·s or less. The viscosity thereof is measured under the conditions of one pressure using a rheometer. The viscosity is measured by adjusting a temperature of the first silicone resin composition to 25° C. and using an E-type cone at a number of revolutions of 99 $s^{-1}$.

To be specific, in order to obtain the first silicone resin composition, first, the polydimethylsiloxane containing silanol groups at both ends, the vinyltrimethoxysilane, and the di(2-ethylhexanoate)tin (II) (the condensation catalyst) are blended to prepare the first polysiloxane in an oil state. Thereafter, the polydimethylsiloxane containing hydrosilyl groups at both ends (the second polysiloxane) and a solution of the trimethyl(methylcyclopentadienyl) platinum (IV) or the platinum (II) acetylacetonate (the addition catalyst) are blended thereto.

Alternatively, first, the polydimethylsiloxane containing silanol groups at both ends, the vinyltrimethoxysilane, and the di(2-ethylhexanoate)tin (II) (the condensation catalyst) are blended to prepare the first polysiloxane in an oil state. Thereafter, the polydimethylsiloxane containing hydrosilyl groups at both ends (the second polysiloxane) and a solution of the trimethyl(methylcyclopentadienyl) platinum (IV) complex or the platinum (II) acetylacetonate (the addition catalyst) are blended thereto.

[Second Silicone Resin Composition]

The second silicone resin composition contains a third polysiloxane containing at least one pair of condensable substituted groups that is capable of condensation by heating and at least one pair of addable substituted groups that is capable of addition by an active energy ray.

An example of the one pair of condensable substituted groups includes the same one pair of condensable substituted groups as that in the first polysiloxane in the first silicone resin composition. The one pair of condensable substituted groups is replaced with the end and the middle of the main chain and/or a side chain in the third polysiloxane.

An example of the one pair of addable substituted groups includes the same one pair of addable substituted groups as that in the first and the second polysiloxanes in the first silicone resin composition. The one pair of addable substituted groups is replaced with the end and the middle of the main chain and/or a side chain in the third polysiloxane.

The third polysiloxane is represented by, for example, the following formula (21).

Formula (21):

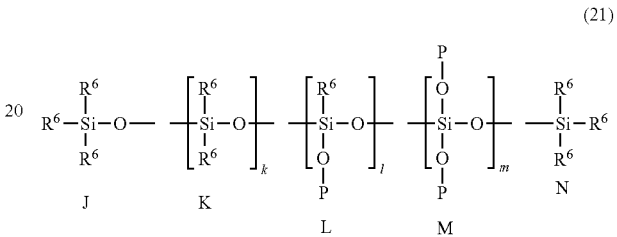

(where, in formula, $R^6$ represents a monovalent hydrocarbon group selected from a saturated hydrocarbon group and an aromatic hydrocarbon group; a condensable substituted group; and/or an addable substituted group. J to N represent a constituent unit, J and N represent an end unit, and K to M represent a repeating unit. P represents a constituent unit of K to M. "k"+"l"+"m" is an integer of 1 or more. $R^6$ contains at least one pair of condensable substituted groups and at least one pair of addable substituted groups.)

Examples of the monovalent hydrocarbon group, the condensable substituted group, and the addable substituted group represented by $R^6$ include the monovalent hydrocarbon group, the condensable substituted group, and the addable substituted group illustrated in the above-described formula (10), respectively.

"k"+"l"+"m" is, in view of stability and handling ability, preferably an integer of 1 or more and 100000 or less, or more preferably an integer of 1 or more and 10000 or less.

"k" is, for example, an integer of 0 or more, or preferably an integer of 1 or more, and is, for example, an integer of 100000 or less, or preferably an integer of 10000 or less.

"l" is, for example, an integer of 0 or more and 100000 or less, or preferably an integer of 0 or more and 10000 or less.

"m" is, for example, an integer of 0 or more and 100000 or less, or preferably an integer of 0 or more and 10000 or less.

The number average molecular weight of the third polysiloxane is, for example, 100 or more, or preferably 200 or more, and is, for example, 1000000 or less, or preferably 100000 or less.

A commercially available product can be used as the third polysiloxane. A third polysiloxane synthesized in accordance with a known method can be also used.

The content ratio of the third polysiloxane with respect to the second silicone resin composition is, for example, 60 mass % or more, or preferably 90 mass % or more, and is, for example, 100 mass % or less.

In order to obtain a silicone semi-cured material from the second silicone resin composition, under the same conditions as those of the first silicone resin composition, the third polysiloxane is heated with the condensation catalyst and thereafter, the addition catalyst is added thereto.

[Phosphor]

An example of the phosphor includes the same phosphor as that illustrated in the first embodiment. The mixing ratio of the phosphor with respect to 100 parts by mass of the active energy ray curable resin is, for example, 0.1 parts by mass or more, or preferably 0.5 parts by mass or more, and is, for example, 80 parts by mass or less, or preferably 50 parts by mass or less.

[Filler]

Furthermore, the phosphor resin composition can contain the filler. An example of the filler includes the same filler as that illustrated in the first embodiment. The mixing ratio of the filler with respect to 100 parts by mass of the active energy ray curable resin is, for example, 0.1 parts by mass or more, or preferably 0.5 parts by mass or more, and is, for example, 70 parts by mass or less, or preferably 50 parts by mass or less.

[Fabrication of Phosphor Sheet 5]

In order to fabricate the phosphor sheet 5, a first silicone resin composition or a second silicone resin composition in an A-stage state and a phosphor, and a filler, which is blended as required, are blended. The obtained mixture is applied to the surface of the release sheet 13 to be thereafter heated, so that the phosphor resin composition is prepared into a sheet shape. In the preparation of the first silicone resin composition or the second silicone resin composition in an A-stage state, the phosphor and the filler, which is blended as required, can be added at any timing of blending of the components or before, during, or after the reaction.

Examples of the release sheet 13 include a polymer film such as a polyethylene film and a polyester film (PET or the like), a ceramic sheet, and a metal foil. Preferably, a polymer film is used. The surface of the release sheet 13 can be also subjected to release treatment such as fluorine treatment.

In the application of the mixture, an application method such as a casting, a spin coating, or a roll coating is used.

The heating conditions are as follows: a heating temperature of, for example, 40° C. or more, or preferably 60° C. or more, and of, for example, 180° C. or less, or preferably 150° C. or less and a heating duration of, for example, 0.1 minutes or more, and of, for example, 180 minutes or less, or preferably 60 minutes or less.

When the heating conditions are within the above-described range, a low molecular weight component (for example, a solvent including water or the like) is surely removed to terminate condensation, so that the first silicone resin composition or the second silicone resin composition can be brought into a semi-cured state (a B-stage state).

When the mixture is prepared from the first silicone resin composition, at least one pair of condensable substituted groups contained in the first polysiloxane is subjected to condensation by the above-described heating. In this way, when the condensable substituted group in the first silicon compound is an alkoxy group and the condensable substituted group in the second silicon compound is a hydroxyl group, as shown in the following formula (19), the molecular weight of the first polysiloxane is increased, so that the first silicone resin composition is gelated. That is, the first silicone resin composition is brought into a semi-cured state (a B-stage state), so that a silicone semi-cured material is obtained.

Formula (19):

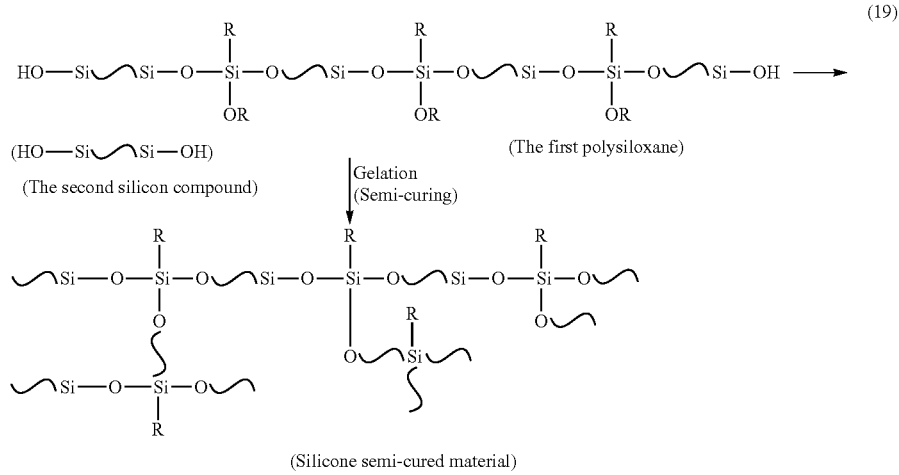

When the mixture is prepared from the second silicone resin composition, at least one pair of condensable substituted groups contained in the third polysiloxane is subjected to condensation by the above-described heating. In this way, the molecular weight of the third polysiloxane is increased, so that the second silicone resin composition is gelated. That is, the second silicone resin composition is brought into a semi-cured state (a B-stage state), so that a silicone semi-cured material is obtained.

In this way, the phosphor sheet 5 formed from the phosphor resin composition containing the silicone semi-cured material and the phosphor (and the filler blended as required) is obtained.

The phosphor sheet 5 has a compressive elastic modulus at 23° C. of, for example, 0.01 MPa or more, or preferably 0.04 MPa or more, and of, for example, 1.0 MPa or less.

When the compressive elastic modulus of the phosphor sheet 5 is not more than the above-described upper limit, sufficient flexibility can be secured. On the other hand, when the compressive elastic modulus of the phosphor sheet 5 is not less than the above-described lower limit, the excessive stress applied to the LEDs 4 is prevented and the LEDs 4 can be embedded.

The phosphor sheet 5 has a light transmittance at the wavelength of 400 nm or less of, for example, 50% or more, or preferably 60% or more.

When the light transmittance of the phosphor sheet 5 is not less than the above-described lower limit, the light transmission properties can be surely secured and the LED device 15 (described later) having excellent brightness can be obtained.

The thickness T3 of the phosphor sheet 5 before compressive bonding is, for example, 10 μm or more, or preferably 100 μm or more, and is, for example, 5000 μm or less, or preferably 2000 μm or less.

In this way, as shown by the upper side view in FIG. 17 (a), the phosphor sheet 5 that is laminated on the release sheet 13 is fabricated (prepared).

Thereafter, the fabricated phosphor sheet 5 is disposed so as to cover the top-side portions of a plurality of the LEDs 4 and to form the space 30 that is communicated with each other between the LEDs 4 that are adjacent to each other.

Thereafter, as shown by the phantom lines in FIG. 17 (b), the release sheet 13 is peeled from the phosphor sheet 5 as required.

<LED Encapsulating Step>

After the phosphor sheet disposing step, as shown by the arrow in FIG. 17 (c), an active energy ray is applied to the phosphor sheet 5 in the LED encapsulating step.

Examples of the active energy ray include an ultraviolet ray and an electron beam. An example of the active energy ray also includes an active energy ray having a spectral distribution in a wavelength region of, for example, 180 nm or more, or preferably 200 nm or more, and of, for example, 460 nm or less, or preferably 400 nm or less.

In the application of the active energy ray, an application device is used. Examples thereof include a chemical lamp, an excimer laser, a black light, a mercury arc, a carbon arc, a low pressure mercury lamp, a medium pressure mercury lamp, a high pressure mercury lamp, an extra-high pressure mercury lamp, and a metal halide lamp. Also, an example thereof includes an application device capable of generating an active energy ray that is in the longer wavelength side or in the shorter wavelength side than in the above-described wavelength region.

The amount of irradiation is, for example, 0.001 J/cm$^2$ or more, and is, for example, 100 J/cm$^2$ or less, or preferably 10 J/cm$^2$ or less.

The irradiation duration is, for example, 10 minutes or less, or preferably 1 minute or less, and is, for example, 5 seconds or more.

The active energy ray is applied from the top side and/or the back side toward the phosphor sheet 5. Preferably, as shown by the arrow in FIG. 17 (c), the active energy ray is applied from the top side toward the phosphor sheet 5.

In the application of the active energy ray toward the phosphor sheet 5, when the support sheet 32 is an active energy ray irradiation release sheet, the active energy ray irradiation release sheet and the irradiation conditions are selected so as not to reduce the pressure-sensitive adhesive force of the support sheet 32 by application of the active energy ray to the phosphor sheet 5.

Along with the above-described application of the active energy ray, heating can be also performed.

The timing of the heating may be at the same time with the application of the active energy ray, or before or after the application of the active energy ray. Preferably, the heating is performed after the application of the active energy ray.

The heating conditions are as follows: a temperature of, for example, 50° C. or more, or preferably 100° C. or more, and of, for example, 250° C. or less, or preferably 200° C. or less, and a heating duration of, for example, 0.1 minutes or more, and of, for example, 1440 minutes or less, or preferably 180 minutes or less.

The phosphor sheet 5 is completely cured by the above-described application of the active energy ray (and heating performed as required) to be brought into a C-stage state.

To be specific, when the silicone semi-cured material is prepared from the first silicone resin composition, as shown by the following formula (20), in a case where the addable substituted group in the first polysiloxane is a vinyl group and the addable substituted group in the second polysiloxane is a hydrosilyl group, they are subjected to addition (hydrosilylation addition) by application of the active energy ray (and heating performed as required).

Formula (20):

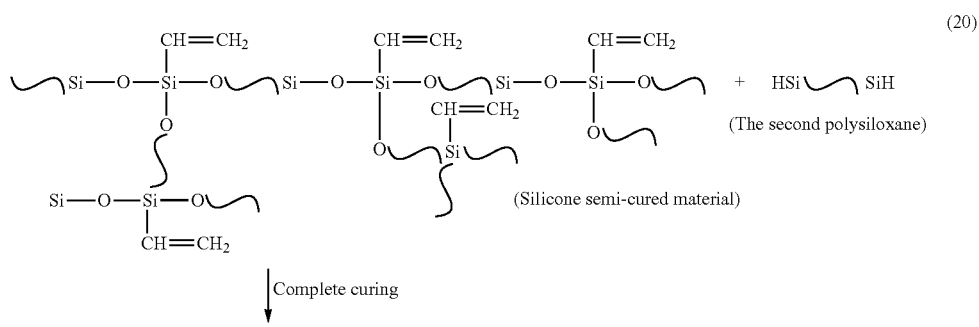

-continued

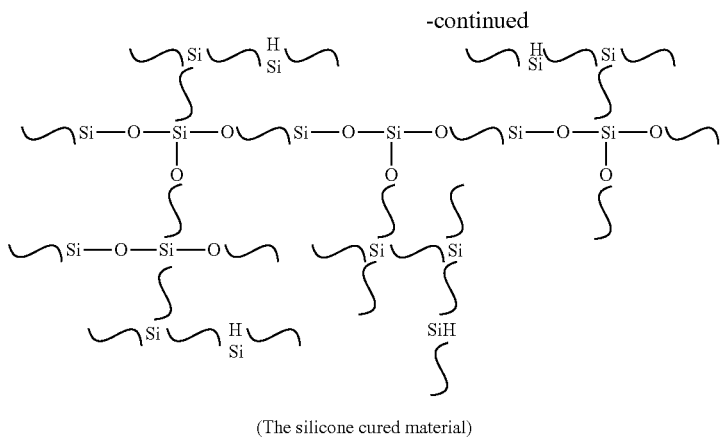

(The silicone cured material)

Alternatively, when the silicone semi-cured material is prepared from the second silicone resin composition, in a case where the addable substituted group in the third polysiloxane is a vinyl group and a hydrosilyl group, they are subjected to addition (hydrosilylation addition) by application of the active energy ray (and heating performed as required).

In this way, the silicone semi-cured material is completely cured. That is, the phosphor sheet 5 is completely cured (brought into a C-stage state).

The degree of progress of the addition in the complete curing can be checked with the peak strength derived from the addable substituted group with, for example, a solid NMR measurement.

The phosphor sheet 5 that is brought into a C-stage state (completely cured) has flexibility. To be specific, the phosphor sheet 5 that is brought into a C-stage state (completely cured) has a compressive elastic modulus at 23° C. of, for example, 0.5 MPa or more, or preferably 1.0 MPa or more, and of, for example, 100 MPa or less, or preferably 10 MPa or less.

When the compressive elastic modulus of the phosphor sheet 5 is not more than the above-described upper limit, the flexibility can be surely secured and in the cutting step (ref: the dashed lines in FIG. 17 (d)) to be described next, for example, the phosphor sheet 5 can be cut using a relatively cheap cutting device. When the compressive elastic modulus of the phosphor sheet 5 is not less than the above-described lower limit, the shape thereof after being cut can be retained.

In this way, the top-side portions of the side surfaces 26 of the LEDs 4 and the top surfaces 23 thereof are covered with the phosphor sheet 5 in close contact with each other. That is, the top-side portions of the LEDs 4 are encapsulated by the phosphor sheet 5 in a C-stage state.

<Cutting Step>

After the LED encapsulating step, as shown by the dashed lines in FIG. 17 (d), in the cutting step, the flexible phosphor sheet 5 around the LEDs 4 is cut along the top-back direction. The phosphor sheet 5 is, for example, cut into a generally rectangular shape in plane view that surrounds each of the LEDs 4.

In this way, the phosphor layer-covered LEDs 10, each of which includes the LED 4 having the back surface 22 for being mounted on the board 9 and the top surface 23 disposed at the top side (the other side in the top-back direction, that is, the opposite side) of the back surface 22 and the phosphor layer 7 that is formed of the phosphor sheet 5 covering and encapsulating the top surface 23 of the LED 4 and the top-side portions of the side surfaces 26 thereof, are obtained in a state where the LEDs 4 are in close contact with the support sheet 32.

<LED Peeling Step>

After the cutting step, as shown in FIG. 17 (e), the support sheet 32 is stretched in the plane direction and each of the phosphor layer-covered LEDs 10 is peeled from the support sheet 32.

To be specific, first, as shown by the arrows in FIG. 17 (d), the support sheet 32 is stretched outwardly in the plane direction. In this way, as shown in FIG. 17 (e), in a state where the phosphor layer-covered LEDs 10 are in close contact with the support sheet 32, the tensile stress is concentrated in the cuts 8; thus, the cuts 8 expand; and the LEDs 4 are separated from each other, so that the gaps 19 are formed. Each of the gaps 19 is formed into a generally grid shape in plane view so as to separate the LEDs 4.

Thereafter, each of the phosphor layer-covered LEDs 10 is peeled from the top surface of the support sheet 32.

To be specific, as shown in FIG. 17 (e'), for example, each of the phosphor layer-covered LEDs 10 is peeled from the support sheet 32 with the pick-up device 17 that is provided with the pressing member 14 such as a needle and the absorbing member 16 such as a collet. In the pick-up device 17, the pressing member 14 presses (pushes up) the support sheet 32 corresponding to the phosphor layer-covered LED 10 that is intended to be peeled off from the back side thereof. In this way, the phosphor layer-covered LED 10 that is intended to be peeled off is pushed up toward the top side, and the pushed-up phosphor layer-covered LED 10 is peeled from the support sheet 32, while being absorbed by the absorbing member 16 such as a collet.

When the support sheet 32 is stretched in the plane direction, the gap 19 is formed between the phosphor layer-covered LED 10 that is intended to be peeled off and the phosphor layer-covered LED 10 that is adjacent thereto. Thus, it can be prevented that when the absorbing member 16 is brought into contact with the phosphor layer-covered LED 10 that is intended to be peeled off, the absorbing member 16 comes in contact with the phosphor layer-covered LED 10 that is adjacent thereto to cause a damage to the phosphor layer-covered LED 10.

When the above-described support sheet 32 is a thermal release sheet, instead of the stretching of the support sheet 32 described above or in addition to the stretching of the support sheet 32, the support sheet 32 can be also heated at, for example, 50° C. or more, or preferably 70° C. or more, and at, for example, 200° C. or less, or preferably 150° C. or less.

When the above-described support sheet 32 is an active energy ray irradiation release sheet, instead of the stretching of the support sheet 32 described above or in addition to the stretching of the support sheet 32, an active energy ray can be also applied to the support sheet 32.

The pressure-sensitive adhesive force of the support sheet 32 is reduced by those treatments, so that each of the phosphor layer-covered LEDs 10 can be further easily peeled from the support sheet 32.

In this way, as shown in FIG. 17 (e), each of the phosphor layer-covered LEDs 10 that is peeled from the support sheet 32 is obtained.

<Mounting Step>

After the LED peeling step, after the phosphor layer-covered LED 10 is selected in accordance with emission wavelength and luminous efficiency, as shown in FIG. 17 (f), the selected phosphor layer-covered LED 10 is mounted on the board 9. In this way, the LED device 15 is obtained.

Thereafter, as shown by the phantom line in FIG. 17 (f), the encapsulating protective layer 20 that encapsulates the phosphor layer-covered LED 10 is provided in the LED device 15 as required. In this way, the reliability of the LED device 15 can be improved.

In the method for producing the phosphor layer-covered LED 10 in the seventh embodiment, the phosphor sheet 5 that is formed from a phosphor resin composition containing an active energy ray curable resin, which is capable of being cured by application of an active energy ray, and a phosphor is disposed on the top-side portions of the LEDs 4 so as to cover the top-side portions of the LEDs 4 and to allow the back surface 24 of the phosphor sheet 5 to serve as the exposed surface 27 that is positioned as described above. Thereafter, the active energy ray is applied to the phosphor sheet 5 and the top-side portions of the LEDs 4 are encapsulated by the phosphor sheet 5. Thus, a damage to the support sheet 32 is suppressed and the top-side portions of the LEDs 4 are encapsulated, so that the phosphor is capable of being uniformly dispersed around the LEDs 4.

That is, the phosphor sheet 5 is cured by application of the active energy ray thereto without heating the phosphor sheet 5 or by reducing the heating thereof, so that the top-side portions of the LEDs 4 can be encapsulated. Thus, the support sheet 32 that supports the phosphor sheet 5 is not required to have heat resistance, that is, the support sheet 32 having low heat resistance can be used.

Additionally, when the phosphor sheet 5 is completely cured, the irradiation duration for applying an active energy ray can be set to be short, compared to a case where the phosphor sheet 5 is completely cured by heating only.

Also, by cutting the phosphor sheet 5 corresponding to each of the LEDs 4, the phosphor layer-covered LEDs 10, each of which includes the LED 4 and the phosphor layer 7 that is formed of the phosphor sheet 5 covering the top surface 23 of the LED 4 and the top-side portions of the side surfaces 26 thereof, are obtained. Thereafter, each of the phosphor layer-covered LEDs 10 is peeled from the support sheet 32. Thus, the phosphor sheet 5 supported by the support sheet 32 in which a damage is suppressed is cut with excellent size stability, so that the phosphor layer-covered LED 10 having excellent size stability can be obtained.

When the phosphor sheet 5 is cut while being supported by the support sheet 32 in the cutting step and thereafter, the support sheet 32 is heated in the LED peeling step, the support sheet 32 that supports the phosphor sheet 5 in the cutting step and completes its role is heated and then, each of the phosphor layer-covered LEDs 10 is peeled off. In this way, the phosphor layer-covered LED 10 having excellent size stability can be efficiently obtained.

Consequently, the phosphor layer-covered LED 10 has excellent size stability.

The LED device 15 includes the phosphor layer-covered LED 10 having excellent size stability, so that it has excellent reliability and thus, its luminous efficiency is improved.

Modified Example

In the above-described seventh embodiment, the support sheet 32 is formed of one layer. Alternatively, for example, though not shown, the support sheet 32 can be also formed of two layers of a hard support board that is incapable of stretching in the plane direction and a pressure-sensitive adhesive layer that is laminated on the top side of the support board.

Examples of a hard material for forming the support board include an oxide such as a silicon oxide (silica or the like) and a metal such as stainless steel. The thickness of the support board is, for example, 0.1 mm or more, or preferably 0.3 mm or more, and is, for example, 5 mm or less, or preferably 2 mm or less.

The pressure-sensitive adhesive layer is formed on the entire top surface of the support board. An example of a pressure-sensitive adhesive material for forming the pressure-sensitive adhesive layer includes a pressure-sensitive adhesive such as an acrylic pressure-sensitive adhesive. The thickness of the pressure-sensitive adhesive layer is, for example, 0.1 mm or more, or preferably 0.2 mm or more, and is, for example, 1 mm or less, or preferably 0.5 mm or less.

Preferably, as shown by the upper side view in FIG. 17 (a), the support sheet 32 that is capable of stretching in the plane direction is formed of one layer.

According to this, in the LED peeling step shown in FIG. 17 (e), the support sheet 32 is stretched in the plane direction and each of the phosphor layer-covered LEDs 10 is peeled from the support sheet 32. Thus, as shown in FIG. 17 (e'), the phosphor layer-covered LED 10 can be easily and surely peeled from the support sheet 32 using the above-described pick-up device 17.

A hard support board is not provided in the support sheet 32, so that as referred in FIG. 17 (e'), the support sheet 32 and the corresponding phosphor layer-covered LED 10 can be pushed up from the back side by the pressing member 14 in the pick-up device 17.

Additionally, a hard support board is not required to be laminated on the pressure-sensitive adhesive layer, so that the production process can be simplified.

Eighth Embodiment

In FIG. 18, the same reference numerals are provided for members and steps corresponding to each of those in the first to seventh embodiments, and their detailed description is omitted.

The method for producing the phosphor layer-covered LED 10 in the eighth embodiment includes a support sheet preparing step of preparing the support sheet 1 (ref: FIG. 18 (a)); an LED attaching step of attaching the LEDs 4 to the support board 2 via the pressure-sensitive adhesive layer 3 (one example of a semiconductor element disposing step, ref: FIG. 18 (b)); an LED encapsulating step of encapsulating the top-side portions of the LEDs 4 by the phosphor sheet 5 (ref: FIGS. 18 (c) and 18 (d)); a cutting step of cutting the phosphor sheet 5 corresponding to each of the LEDs 4 (ref: the dashed lines in FIG. 18 (d)); and an LED peeling step of peeling the phosphor layer-covered LEDs 10 from the pressure-sensitive adhesive layer 3 (ref: FIG. 18 (*e*)). The method for producing the LED device 15 in the eighth embodiment includes a mounting step (ref: FIG. 18 (*f*)).

In the following, the steps of the eighth embodiment are described in detail.

<Support Sheet Preparing Step>

As shown in FIG. 18 (*a*), the support sheet 1 includes the support board 2 and the pressure-sensitive adhesive layer 3 that is laminated on the top surface of the support board 2.

An example of the support board 2 includes the same support board 2 as that illustrated in the first embodiment.

The pressure-sensitive adhesive layer 3 is formed from a material in which the pressure-sensitive adhesive force is capable of being reduced by application of an active energy ray as an active energy ray irradiation release layer (sheet). To be specific, the pressure-sensitive adhesive layer 3 is formed of a pressure-sensitive adhesive layer such as an acrylic pressure-sensitive adhesive layer. Also, the pressure-sensitive adhesive layer 3 can be formed of, for example, the active energy ray irradiation release layer (sheet) described in Japanese Unexamined Patent Publication No. 2001-308116.

The thickness of the pressure-sensitive adhesive layer 3 is, for example, 0.01 mm or more, or preferably 0.02 mm or more, and is, for example, 1 mm or less, or preferably 0.5 mm or less.

In order to prepare the support sheet 1, for example, the support board 2 is attached to the pressure-sensitive adhesive layer 3. The thickness of the support sheet 1 is, for example, 0.2 mm or more, or preferably 0.5 mm or more, and is, for example, 6 mm or less, or preferably 2.5 mm or less.

<LED Attaching Step>

The LED attaching step is performed after the support sheet preparing step.

In the LED attaching step, as shown by the lower side view in FIG. 18 (*b*), for example, a plurality of the LEDs 4 are attached to the top surface of the pressure-sensitive adhesive layer 3 in alignment. To be specific, a plurality of the LEDs 4 are attached to the top surface of the pressure-sensitive adhesive layer 3 so that a plurality of the LEDs 4 are spaced apart from each other at equal intervals in the front-rear and the right-left directions in plane view. The back surfaces 22 of the LEDs 4 are attached to the top surface of the pressure-sensitive adhesive layer 3 so that the bumps (ref: the numeral 22 in FIG. 20) that are, though not shown, provided on the back surfaces 22 are opposed to the top surface of the pressure-sensitive adhesive layer 3. In this way, the LEDs 4 are supported at (pressure-sensitively adhere to) the top surface of the pressure-sensitive adhesive layer 3 so that the alignment state thereof is retained.

<LED Encapsulating Step>

The LED encapsulating step is performed after the LED attaching step.

In the upper side view in FIG. 18 (*b*), the phosphor sheet 5 is formed from the same phosphor resin composition as that in the first embodiment into a sheet shape extending in the plane direction.

As shown in FIG. 18 (*c*), in order to encapsulate the top-side portions of the LEDs 4 by the phosphor sheet 5, first, as shown by the upper side view in FIG. 18 (*b*), the phosphor sheet 5 is prepared.

Next, as shown in FIG. 18 (*c*), the phosphor sheet 5 is disposed on the top-side portions of the LEDs 4 so as to cover the top-side portions of the LEDs 4 and to allow the back surface 24 of the phosphor sheet 5 to serve as the exposed surface 27 that is positioned as described above (the phosphor sheet disposing step as one example of an encapsulating sheet disposing step).

Thereafter, as shown by the phantom lines in FIG. 18 (*c*), the release sheet 13 is peeled from the top surface 25 of the phosphor sheet 5.

Thereafter, as shown in FIG. 18 (*d*), the phosphor sheet 5 is cured. When the curable resin is a thermosetting resin, the phosphor sheet 5 is thermally cured. To be specific, the phosphor sheet 5 is heated at, for example, 80° C. or more, or preferably 100° C. or more, and at, for example, 200° C. or less, or preferably 180° C. or less.

When the thermosetting resin contains a two-step curable type silicone resin and the phosphor sheet 5 that embeds the LEDs 4 is in a B-stage state, the phosphor sheet 5 is completely cured to be brought into a C-stage state by the above-described heating.

When the thermosetting resin contains a one-step curable type silicone resin, the phosphor sheet 5 is completely cured to be brought into a C-stage state by the above-described heating.

Alternatively, when the curable resin is an active energy ray curable resin, an active energy ray is applied to the phosphor sheet 5 from the top side. When the active energy ray is applied from the top side, the curable resin and the irradiation conditions are selected so as not to reduce the pressure-sensitive adhesive force of the pressure-sensitive adhesive layer 3 by application of the active energy ray.

The cured (completely cured) phosphor sheet 5 has flexibility. The phosphor sheet 5 has a light transmittance at the wavelength of 400 nm or less of, for example, 50% or more, or preferably 60% or more. When the light transmittance of the phosphor sheet 5 is not less than the above-described lower limit, the transmission properties of the active energy ray in the phosphor layer 7 is secured, so that the active energy ray is capable of transmitting through the phosphor layer 7 to reach the pressure-sensitive adhesive layer 3. At the same time, the LED device 15 (described later) having excellent brightness can be obtained.

In this way, the top-side portions of the side surfaces 26 of the LEDs 4 and the top surfaces 23 thereof are covered with the phosphor sheet 5 in close contact with each other. That is, the top-side portions of the LEDs 4 are encapsulated by the phosphor sheet 5 in a C-stage state.

<Cutting Step>

After the LED encapsulating step, as shown by the dashed lines in FIG. 18 (*d*), in the cutting step, the phosphor sheet 5 around the LEDs 4 is cut along the top-back direction. As shown by the dash-dot lines in FIG. 3, the phosphor sheet 5 is, for example, cut into a generally rectangular shape in plane view that surrounds each of the LEDs 4.

By the cutting step, the phosphor layer-covered LEDs 10, each of which includes the LED 4 having the back surface 22 for being mounted on the board 9 and the top surface 23 disposed at the top side (the other side in the top-back direction, that is, the opposite side) of the back surface 22 and the phosphor layer 7 that is formed of the phosphor sheet 5 covering and encapsulating the top surface 23 of the LED 4 and the top-side portions of the side surfaces 26 thereof, are obtained in a state where the LEDs 4 are in close contact with the support sheet 1. That is, the phosphor sheets 5 are singulated corresponding to each of the LEDs 4. The properties (light transmittance and the like) of the phosphor layer 7 are the same as those of the phosphor sheet 5.

<LED Peeling Step>

After the cutting step, as shown in FIG. 18 (e), in the LED peeling step, each of the phosphor layer-covered LEDs 10 is peeled from the top surface of the pressure-sensitive adhesive layer 3.

In order to peel each of the phosphor layer-covered LEDs 10 from the top surface of the pressure-sensitive adhesive layer 3, first, as shown by a down arrow in FIG. 18 (e), an active energy ray is applied from the top side to the pressure-sensitive adhesive layer 3 via the phosphor sheet 5.

Examples of the active energy ray include an ultraviolet ray and an electron beam. An example of the active energy ray also includes an active energy ray having a spectral distribution in a wavelength region of, for example, 180 nm or more, or preferably 200 nm or more, and of, for example, 460 nm or less, or preferably 400 nm or less.

In the application of the active energy ray, an application device is used. Examples thereof include a chemical lamp, an excimer laser, a black light, a mercury arc, a carbon arc, a low pressure mercury lamp, a medium pressure mercury lamp, a high pressure mercury lamp, an extra-high pressure mercury lamp, and a metal halide lamp. Also, an example thereof includes an application device capable of generating an active energy ray that is in the longer wavelength side or in the shorter wavelength side than in the above-described wavelength region.

The amount of irradiation is, for example, 0.001 J/cm$^2$ or more, or preferably 0.01 J/cm$^2$ or more, and is, for example, 100 J/cm$^2$ or less, or preferably 10 J/cm$^2$ or less. When the amount of irradiation is not less than the above-described lower limit, the pressure-sensitive adhesive force of the pressure-sensitive adhesive layer 3 can be surely and efficiently reduced. On the other hand, when the amount of irradiation is not more than the above-described upper limit, an increase in cost can be suppressed and a damage to a device can be effectively prevented.

The irradiation duration is, for example, 10 minutes or less, or preferably 1 minute or less, and is, for example, 5 seconds or more. When the upper limit of the irradiation duration is not more than the above-described upper limit, the duration required for the LED peeling step can be shortened.

All or a part of the active energy ray transmits through the phosphor layer 7 from the top side to be applied to the pressure-sensitive adhesive layer 3.

By the application of the active energy ray, the pressure-sensitive adhesive force of the pressure-sensitive adhesive layer 3 is reduced.

In this state, as shown by an up arrow in FIG. 18 (e), each of the phosphor layer-covered LEDs 10 is peeled from the pressure-sensitive adhesive layer 3. In order to peel each of the phosphor layer-covered LEDs 10 from the pressure-sensitive adhesive layer 3, though not shown, a pick-up device that is provided with an absorbing member such as a collet can be used as required. To be specific, each of the phosphor layer-covered LEDs 10 can be peeled from the pressure-sensitive adhesive layer 3, while being absorbed by an absorbing member.

In the peeling of each of the phosphor layer-covered LEDs 10 from the pressure-sensitive adhesive layer 3, the back surface 22 of each of the LEDs 4 is peeled from the top surface of the pressure-sensitive adhesive layer 3.

In this way, each of the phosphor layer-covered LEDs 10 that is peeled from the pressure-sensitive adhesive layer 3 is obtained.

[Mounting Step]

After the LED peeling step, after the phosphor layer-covered LED 10 is selected in accordance with emission wavelength and luminous efficiency, as shown in FIG. 18 (f), the selected phosphor layer-covered LED 10 is mounted on the board 9. In this way, the LED device 15 is obtained.

In this way, the LED device 15 including the board 9 and the phosphor layer-covered LED 10 that is mounted on the board 9 is obtained.

Thereafter, as shown by the phantom line in FIG. 18 (f), the encapsulating protective layer 20 that encapsulates the phosphor layer-covered LED 10 is provided in the LED device 15 as required. In this way, the reliability of the LED device 15 can be improved.

According to the method in the eighth embodiment, in the LED peeling step, an active energy ray is applied from the top side to the pressure-sensitive adhesive layer 3 via the phosphor sheet 5. Then, the active energy ray transmits through the phosphor sheet 5 to be applied to the pressure-sensitive adhesive layer 3. Thus, it is not required that the support board 2 is formed from a board material that allows an active energy ray to transmit therethrough and the active energy ray is allowed to transmit through the support board 2. As a result, as the support board 2, not only a support board having active energy ray transmissive properties is used, but also a support board having active energy ray blocking properties can be selected.

After the cutting step, the LED peeling step is performed. That is, in the cutting step, the LEDs 4 and the phosphor sheet 5 are supported by the support sheet 1 including the hard support board 2 and the phosphor sheet 5 can be cut. Thus, the phosphor layer-covered LED 10 having excellent size stability can be obtained.

Furthermore, in this method, in the LED peeling step, an active energy ray is applied to the pressure-sensitive adhesive layer 3, so that a deformation of the support sheet 1 caused by heating is prevented and the size stability can be further improved, compared to a method in which the pressure-sensitive adhesive force of the pressure-sensitive adhesive layer 3 is reduced by heating of the pressure-sensitive adhesive layer 3.

Consequently, the phosphor layer-covered LED 10 has excellent size stability.

The LED device 15 includes the phosphor layer-covered LED 10 having excellent size stability, so that it has excellent reliability and thus, its luminous efficiency is improved.

Modified Example

In the LED peeling step in the embodiment in FIG. 18 (e), an active energy ray is applied from the top side only to the pressure-sensitive adhesive layer 3. However, in the eighth embodiment, an active energy ray may be applied at least from the top side. For example, when the support board 2 is formed from an active energy ray transmissive material or an active energy ray semi-transmissive material, an active energy ray can be also applied from both sides of the top side and the back side to the pressure-sensitive adhesive layer 3. In such a case, of the active energy ray applied from the back side of the support sheet 1, all or a part of the active energy ray transmits through the support board 2 to reach the pressure-sensitive adhesive layer 3.

According to the modified example, in the LED peeling step, a duration required for reducing the pressure-sensitive adhesive force of the pressure-sensitive adhesive layer 3, that is, the irradiation duration of an active energy ray can be further shortened and the production efficiency of the phosphor layer-covered LED 10 can be improved.

Ninth Embodiment

In FIG. 19, the same reference numerals are provided for members and steps corresponding to each of those in the first to eighth embodiments, and their detailed description is omitted.

In the first to eighth embodiments, first, the phosphor layer-covered LED 10 is fabricated and prepared (ref: FIGS. 2 (e), 11 (e), 13 (f), 14 (g), 15 (h), 16 (i), 17 (e), and 18 (e)) and thereafter, the LED 4 in the phosphor layer-covered LED 10 is mounted on the board 9 (ref: FIGS. 2 (f), 11 (f), 13 (g), 14 (h), 15 (i), 16 (j), 17 (f), and 18 (f)).

Alternatively, as referred in FIG. 19, as shown in FIG. 19 (a), a plurality of the LEDs 4 are mounted on the board 9 in advance and thereafter, as shown in FIG. 19 (b), the phosphor sheet 5 can be disposed on the top-side portions of the LEDs 4 so as to cover the top-side portions of a plurality of the LEDs 4 and to allow the back surface 24 of the phosphor sheet 5 to serve as the exposed surface 27 that is positioned as described above.

In the ninth embodiment, as shown in FIG. 19 (a), a plurality of the LEDs 4 are mounted on the board 9 in advance so as to be spaced apart from each other at equal intervals in the front-rear and the right-left directions.

Thereafter, the phosphor sheet 5 is disposed on the top side of the board 9 so that the back surface 24 of the phosphor sheet 5 serves as the exposed surface 27 that is positioned as described above. In order to dispose the phosphor sheet 5, first, the phosphor sheet 5 is prepared. Then, as shown in FIG. 19 (b), the phosphor sheet 5 is compressively bonded to the top-side portions of a plurality of the LEDs 4. The compressive bonding is performed under a reduced pressure atmosphere or under a normal pressure atmosphere. Preferably, in view of simplifying the process, the compressive bonding is performed under a normal pressure atmosphere. In this way, the space 30 is formed. Thereafter, when the phosphor sheet 5 contains a curable resin, the phosphor sheet 5 is cured, so that the top-side portions of a plurality of the LEDs 4 are encapsulated.

In this way, the phosphor layer-covered LEDs 10 are formed on the top side of the board 9 and the LED device 15, which includes the board 9, a plurality of the LEDs 4, and the phosphor sheet 5, is obtained.

Thereafter, as shown by the phantom line in FIG. 19 (b), after the encapsulating protective layer 20 is provided as required, the LED devices 15 can be also singulated corresponding to each of the LEDs 4. Along with the production of the LED device 15, the phosphor layer-covered LED 10 is fabricated.

In the ninth embodiment, the phosphor layer-covered LED 10 is not required to be selected in accordance with emission wavelength and luminous efficiency and the LEDs 4 are mounted on the board 9 in advance, so that the step of selection of the phosphor layer-covered LED 10 described above can be omitted.

[Description of Top Surface and Back Surface of LED]

In the first to ninth embodiments, the LED 4 is formed into a generally rectangular shape in sectional view. However, the shape of the LED 4 in sectional view is not particularly limited and as shown in FIG. 20, can be formed into, for example, a shape having irregularities on the back surface thereof.

In this case, the LED 4 is, for example, provided with a support board 42, an optical semiconductor layer 43 that is formed on the back surface of the support board 42, and an electrode portion 44 that is formed on the back surface of the optical semiconductor layer 43.

The support board 42 is, for example, formed from a transparent hard substrate into a generally rectangular shape in sectional view so as to correspond to the outer shape of the LED 4 in plane view.

The optical semiconductor layer 43 is supported by the support board 42 and is formed from a semiconductor material so as to be included in the support board 42 when projected in the top-back direction. The optical semiconductor layer 43 includes, for example, a buffer layer 46, an N-type semiconductor layer 47 that is formed on the back surface thereof, a luminous layer 48 that is formed on the back surface thereof, and a P-type semiconductor layer 49 that is formed on the back surface thereof. The buffer layer 46 is formed on the entire back surface of the support board 42. The N-type semiconductor layer 47 is formed on the entire back surface of the buffer layer 46. The luminous layer 48 is, on the back surface of the buffer layer 46, formed into a predetermined pattern at an end portion of one side (the right side) in the plane direction. The P-type semiconductor layer 49 is, on the entire back surface of the luminous layer 48, formed into the same pattern as the luminous layer 48.

The electrode portion 44 is formed from a conductive material and is electrically connected to the optical semiconductor layer 43. The electrode portion 44 is provided with an anode electrode 50 and a cathode electrode 51. The anode electrode 50 is formed on the back side of the P-type semiconductor layer 49 so as to sandwich a transparent electrode 52 between the anode electrode 50 and the P-type semiconductor layer 49. The anode electrode 50 is electrically connected to the P-type semiconductor layer 49 via the transparent electrode 52. The transparent electrode 52 is formed on the back surface of the P-type semiconductor layer 49 and is disposed, when projected in the thickness direction, so as to be included in the P-type semiconductor layer 49. The anode electrode 50 is, when projected in the thickness direction, formed into a pattern of being included in the transparent electrode 52. The cathode electrode 51 is formed on a portion of the back surface of the N-type semiconductor layer 47 that is exposed from the P-type semiconductor layer 49 and the luminous layer 48. The cathode electrode 51 is electrically connected to the N-type semiconductor layer 47.

In the electrode portion 44, bumps 53 are provided.

The bumps 53 are formed on the back surface of the anode electrode 50 and the back surface of the cathode electrode 51, respectively. Each of the bumps 53 is, in plane view, formed into a pattern of being included in the anode electrode 50 and the cathode electrode 51. The bump 53 is formed into substantially the same pattern as a terminal (not shown) in the board 9 (ref: FIG. 2 (f)). Furthermore, the back surfaces of all of the bumps 53 are formed in the same plane surface and to be specific, are provided so as to be at the same position when projected in the plane direction (to be specific, the right-left direction).

The back surface of the bump 53, which is positioned at the most one side in the top-back direction in the LED 4, is defined as the back surface 22 of the LED 4. The top surface of the support board 42, which is positioned at the most other side in the top-back direction in the LED 4, is defined as the top surface 23 of the LED 4.

As shown by the phantom line in FIG. 20, in the phosphor layer-covered LED 10 that is provided with the LED 4, the back surface 24 of the phosphor layer 7 is positioned toward the top side (the other side in the top-back direction) with respect to the back surface 22 of the bump 53.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet-covered semiconductor element comprising:
   a semiconductor element and an encapsulating sheet,
   wherein the semiconductor element has a first surface for being brought into contact with a board and a second surface,
   wherein the encapsulating sheet has a first surface and a second surface, the first surface of the encapsulating sheet being in direct contact with at least the second surface of the semiconductor element, and
   wherein the first surface of the encapsulating sheet includes an exposed surface,
   the exposed surface having a portion that is positioned toward the second surface with respect to the first surface of the semiconductor element.

2. The encapsulating sheet-covered semiconductor element according to claim 1, wherein the entire exposed surface is all of the portion.

3. The encapsulating sheet-covered semiconductor element according to claim 1, wherein the semiconductor element is an optical semiconductor element including a luminous layer.

4. The encapsulating sheet-covered semiconductor element according to claim 3, wherein the luminous layer forms at least the second surface of the optical semiconductor element.

5. The encapsulating sheet-covered semiconductor element according to claim 3, wherein the optical semiconductor element is an LED.

6. The encapsulating sheet-covered semiconductor element according to claim 1, wherein the encapsulating sheet is a phosphor sheet containing a phosphor.

7. The encapsulating sheet-covered semiconductor element according to claim 1, wherein a plurality of the semiconductor elements are provided at spaced intervals to each other.

8. The encapsulating sheet-covered semiconductor element according to claim 1, wherein
   the semiconductor element includes a semiconductor layer, and an electrode portion having an anode electrode and a cathode electrode,
   the anode electrode and the cathode electrode both being disposed only on the first surface side with respect to the semiconductor layer.

9. The encapsulating sheet-covered semiconductor element according to claim 1, wherein the encapsulating sheet is formed from a resin composition containing a silicone resin composition.

10. A semiconductor device comprising:
    a board, and
    an encapsulating sheet-covered semiconductor element including a semiconductor element and an encapsulating sheet, the semiconductor element having a first surface in contact with the board and a second-surface disposed and
    the encapsulating sheet including a first surface and a second surface, the first surface of the encapsulating sheet being in direct contact with at least the second surface of the semiconductor element,
    the first surface of the encapsulating sheet including an exposed surface,
    the exposed surface having a portion that is positioned toward the second surface with respect to the first surface of the semiconductor element.

* * * * *